(12) United States Patent
Khazei

(10) Patent No.: US 6,834,380 B2
(45) Date of Patent: Dec. 21, 2004

(54) AUTOMATED EMC-DRIVEN LAYOUT AND FLOOR PLANNING OF ELECTRONIC DEVICES AND SYSTEMS

(75) Inventor: Mehyar Khazei, Olivenhain, CA (US)

(73) Assignee: Qualcomm, Incorporated, San Diego, CA (US)

( * ) Notice: Subject to any disclaimer, the term of this patent is extended or adjusted under 35 U.S.C. 154(b) by 286 days.

(21) Appl. No.: 09/922,411

(22) Filed: Aug. 3, 2001

(65) Prior Publication Data

US 2002/0040466 A1 Apr. 4, 2002

Related U.S. Application Data

(60) Provisional application No. 60/304,479, filed on Jul. 10, 2001, and provisional application No. 60/222,906, filed on Aug. 3, 2000.

(51) Int. Cl.[7] .................................................. G06F 9/45
(52) U.S. Cl. .......................................... 716/10; 703/13
(58) Field of Search ............................ 716/2, 8, 9, 10; 703/13, 14

(56) References Cited

PUBLICATIONS

Kashyap, "An expert system for predicting radiated EMI form PCB's". IEEE, 1997, pp. 444–449.*

Marano, "Field tests on telecommunication systems: an eavaluation of the radiated emissions by near filed probe". IEEE, 1998, pp. 918–923.*

Childs, "Fast interactive EMC analysis for design engineers". IEEE, 1995, pp. 1–7.*

Natesan, "Performance driven placement for cell–based design". IEEE, 1995, pp. 237–240.*

* cited by examiner

*Primary Examiner*—Stacy A. Whitmore
(74) *Attorney, Agent, or Firm*—Philip R. Wadsworth; Charles O. Brelon; George C. Pappas

(57) ABSTRACT

A method, system, and apparatus for automated electromagnetic compatibility-driven (EMC-driven) layout and floor planning of electronic devices and systems accounts for electromagnetic interactions between circuit components and addresses internal EMC issues at the outset of the design phase. Problems that may affect system performance are predicted, and a new layout optimized for reduced electromagnetic interference may be suggested, before an expensive prototyping operation is performed. Causes of such problems are also identified with better certainty than is possible from a defective prototype, resulting in a reduced design cycle.

50 Claims, 100 Drawing Sheets

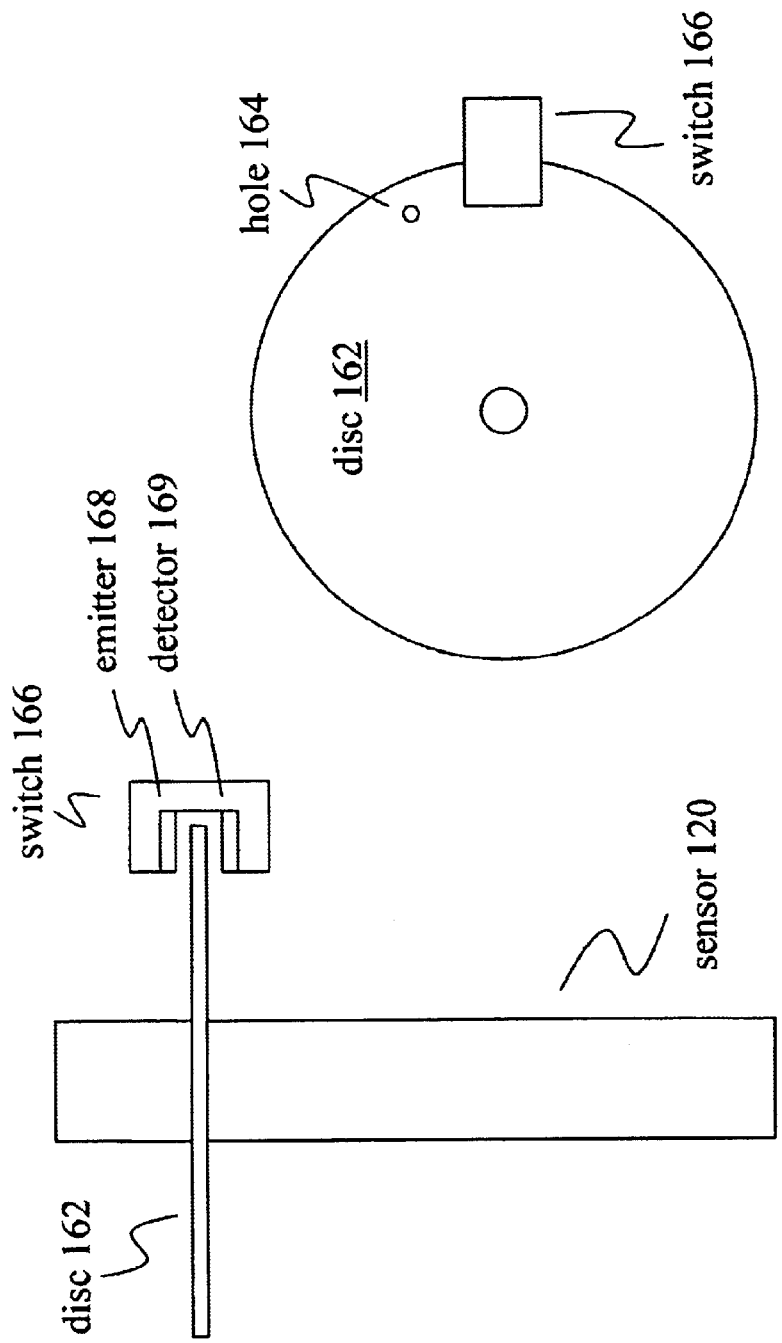

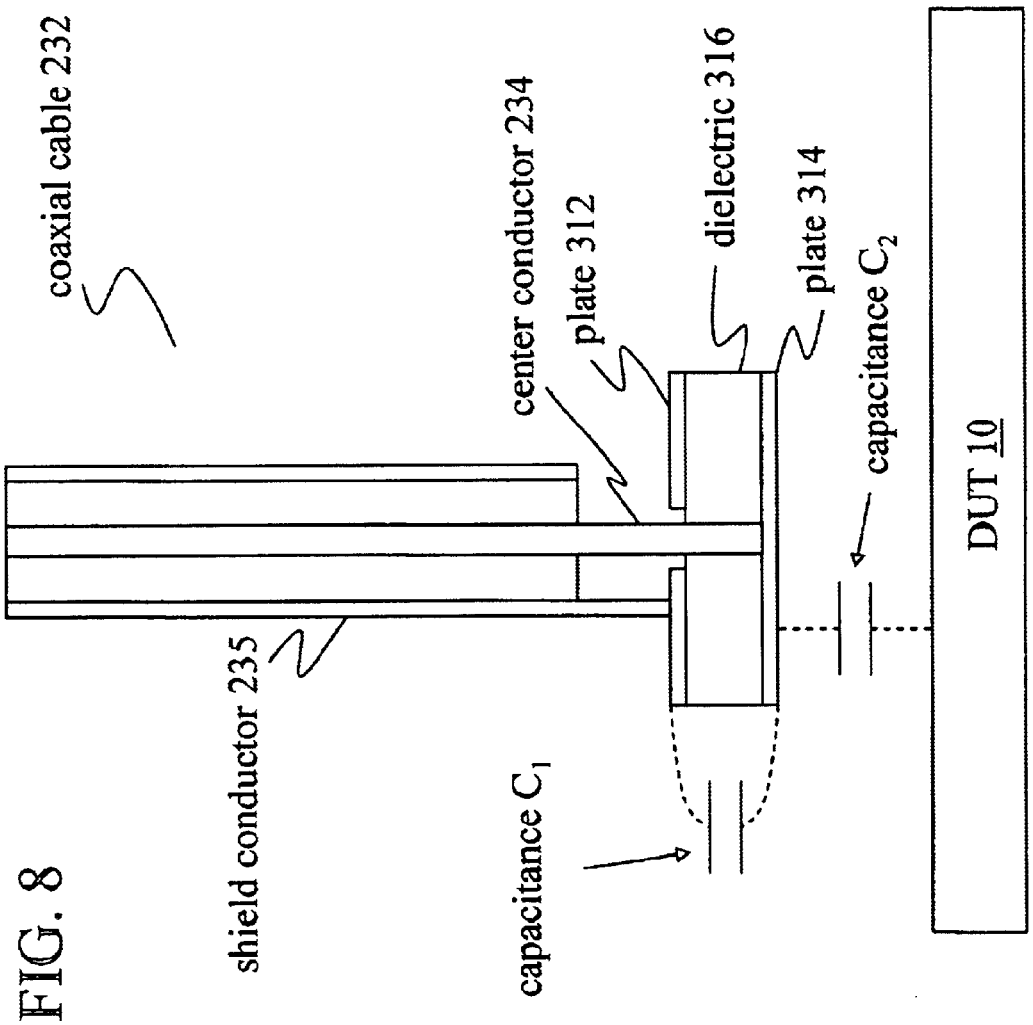

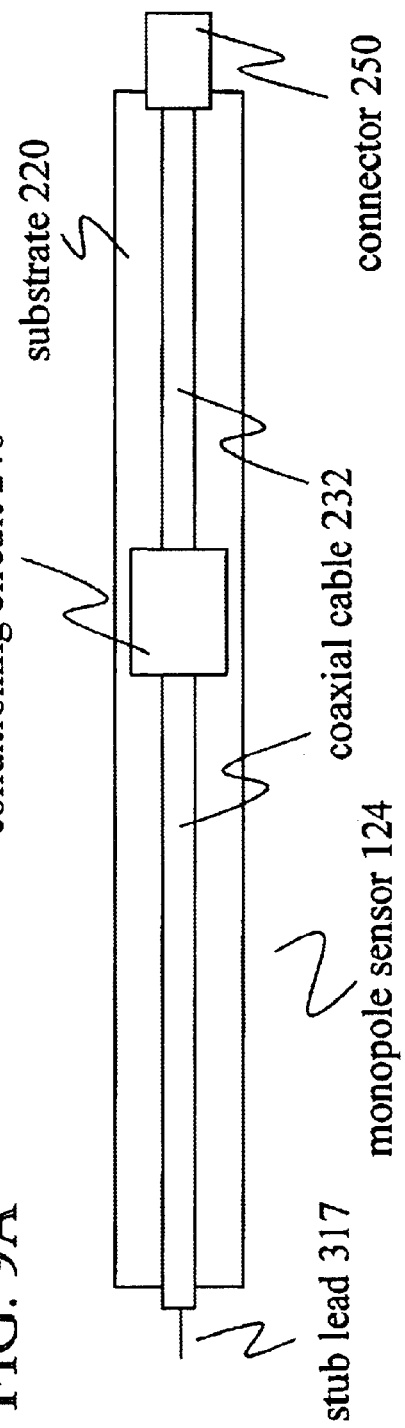
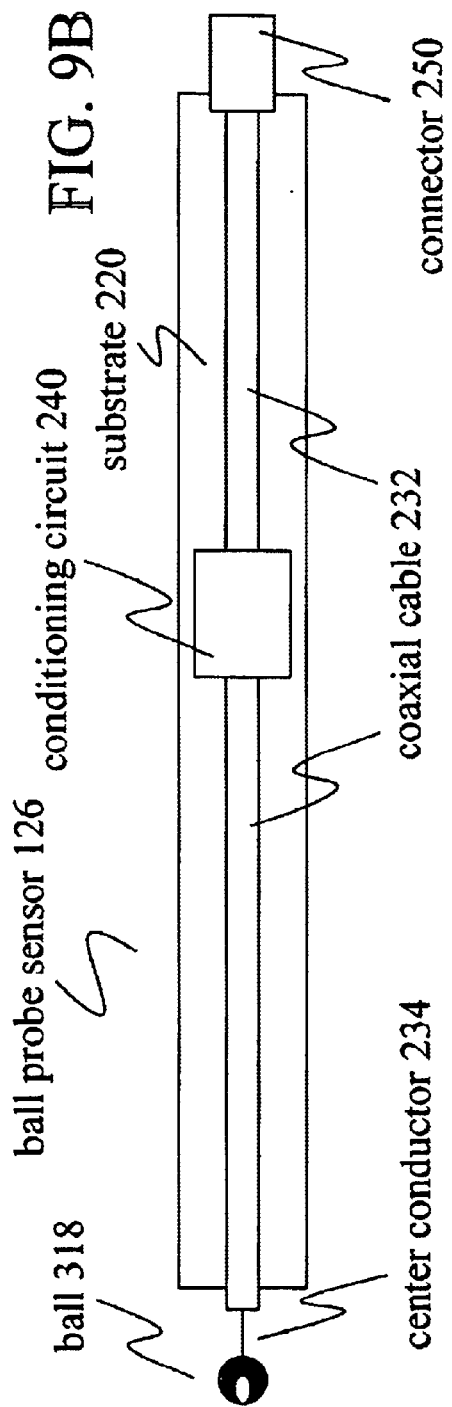
FIG. 9A
FIG. 9B

Edit Probe Transfer Factor rev. 15

Probe Name: Ball-2

Units: dB uV/m

Probe correction equation

CF= 101.334846- (0.198588186*f) + (0.00048579*f^2) - (5.7022E-7 * (f^3) + (3.0722E-10)

Cancel    OK

FIG. 49

FIG. 98
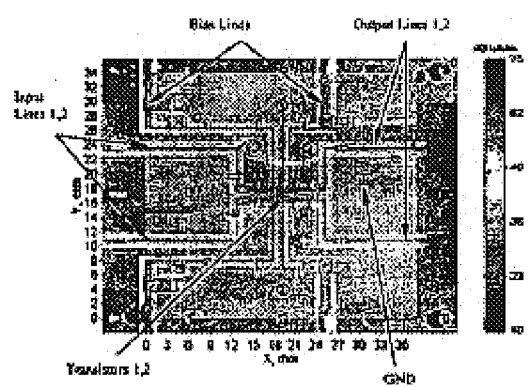
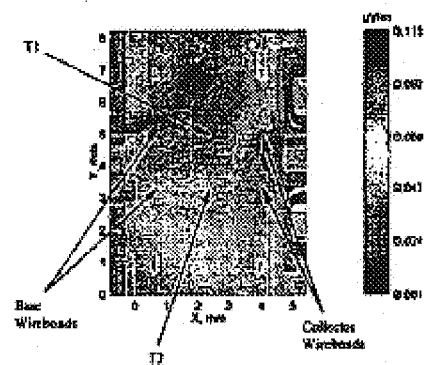

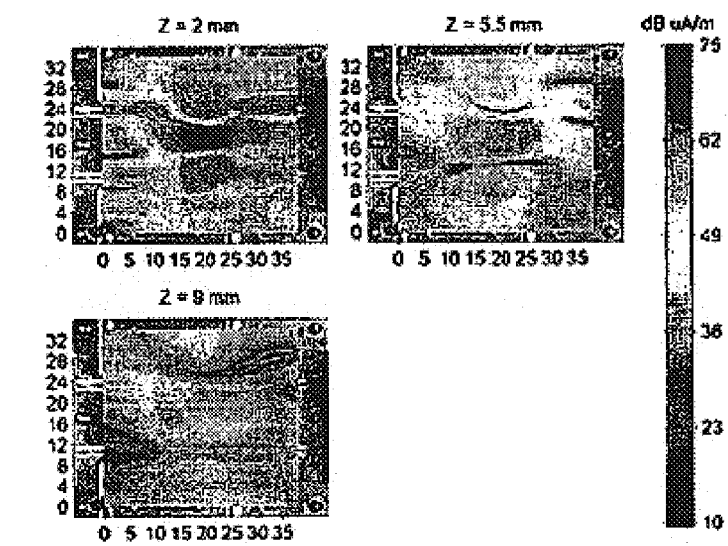
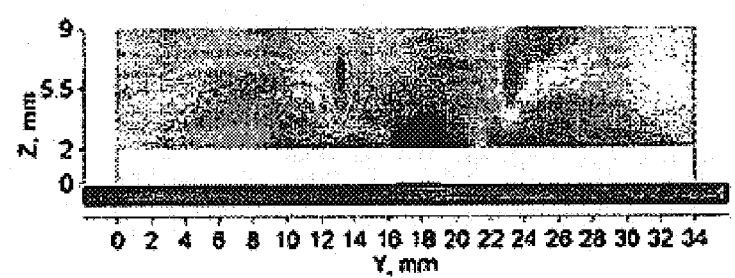
FIG. 99

AUTOMATED EMC-DRIVEN LAYOUT AND FLOOR PLANNING OF ELECTRONIC DEVICES AND SYSTEMS

RELATED APPLICATIONS

This patent application claims benefit of U.S. Provisional Patent Application No. 60/222,906, filed Aug. 3, 2000, entitled "SYSTEM, METHOD, AND APPARATUS FOR FIELD SCANNING" and U.S. Provisional Patent Application No. 60/304,479, filed Jul. 10, 2001, entitled "METHOD OF COMPLIANCE TESTING."

In addition, the following U.S. patent applications filed concurrently herewith are related to this application: "SYSTEM, METHOD, AND APPARATUS FOR FIELD SCANNING," U.S. patent application Ser. No. 09/922, 482"SYSTEM, METHOD, AND APPARATUS FOR PRODUCT DIAGNOSTIC AND EVALUATION TESTING," U.S. patent application Ser. No. 09/922,413 and "SYSTEM, METHOD, AND APPARATUS FOR STORING EMISSIONS AND SUSCEPTIBILITY INFORMATION," U.S. patent application Ser. No. 09/922, 481."

BACKGROUND

1. Field of the Invention

The invention relates to layout and floor planning of electronic devices and systems.

2. Background Information

Tools for automated component placement have become commonplace in the design and fabrication of modern electronic systems and devices (such as integrated circuits). FIG. 70 shows a flowchart for such a tool, which translates a logical or schematic circuit description into a template for the placement of components within an actual prototype. Input data for an automated placement tool may include a functional description of logical flow or signal flow, e.g. as embodied in a SPICE (for 'Simulation Program (with) Integrated Circuit Emphasis') netlist or a hardware description language (or 'HDL') file. The tool may also receive data such as constraints on the size and/or shape of the finished prototype. When used to design integrated circuits, automated placement tools are also called 'floorplanners,' although similar tools may also be used to design multichip modules (MCMs), circuit boards or subassemblies, or even complete assemblies such as end-user and consumer products.

It is known that if the template complies with certain rules of layout design, the likelihood of unforeseen complications in the operation of the resulting prototype will be reduced. One such layout design rule is to minimize the length and complexity of interconnections by placing highly connected components close to one other. Also, such rules dictate against the use of long parallel signal traces in the placement template in order to minimize crosstalk, coupling, and loading effects in the fabricated circuit, thus helping to ensuring signal integrity system-wide.

Even when the final placement template complies with predetermined layout design rules, however, the resulting prototype will often fail to function as expected. One reason for such failure is that the layout design rules do not account for the actual electromagnetic interactions between the different elements of the system. Electromagnetic interference and electromagnetic compatibility are strongly dependent on the physical placements of the various circuit elements and the interconnections between these elements and the assignment of power and ground terminals. Also, the effects of electromagnetic emissions within the circuit become more pronounced as component sizes are reduced and component population densities and operating frequencies are increased. As a result, first-pass design of highly integrated components, especially those intended for operation at microwave frequencies, has become virtually impossible.

Such problems may arise even if a part of the design has been used successfully in an earlier prototype. For example, it is becoming increasingly common to use circuit blocks in more than one design. Such a block may have been designed from scratch for an earlier application, for example, or it may have been purchased as a piece of intellectual property (IP) (also called an 'IP core') from an outside vendor. A layout tool that verifies compliance with layout design rules may fail to predict problems that arise when such a block is used in a different environment: adjacent to different functional blocks, for example, or operating at a different frequency, duty cycle, or clock edge, or fabricated in a different process.

Moreover, the causes of such problems are not easily identified in the finished prototype. One reason is the difficulty of pinpointing the source of a troublesome emission from among a number of radiators. Therefore, corrective actions may be performed more or less blindly, while the precise causes for a problem remain unknown through several cycles of prototype revision, leading to inefficiencies of time and money. Not only does the design process become characterized by a costly iterative trial-and-error cycle, but certain corrective attempts (such as adding shielding) may even prove detrimental by adding weight, consuming volume, or even exacerbating the actual mechanism of interference.

For such reasons, it is desirable to enable a preventative approach to circuit layout by assessing electromagnetic interactions between circuit elements during the design phase, thus allowing potential problems to be identified and solutions to be evaluated quickly and easily before the costly process of realization has begun.

For portable products such as devices for wireless communications, there is demand for miniaturization, reduced weight and power consumption, and operation in unpredictable environments. These design requirements are in direct contradiction to enhanced performance requirements such as increased system functionality, communications bandwidth, and data throughput. The production of products that meet these sets of contradictory requirements cannot be accomplished without paying careful attention to component/device electromagnetic compatibility early in the design phase. Therefore, it is desirable to have tools to support electromagnetic compatibility-driven design of electronic devices and systems.

SUMMARY

An apparatus according to an embodiment of the invention comprises an electromagnetic field calculator and an electromagnetic interference calculator coupled to the electromagnetic field calculator. The electromagnetic field calculator receives (A) information relating to a relative placement of a plurality of components and (B) a plurality of emissions profiles, each emissions profile relating to one among the plurality of components and outputs information regarding an induced electromagnetic field. The electromagnetic interference calculator receives (C) a plurality of susceptibility profiles, each susceptibility profile relating to one among the plurality of components, and (D) the information regarding an induced electromagnetic field and outputs information regarding effects caused by the induced electromagnetic field.

BRIEF DESCRIPTION OF THE DRAWINGS

FIG. 3A is a side view of a home position sensor.

FIG. 3B is a top view of a home position sensor.

FIG. 8 is a diagram of effective capacitances in an operation of a plate sensor according to an embodiment of the invention.

FIG. 9A is a diagram of a stub sensor according to an embodiment of the invention.

FIG. 9B is a diagram of a ball sensor according to an embodiment of the invention.

FIG. 49 shows a screen of an operating system according to a particular embodiment of the invention at which a sensor transfer function may be selected, inputted, or edited.

FIG. 98 shows emissions profiles for a dual transistor test board.

FIG. 99 shows additional emissions profiles for the dual transistor circuit shown in FIG. 98.

DETAILED DESCRIPTION

Figure 1:
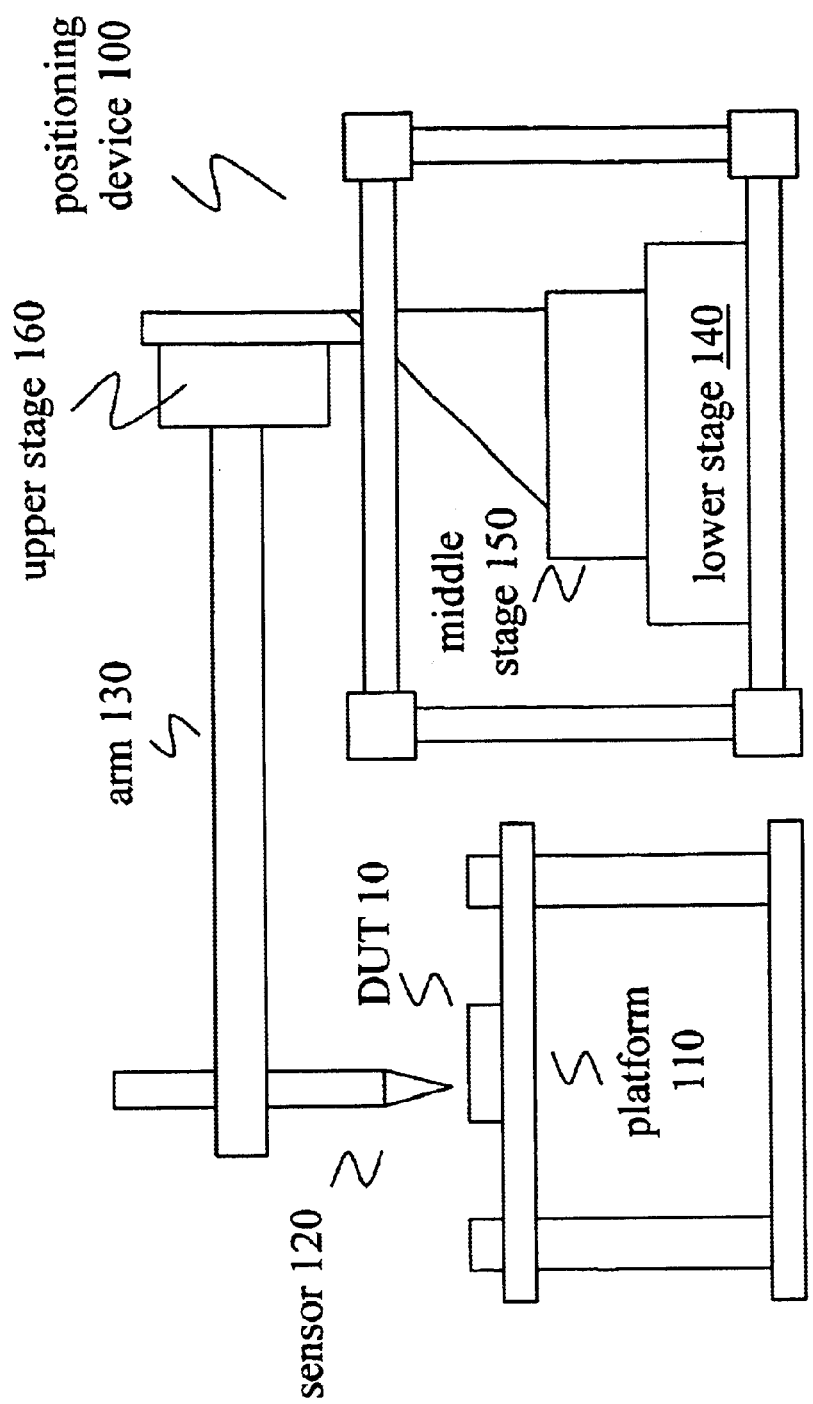
FIG. 1 is a block diagram of a positioning device according to an embodiment of the invention.

Through precise automated positioning of a sensor, an apparatus according to an embodiment of the invention collects data on the near-field behavior of a DUT. The DUT may be a passive component, an active device such as an integrated circuit, a printed circuit board, an interconnect, or an entire electronic product. In an exemplary implementation, the DUT is positioned on a rotary table, the sensor is attached to a robot arm or other positioning mechanism having three degrees of freedom, and the data is processed by automated means to produce a profile in space of the near-field emissions of the DUT. The data collected may pertain to emissions in various regions of the electromagnetic spectrum (including the RF and infrared regions), and measurements may be taken with a fixed sensor or with a rotating sensor. In an alternative embodiment, an emitting antenna is precisely positioned at numerous points near to a DUT, and the susceptibility of the DUT to the emissions is characterized by monitoring all or a selected subset of the output terminals of the DUT and processing the data thus acquired.

Systems, methods, and apparatus according to embodiments of the invention as described herein may be used in one or more of the applications that appear in the following list. Additionally, a method according to an embodiment of the invention may be used to obtain similar results even with other systems or apparatus.

1) to identify the frequency, the nature, and/or the location of the source of electromagnetic emissions, and/or the interference mechanism in action, from electronic components and devices, RF hardware, circuit boards, and other electronic products.

2) to facilitate and/or execute the design of low-emissions application-specific integrated circuits (ASICs) by providing guidelines that will enable better chip floor planning and layout by proper selection of such device parameters as operating frequencies, clock edges, and electronic package.

3) to establish near-field emissions specifications for ASICs and other electronic parts and products and to identify and reject electronic parts having high near-field emissions and for qualifying foundries and fabrication processes.

4) to investigate changes in emission levels from a specific ASIC due to changes in device feature (i.e., process size, power distribution and overall layout).

5) to provide information on component and device emission signatures at the design outset.

6) to investigate the emission characteristics and suitability of packages for ASICs and other electronic components and to establish guidelines for selection and design of such packages, and also to qualify electronic packages and compare different packages containing the same ASIC with respect to their emissions performance.

7) to investigate the effect of process size on the emission spectrum and to provide information on the relationship between internal transition time and emission spectrum bandwidth.

8) to evaluate the near-field shielding effectiveness of materials and geometries used in wireless applications.

9) to compare the near-field emission performance of different ASIC designs.

10) to perform emissions measurements at the system and product levels. This application may be useful in cases where the individual parts comply with FCC standards, yet their combination fails to comply and/or to perform properly due to interference problems.

11) to assess performance of RF and microwave connectors and antennas.

12) to create profiles by performing DC field measurements and/or measurements in the infrared band and/or in another region of the electromagnetic spectrum and to correlate thermal profiles in space with RF profiles in space. This application may be useful, for example, in studying RF heating effects on RF device packages such as power amplifiers, and for monitoring the temperature of core elements used in ASICs, such as random-access and flash memory.

13) to provide direction and magnitude data for use in SAR (specific absorption rate) measurements as required by the Federal Communications Commission (FCC) and/or other standards or regulatory bodies for wireless personal communication products.

14) to diagnose failure analysis, for example, by identifying physical defects in RF filters, RF leakage from connectors, cracked electronic packages, circuit boards, etc.

15) to develop emissions and susceptibility databases for use by a computer-aided design (CAD) tool.

16) to make susceptibility measurements by creating electromagnetic fields in the vicinity of devices, components and systems in order to evaluate the effects of the fields on those parts.

17) to perform near-field emissions measurements of multichip modules and three-dimensional electronic packages to assess their design and performance.

18) to measure the noise floor in the space surrounding a device or product, wherein noise refers to a random or asynchronous process.

19) to perform single triggering measurements in order to investigate EMI/EMC-related events that may be observed only during a small window of time.

20) to perform emissions measurements of circuit boards or devices, or components at a single frequency while varying the amplitude of the applied signal/source or, at a fixed amplitude while varying the frequency of the source. This application may provide valuable information on the behavior of interference mechanisms operating on the DUT, essentially producing a visual transfer function for each case. Such information may be useful for checking how a given design performs over a range of frequencies and/or amplitudes.

21) to obtain direction and magnitude of a magnetic field at each scan position. In this application, maximum field intensity at each scan position and the angle at which it occurs may be recorded by rotating a magnetic field sensor. The sensor output may indicate a characteristic of the magnetic field or of the current that gives rise to it. Vectors derived from the output at each scan position may be encoded, for example, according to a false-color mapping. Rotating sensor emissions data for each device may also be used to create an emissions database for a CAD tool according to an embodiment of the invention. In this case, the data may be converted mathematically to current density, from which near fields and/or far fields at any point on the system may be calculated.

Hardware

Emissions from electronic devices have previously been measured by the manual use of sniffer probes, a technique that is limited to finding the general location of severe 'hot spots'. In one commercial application, an array of sniffer probes is arranged in a grid below a test surface. The device under test (DUT) is placed onto the test surface, and the array is scanned. One shortcoming of a probe array is that the resolution of any measurement obtained is limited to the size of the individual probes and the spacing between them. Therefore, use of a probe array is limited to measurements at the circuit board or product level, which are far too imprecise to identify the location of a near-field source in the space surrounding the DUT.

Another shortcoming of a probe array is that it offers measurements that are defined in only two dimensions. Such measurements do not provide a basis for reliable information concerning the evolution or decay of a near field with respect to distance from the source. One important consequence is that the measurements obtained cannot be used to determine what kind of a near field is being emitted.

A third shortcoming of a probe array is that the measurements obtained may not accurately represent the field actually emitted by the DUT. The potential for inaccuracy arises because the array must have a large number of sensors in order to attain a useful resolution. As a consequence, the array tends to load the DUT, and the array elements may also interact with each other either directly or through the DUT. Additionally, the array enclosure may be resonant at certain frequencies, thereby distorting the measurement.

A fourth shortcoming of a probe array is that it is only suitable for use with loop element sensors. Therefore, such an array cannot be used to measure electric near-fields.

Another quality which existing instruments lack is modularity, so that even within their limited range of functionality and reliability such instruments may be used only with standard probes. Additionally, such existing instruments and approaches yield only relative measurements at best and cannot be used to obtain quantitative measurements (e.g. to support electromagnetic metrology measurements). Also, such existing instruments and approaches cannot be used to resolve components of the E or H fields. Moreover, such existing instruments and approaches cannot be used to measure the direction of a field.

Transverse electromagnetic (TEM) cells are currently used in the IC industry to evaluate electromagnetic emissions of ICs. Emissions tests are conducted by placing the DUT inside the TEM cell. One such evaluation method is described in standard J1752/3 ('Electromagnetic Compatibility Measurement Procedures for Integrated Circuits: Integrated Circuit Radiated Emission Measurement Procedure, 150 kHz to 1000 MHz, TEM Cell,' published March 1995) of the Society of Automotive Engineers (Warrendale, Pa.). While TEM cells can indicate the presence or absence of emissions and the levels of the emissions, however, they cannot identify either the locations of their sources within a device or the interference mechanisms responsible for improper functioning of a device or system under test.

FIG. 1 illustrates a positioning device 100 according to an embodiment of the invention. The device under test (DUT) 10 is placed on platform 110. Platform 110 may be either a stationary platform as shown in FIG. 1, or it may be a movable platform such as a rotary table. In an exemplary implementation, platform 110 includes a polymer surface selected for minimum reflection. Platform 110 may also include a small circuit board that acts as an electromagnetic bull's eye. For example, such a board may include a passive antenna element having a null at a particular location in space (e.g. having an area no larger than a minimum step size of positioning device 100) that may be detected as a reference position for a sensor. Platform 110 may also include other registration elements (e.g. a mechanical bull's eye, holes and/or pegs for mating with a system to be tested, etc.).

Sensor 120 is positioned near to DUT 10. Although in an exemplary implementation sensor 120 is positioned above DUT 10, for most purposes the relative orientation of these two items is unimportant to the practice of the invention, such that it is only necessary for sensor 120 to be close enough to DUT 10 to investigate the emissions of interest. For example, so long as DUT 10 is properly secured, sensor 120 may be positioned to the side of or even below DUT 10.

In an exemplary implementation, positioning device 100 is an xyz table. This table comprises three stages: upper stage 160, which moves either up or down; middle stage 150, which carries upper stage 160 and moves either to the left or to the right, as viewed in FIG. 1; and lower stage 140, which carries middle stage 150 and moves in a direction either into or out of the paper, as viewed in FIG. 1. Each stage is moved by virtue of a mechanical coupling to one of three stepper motors, which are preferably emission-free. In a particular application of this implementation, each stage is coupled to its stepper motor via a belt and pulley arrangement, the maximum range of motion in each axis is 18 inches, and a minimum distance between adjacent positions is less than 1 micrometer, providing a positioning resolution of better than 2 micrometers.

Instead of or in addition to stepper motors, positioning device 100 may incorporate one or more rack-and-pinion elements, servomotors, or any similar devices capable of providing precise spatial translation and/or rotation. In its broadest sense, practice of this particular embodiment of the invention requires only that positioning device 100 be controllable to precisely position a sensor across a suitable range of motion in three dimensions.

In a system according to an embodiment of the invention as shown in FIG. 1, sensor 120 is linked to positioning device 100 by arm 130, which holds the sensor in a vertical orientation. As noted above, for most purposes the particular orientations of arm 130 and sensor 120 are unimportant, so long as sensor 120 is positioned appropriately closely to DUT 10. In some applications, it may be desirable also to support the distal end of arm 130 (e.g. in a case where scanning is performed only in a plane orthogonal to the axis of sensor 120).

Sensor 120 may be any device that outputs a signal in response to a nearby electric, magnetic, or thermal field. Suitable commercially available devices such as sniffer probes or infrared (IR) sensors may be adapted as necessary for use with a positioning device as shown in FIG. 1, or a sensor according to an embodiment of the invention as described herein may be used.

One advantage that may be incorporated into a positioning device as shown in FIG. 1 is modularity. In such an implementation, sensor 120 may easily be changed or replaced, and the user may choose from a wide range of sensors specially designed for a particular application. Signal processing operations may be performed on the acquired signal to account for the transfer function of the selected sensor (including corrections for probe interaction with the field, loading effects, frequency-dependent effects, etc.), for cable losses, and/or for the characteristics of any additional units (such as amplifiers or filters) that may be applied in the sensor signal path. Additionally, the data collected may be presented in a wide variety of different formats and may be outputted and/or stored for use in other applications.

Figure 2A:
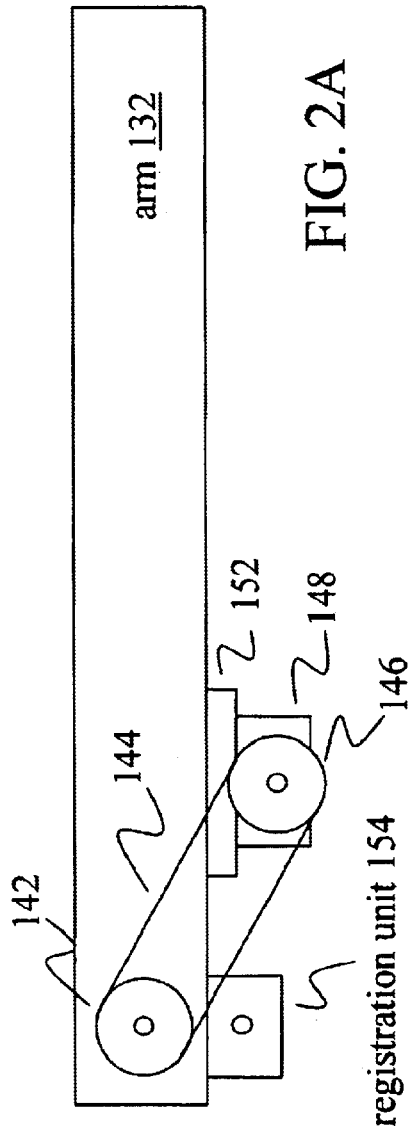
FIG. 2A is a top view diagram of arm 132.
Figure 2B:
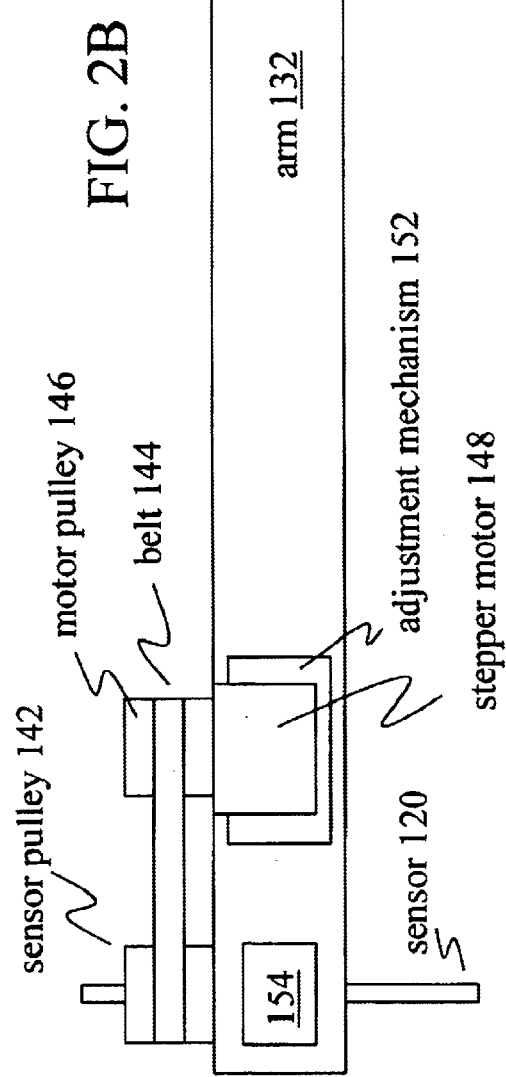
FIG. 2B is a side view diagram of arm 132.

In order to conduct measurements having a directional component, sensor 120 may be rotated about one of its axes. For example, sensor 120 may be rotated about an axis orthogonal to a surface plane of the DUT. FIGS. 2A and 2B show top and side views, respectively, of an embodiment 132 of arm 130 that enables axial rotation of sensor 120 to be performed in a controlled manner. In this embodiment, a motor pulley 146 is mounted on the shaft of a stepper motor 148 (which may be emission-free). A rotation of motor pulley 146 is transferred via a belt 144 to a sensor pulley 142, which is mounted on a shaft of sensor 120 (or to a shaft that secures sensor 120). An adjustment mechanism 152 (e.g. including one or more slots and fasteners) is provided for adjusting the position of stepper motor 148 at least linearly (e.g. along arm 132) to allow belt 144 to be properly positioned and tensioned. Precise control of the rotational orientation of sensor 120 may thus be achieved through automated control of stepper motor 148.

It may also be desirable for the rotating mechanism (e.g. arm 132) to include a home position sensor to indicate an orientation of sensor 120. In an exemplary implementation, a home position sensor detects when sensor 120 rotates through a particular position (e.g. by detecting an optical indicating mark on sensor 120). FIGS. 3A and 3B show one suitable arrangement including a disc 162 having a hole 164 near its perimeter that rotates about its axis with sensor 120. An optoelectronic switch 166 having an emitter 168 and a detector 169 is disposed in a position that is stationary with respect to the axis of rotation, such that the disc interrupts an optical path of the switch except when the hole passes between emitter 168 and detector 169. An output signal of detector 169 thus indicates an orientation of sensor 120, which orientation may be correlated with measurements obtained by probe section 310 to indicate a directional aspect of the field being measured.

In alternate embodiments, controlled rotation of sensor 120 may be accomplished by the use of a mechanism other than a belt-driven pulley, such as a rack-and-pinion assembly. A similar rotation mechanism may also be integrated into sensor 120 itself rather than into an implementation of arm 130. Rotation of sensor 120 may be performed by any other suitable mechanism, which mechanism may be mounted upon positioning device 100, may rotate positioning device 100, or may instead be a part of positioning device 100. In further implementations, platform 110 translates and/or rotates DUT 10 relative to sensor 120. While arm 130 is a useful component of one embodiment of the invention, it is not a necessary part of other embodiments of the invention, wherein sensor 120 may be mounted directly onto positioning device 100.

FIGS. 3A and 32B also show another feature that may be incorporated into an embodiment of arm 130: registration unit 154. This unit is used to establish a precise alignment between an initial position of sensor 120 and DUT 10. Such an alignment may be used to correlate an output produced by the apparatus with other outputs of the apparatus or with images of the DUT produced by other means (e.g. digital or digitized photographs of the DUT). In an exemplary implementation for system level measurements, registration unit 154 comprises a laser diode module capable of providing a crossbeam pattern (e.g. for visual reference). In another implementation for device and die level measurements, registration unit 154 includes a miniature video camera or other imaging device (e.g. having a CMOS or CCD sensor) to allow increased alignment precision.

Sensors

Figure 4:
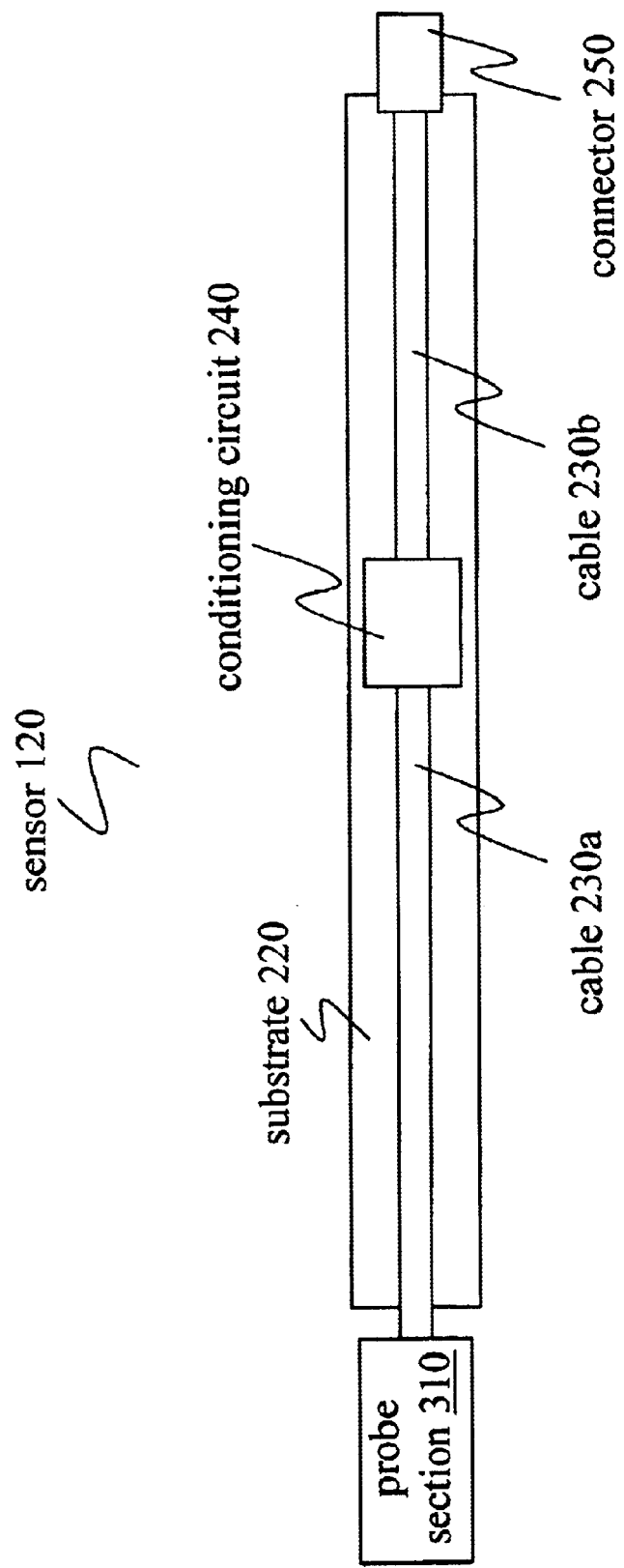
FIG. 4 is a diagram of a sensor according to an embodiment of the invention.

FIG. 4 shows a block diagram of a sensor 120 for use in measuring electromagnetic fields. As described herein, the nature of probe section 310 may vary depending on the particular application and/or type of field being measured. Likewise, the nature of cable 230 may vary depending on the application. For example, cable 230 may be semi-rigid and/or shielded. For example, cable 230 may be a small-diameter coaxial cable (having an impedance of, e.g., fifty ohms). In another implementation, cable 230 may be a twisted pair whose impedance may vary according to the twist angle.

A conditioning circuit 240 may optionally be inserted into the signal path of cable 230, although such a circuit may be omitted in other implementations of sensor 120. Conditioning circuit 240 may comprise a passive or active filter, a passive impedance-matching network such as a balun (balanced-unbalanced transformer), or an active network using e.g. field-effect transistors (FETs) and/or a low-noise amplifier. Note that cable 230 between probe section 310 and conditioning circuit 240 need not be of the same type as cable 230 between conditioning circuit 240 and connector 250. For example, the cable on one side of conditioning circuit 240 may be unbalanced (e.g. coaxial cable) while the cable on the other side may be balanced (e.g. a twisted pair).

Figure 5:
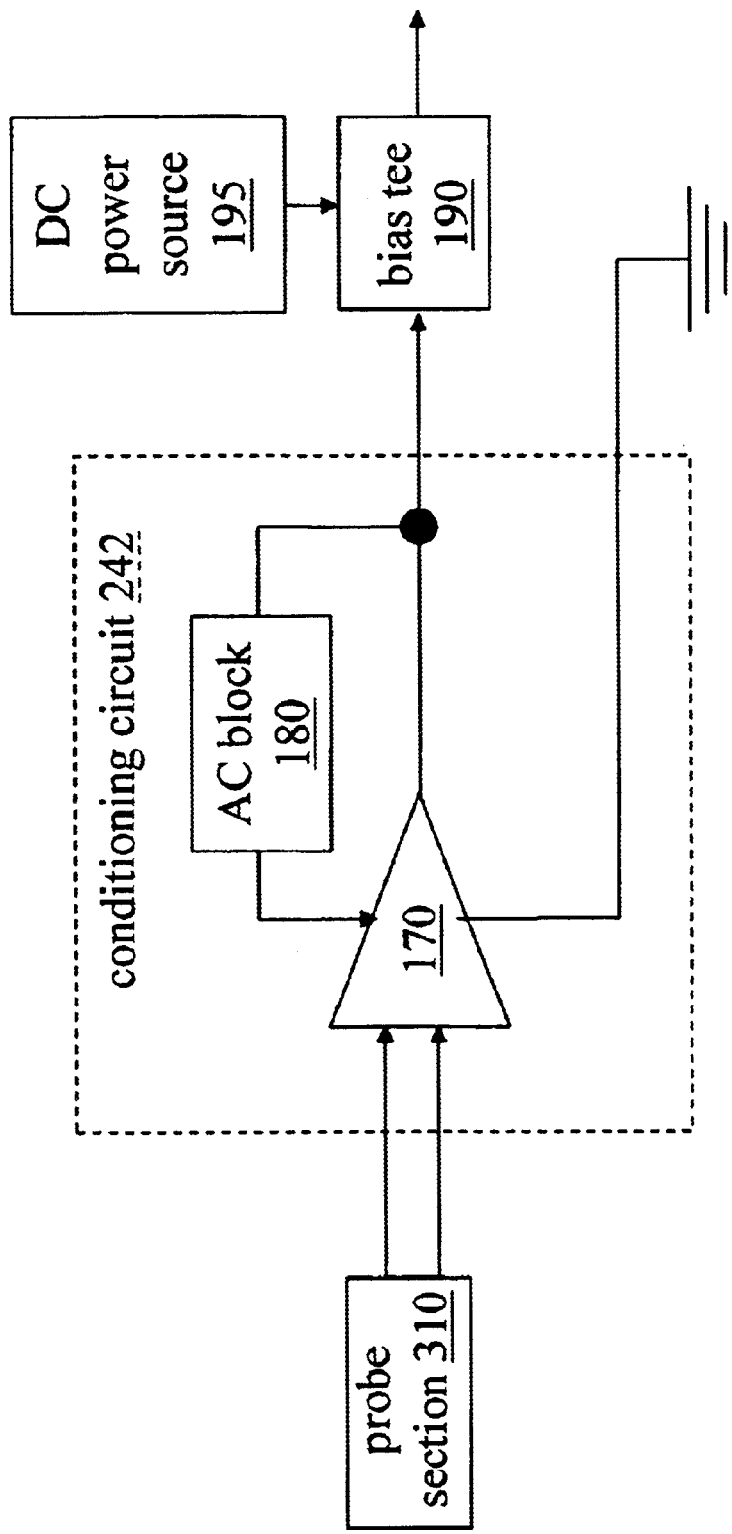
FIG. 5 is a diagram of an active sensor according to an embodiment of the invention.

FIG. 5 shows a circuit diagram for a sensor according to an embodiment of the invention that includes an active implementation 242 of conditioning circuit 240. A bias tee 190 (which may be external to the sensor) is used to apply power from DC power source 195 to the sensor signal line. Within conditioning circuit 242, the power is applied to amplifier 170 via AC block 180, which prevents the sensor signal from feeding into the amplifier through its power connection. If necessary, a decoupling capacitor may be used to prevent the DC power signal from feeding into amplifier 170 through its output terminal. In an exemplary implementation, amplifier 170 is a monolithic microwave integrated circuit (MMIC) such as an IVA-14 series variable gain amplifier (Agilent Technologies, Palo Alto, Calif.). In a further implementation, a gain or other parameter of amplifier 170 is controlled by varying the DC voltage supplied through bias tee 190 and inputting at least a portion of that voltage to a control terminal of amplifier 170. For balanced operation, probe section 310 may be connected to amplifier 170 via a twisted pair line.

For mechanical stability, the elements of sensor 120 may be mounted onto an optional substrate 220, which is selected to provide rigidity without appreciable effect on the fields being sensed. For example, substrate 220 may be a glass-epoxy or other substrate of a printed circuit board (PCB) upon which conditioning circuit 240 is fabricated or mounted.

The measurement signal induced in probe section 310 is eventually outputted at connector 250 into an external cable that carries the signal to a processing unit. Connector 250 may be any structure suitable for carrying electrical signals across the desired frequency range without appreciable loss (or at least with compensable loss). In an exemplary application, connector 250 is a SMA connector (according to United States Department of Defense Military Performance Specification MIL-PRF-39012) or another connector (e.g. BNC, N) suitable for carrying RF signals. A sensor of the form shown in FIG. 4 may be used to measure time-varying fields having frequencies of from a few hundred kilohertz up to several gigahertz.

Figure 6:
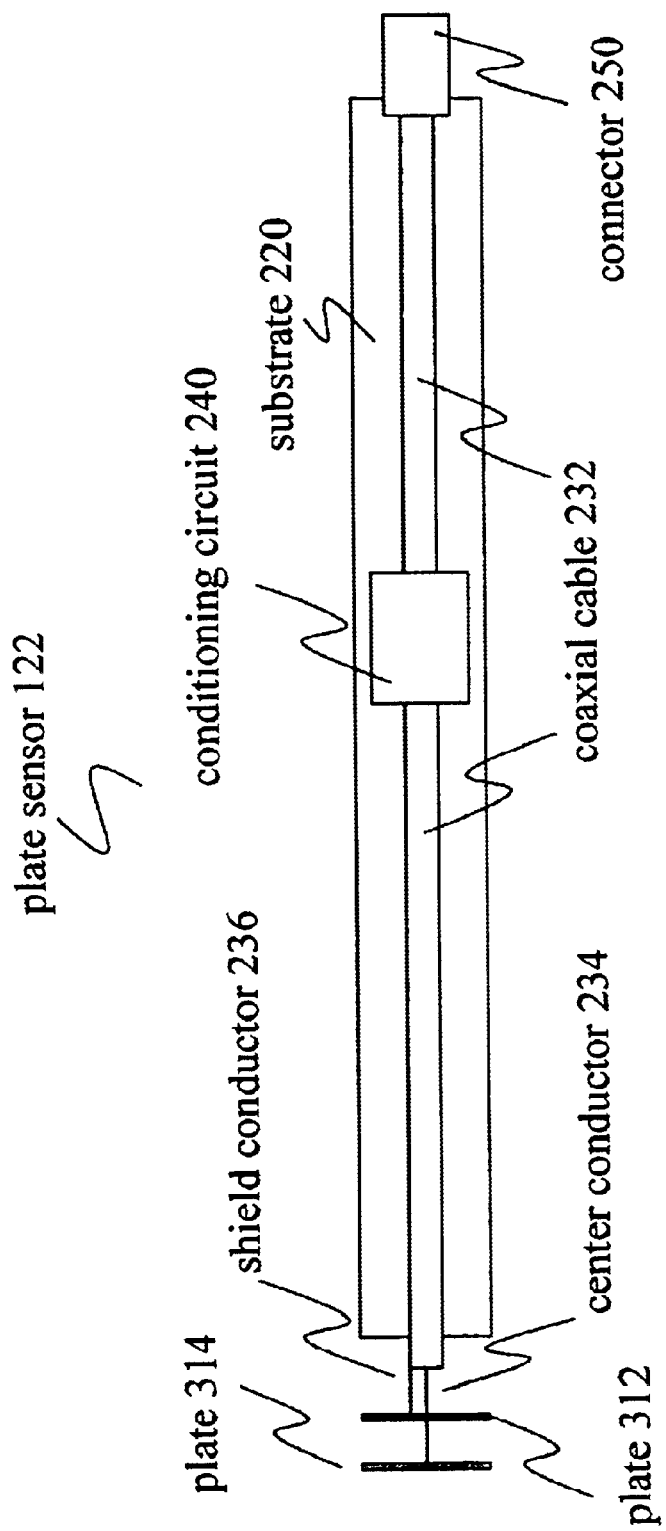
FIG. 6 is a diagram of a plate sensor according to an embodiment of the invention.
Figure 7A:
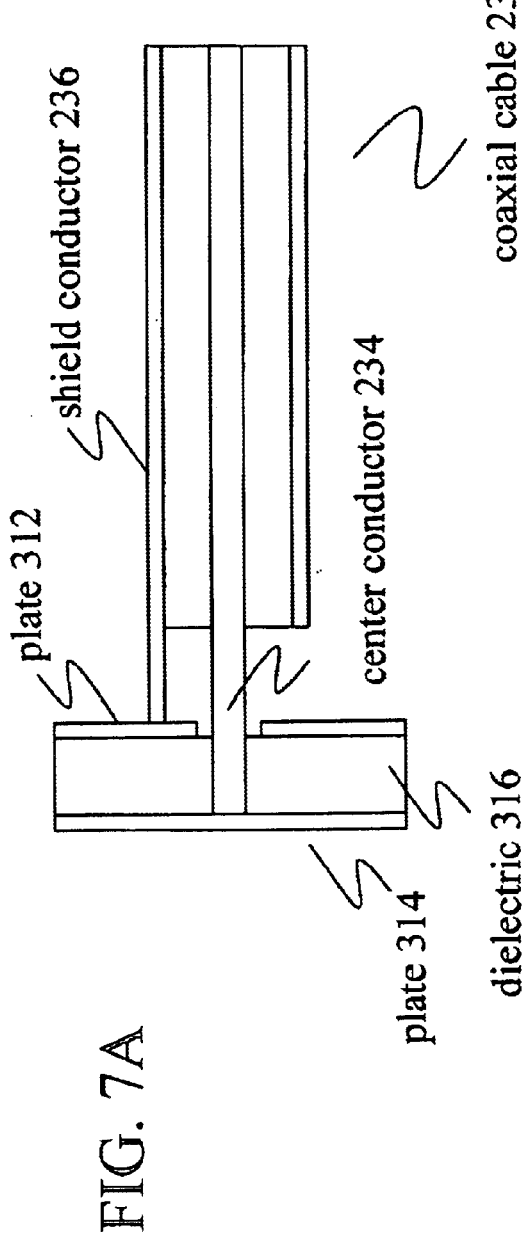
FIG. 7A is a diagram of a probe section of a plate sensor according to an embodiment of the invention.
Figure 7B:
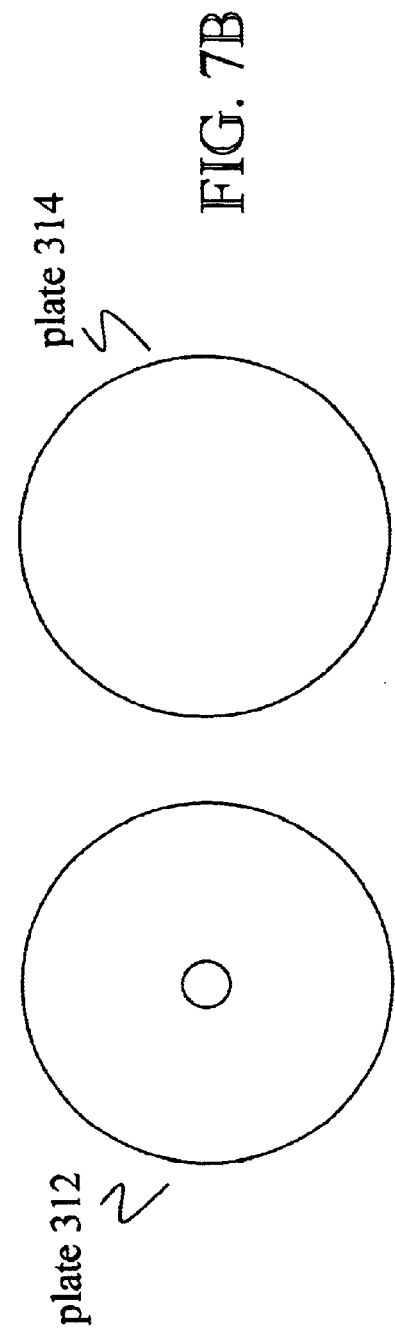
FIG. 7B shows plates 312 and 314.

FIG. 6 shows a block diagram of a plate sensor implementation 122 of sensor 120 that may be used for measurement of electric fields. The probe section 310 of this sensor comprises a pair of conductive plates 314 and 312 (as shown in FIG. 7B), each plate being conductively attached to one of the conductors 234 and 236 of a coaxial cable 232 (as shown in FIG. 7A). In a particular implementation, cable 232 is a small-diameter semi-rigid 50-Ω coaxial cable.

Each of the plates 312 and 314 may be made of metal; for example, the plates may be etched into alternate sides of a two-sided PCB. In exemplary implementations, plates 312 and 314 are of the same size, are both of circular or rectangular shape, and have diameters of from less than 2 mm to no more than 30 mm. As shown in FIG. 7B, plate 312 has a hole in the center to allow center conductor 234 to pass through plate 312 without contacting it.

As shown in FIG. 7A, a dielectric 316 having a dielectric constant of $\in$ may be supplied between the plates. A capacitance $C_1$ is expressed as $\in A/d$, where A is the area of a plate in $m^2$ and d is the distance between the plates in $m^2$. For an output impedance of 50Ω, the ratio between the voltage across the plates $V_2$ and the magnitude of the detected electric potential $V_1$ may be expressed as $$\frac{V_2}{V_1} = \frac{1}{1 + \frac{C_1}{C_2} + \frac{1}{50\omega C_1}}, \quad (1)$$

where ω is the signal frequency (in radians per second) and $C_2$ is the capacitance (in farads) between sensor 120 and DUT 100 (see, e.g., FIG. 8).

Alternatively, a monopole sensor implementation 124 of sensor 120 having a stub lead 317, or a ball sensor implementation 126 of sensor 120 having a small-diameter ball 318 at the probe tip, may be used for the detection of electric fields. A stub sensor as shown in FIG. 9A tends to detect only the vertical component of an incident E field (i.e. only the vertical component induces a current in the stub lead). A ball sensor as shown in FIG. 9B, on the other hand, tends to detect all three components of an incident E field, as field lines in all three dimensions may be tangent to the ball.

A ball sensor as shown in FIG. 9B may be considered as an extension of a plate sensor as discussed above. Because a ball sensor offers greater sensitivity than a plate or stub sensor of similar diameter, the ball sensor may be used at a greater distance from the DUT, thus minimizing interference of the sensor with the emitted fields. Ball 318 may be a brass sphere having a diameter of from one to five millimeters, although balls of other materials, shapes, and/or dimensions may also be used. A ball sensor may be constructed by trimming a section of semi-rigid coaxial cable to expose a portion of the center conductor and insulator, and soldering (or otherwise conductively attaching) the ball to the center conductor. A ball sensor may be used, for example, for measurements at a system level (e.g. cellular telephones, stretchboards, printed circuit boards).

Figure 10:
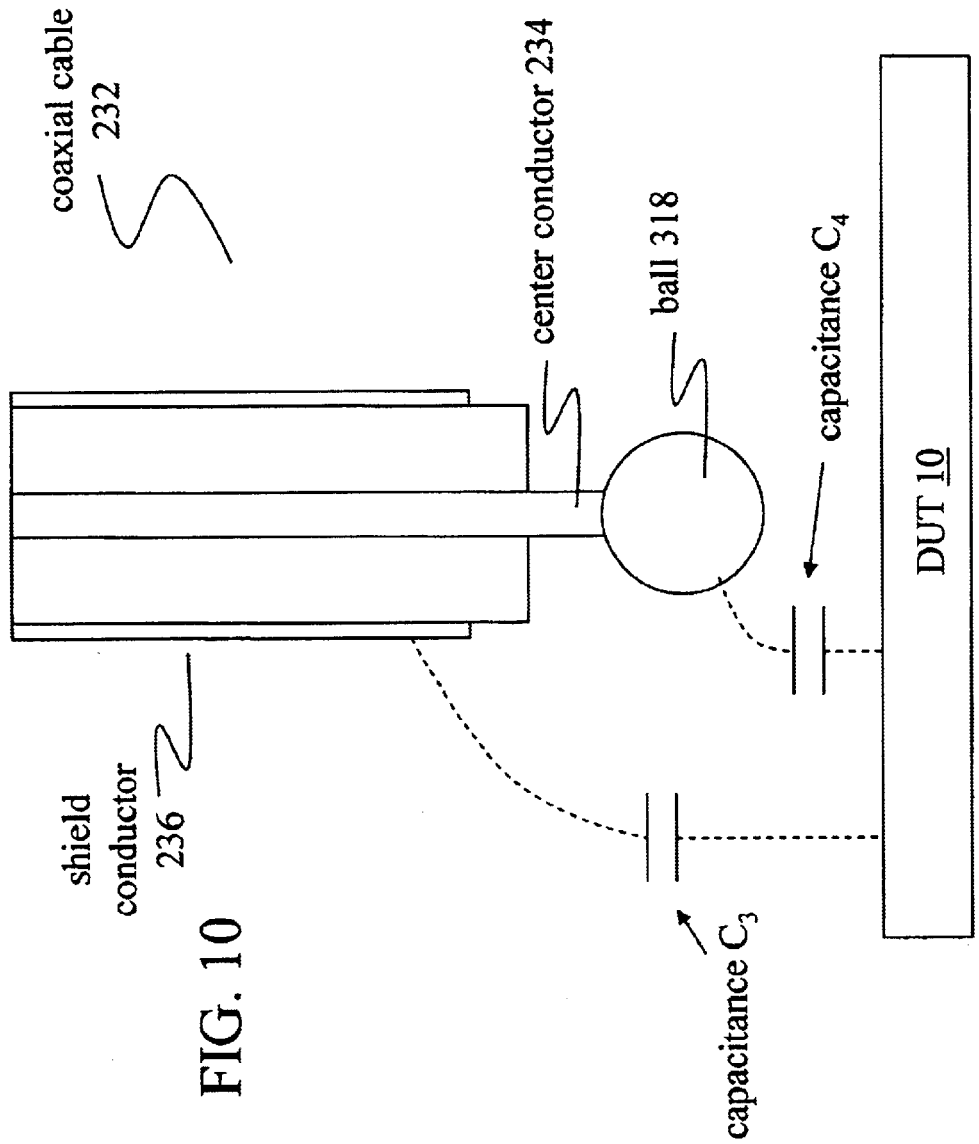
FIG. 10 is a diagram of effective capacitances in an operation of a ball sensor according to an embodiment of the invention.

The ball sensor samples the electric field by presenting an effective capacitance $C_{eff}$ that is the series combination of the capacitance $C_3$ between shield conductor 236 and DUT 10 and the capacitance $C_4$ between ball 318 and DUT 10 (see, e.g., FIG. 10). To within a first-order approximation, a relation between the voltage across the probe (i.e. between ball 318 and shield conductor 236) and the magnitude of the detected electric potential may be represented by substituting $C_3$ and $C_4$ for $C_1$ and $C_2$, respectively, in expression (1) above. In order to minimize perturbation of the field being observed, it is desirable to reduce $C_3$ and $C_4$, e.g. by reducing the diameter of cable 230 and ball 318, respectively.

Figure 11:
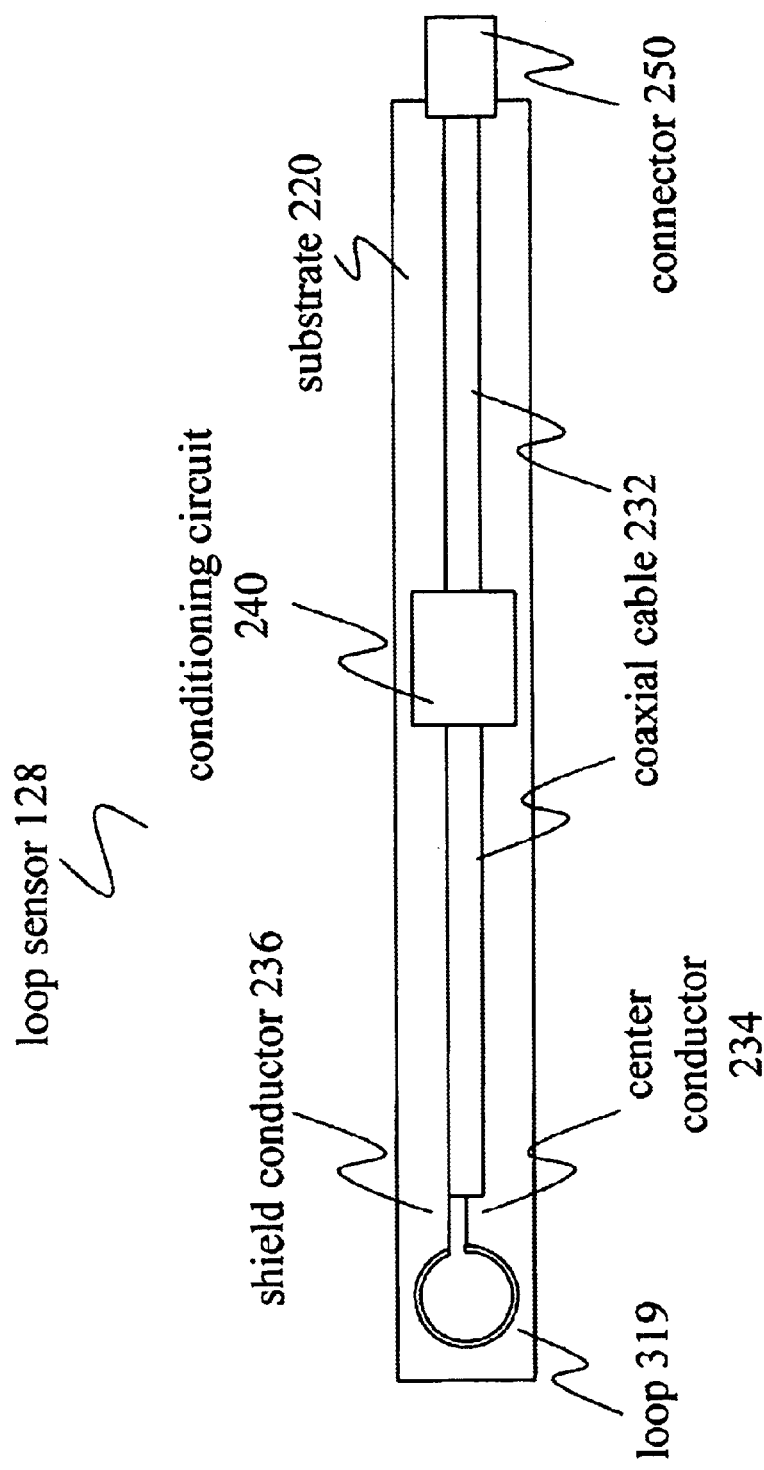
FIG. 11 is a diagram of a loop sensor according to an embodiment of the invention.

FIG. 11 illustrates a loop sensor implementation 128 of sensor 120 that may be used to measure magnetic fields. This sensor comprises a loop 319 that may be of wire or of metal or may even be etched into a printed circuit board (PCB). Loop 319 may be a single-turn loop or may comprise a loop of more than one turn. In exemplary implementations, loop 319 has a diameter of from 1 mm or less to not more than 10 mm. The voltage V induced at the terminals of loop 319 due to the magnetic flux density B (a vector quantity) of a field may be expressed as $$V = n \times B \times \omega \times A \times \cos\alpha, \quad (2)$$

where n is the number of turns in the loop, ω is the signal frequency in rad/s, A is the loop area in $m^2$, and α is the angle between the vector B and the plane of the loop.

Figure 12:
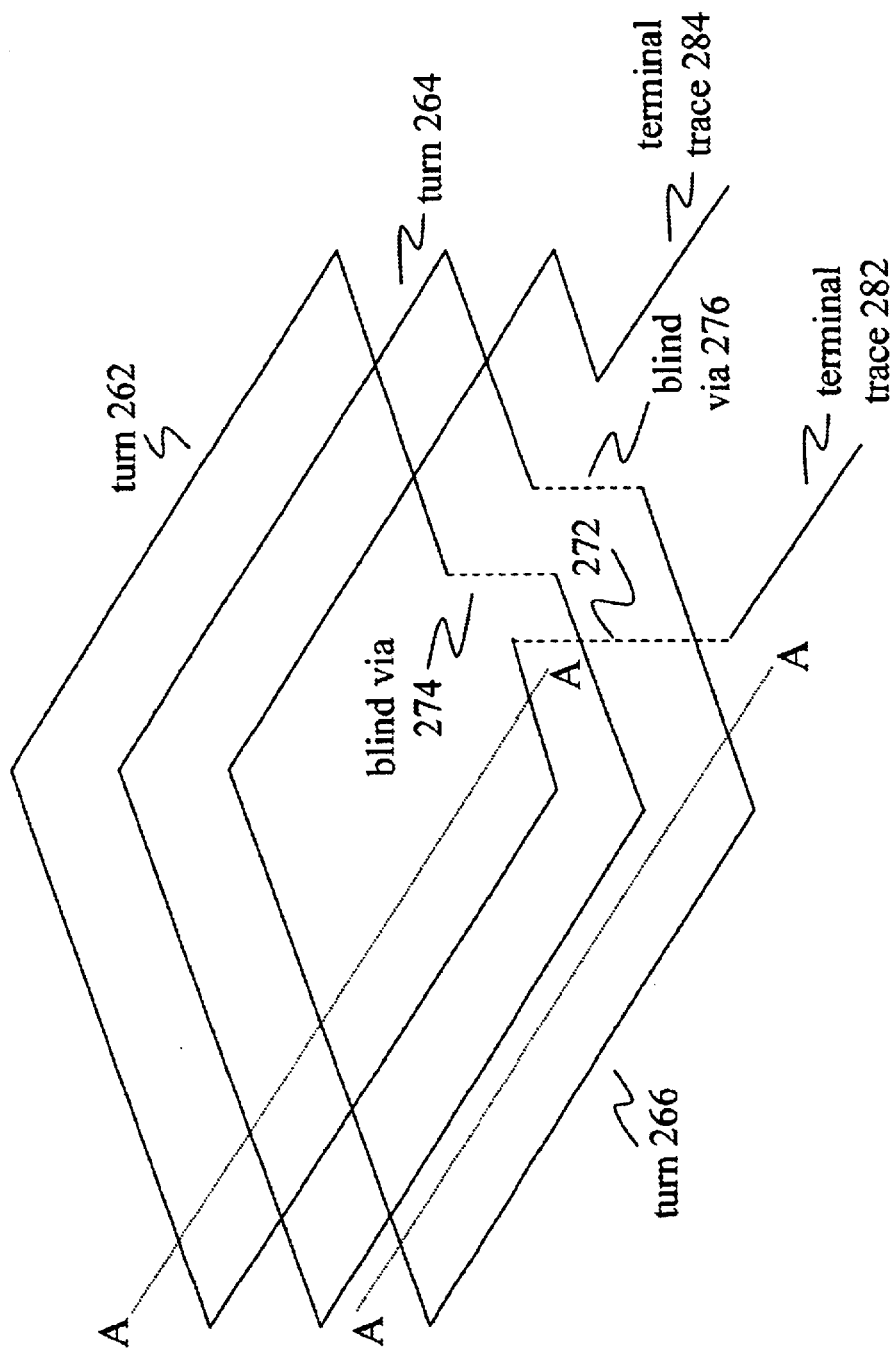
FIG. 12 is an illustration of the electrical connections for a multi-turn loop 319 fabricated on a multilayer printed-circuit board.
Figure 13:
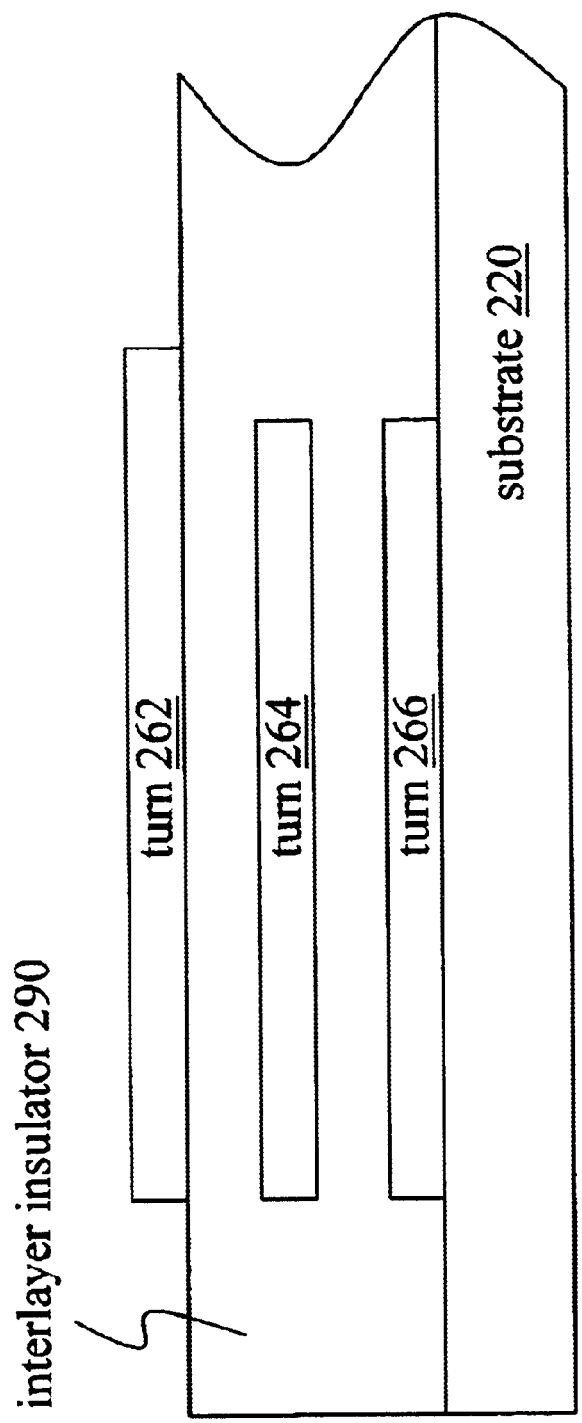
FIG. 13 is an illustration of a cross section of a multi-turn loop 319 fabricated on a multilayer printed-circuit board.

FIG. 12 illustrates how blind vias 272, 274, and 276 may be used to connect turns 262, 264, and 266 of a multiple-turn loop etched into a multilayer PCB to each other and to terminal traces 282 and 284. FIG. 13 shows a cross section of such a multiple-turn etched loop taken along lines AA, where each turn of the loop is separated by interlayer insulator 290.

Figure 14:
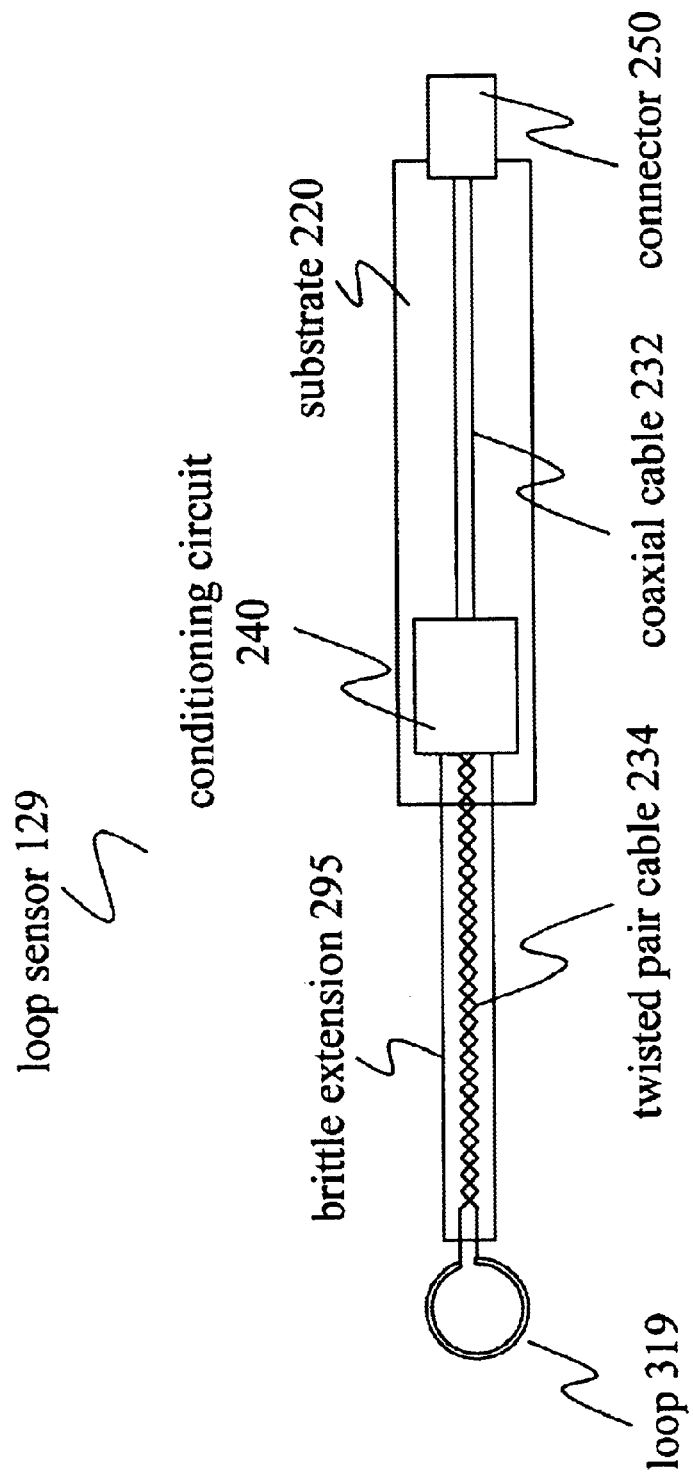
FIG. 14 is a diagram of a loop sensor according to an embodiment of the invention.

FIG. 14 illustrates a loop sensor implementation 129 of sensor 120 that may be used to measure magnetic fields. In this implementation, a balanced transmission line (such as twisted pair 234) is used to carry the signal from the balanced sensor loop 319. As mentioned above, the impedance of such a cable may be tuned by selecting and/or varying the twist angle. For example, the cable may be tuned to match the impedance of loop 319 to an input of conditioning circuit 240 or to another transmission line or processing stage. In an exemplary implementation, loop 319 is formed in the same wire used to fabricate twisted pair cable 234.

In an exemplary implementation, loop sensor 129 includes an active conditioning circuit 242 as described above. In this implementation, amplifier 170 is implemented using a differential amplifier. In combination with twisted pair cable 234, the differential mode of operation cancels common-mode interference and provides a high degree of noise immunity.

In order to obtain an accurate characterization of an emitted field over a two- or three-dimensional area, it may be desirable to prevent probe section 310 of sensor 120 from moving relative to the rest of the sensor (e.g. unless such movement is controlled). For example, it may be desirable to center probe section 310 relative to an axis of the sensor body before beginning measurements and to prevent probe section 310 from being displaced from this position during use.

As shown in FIG. 14, a brittle extension 295 may be implemented as a length of small-diameter glass tubing enclosing the portion of cable 230 that connects the probe section to conditioning circuit 240 and/or connector 250. This extension prevents displacement of probe section 310 of sensor 120 relative to the sensor body and may also minimize damage to the sensor body in case of accidental collision of probe section 310 (e.g. with DUT 10 or platform 110). Brittle extension 295 may also be used to facilitate alignment (e.g. centering) of probe section 310 relative to the sensor body. Assemblies including probe section 310, cable 230, and brittle extension 295 may be prepared in advance for quick and easy replacement in case of damage. Brittle extension 295 may also be used with other implementations of sensor 120 as described herein.

As loop 319 is a directional sensing element, loop sensor 129 may be used to measure a direction of a magnetic field vector at a particular position with respect to DUT 10. For example, sensor 129 may be rotated by arm 132 or a similar mechanism as described above, with the output of the sensor being sampled several or many times during the rotation. In an exemplary implementation, connector 250 is a rotary SMA connector or similar device supporting a suitable transfer of the RF signal (and possibly DC power) between the rotating and non-rotating elements of the system.

As described above with reference to FIG. 5, a bias tee 190 may be used to supply DC power to an active sensor over the sensor signal line. In a case where an active sensor is rotated by arm 132 or a similar mechanism as described above, it may be desirable for bias tee 190 to be located on the other side of connector 250 from probe section 310 such that bias tee 190 remains stationary with respect to the rotation.

For detection of thermal fields, an implementation of sensor 120 that is sensitive to emissions in the infrared (IR) region may be used. Probe section 310 of such a sensor may comprise a photodiode or other light-sensitive semiconducting device, which device may be doped to increase its sensitivity in this region and/or to reduce its sensitivity to emissions of other wavelengths. Such a sensor may also incorporate an optical filter to prevent unwanted emissions from reaching the sensing element.

In an alternative embodiment of sensor 120, emissions near to the DUT are conducted from the observed location to a remote sensing device optically (e.g. through a fiber optic cable) instead of electrically through a cable 230. By removing the RF cable from the vicinity of the DUT, such an embodiment may allow further minimization of the effect of the scanning process on the fields being measured. For the measurement of thermal fields, for example, the same IR sensor may be used as when the sensor is placed near to the DUT. For the measurement of magnetic or electric fields, the remote sensor may be a commercially available device capable of transducing RF fields from optical signals.

Other types of sensors that may be used with a positioning device as shown in FIG. 1 include a sensor having a probe section 310 that includes two perpendicular coils. A sensor of this type may be used to determine the magnitude and direction of a static or near-static magnetic field. The probe section 310 of another type of sensor includes the die portion of a field-effect transistor. When the gate is biased with respect to one of the source and drain terminals, the other terminal may be used to sense electric field or charge, and amplification at the probe may also be achieved.

A probe section 310 as described above may be reduced in size using one or more microelectromechanical systems (MEMS) elements. A sensor having a probe section 310 that includes MEMS elements, for example, may be used to detect fields having wavelengths in the millimeter, submillimeter, and even infrared ranges. Other types of sensors include probe sections having one or more Hall effect sensors, magnetoresistive sensors, or superconducting quantum interference devices (SQUIDs). Sensors having arrays of probe sections 310 as described herein may also be used. As described herein, a sensor and positioning device according to an embodiment of the invention may be used to detect signals having values of only tenths of a microvolt (or microamp), and an upper frequency of such measurements is limited only by the nature of the particular sensor selected.

Operating System

In using a sensor and positioning device as described herein, it may be desirable to perform one or more functions including calibration of the sensor, control of the motion and position of the sensor, control of other instruments in the signal path such as a spectrum analyzer, processing of a signal or signals received from the sensor and/or the DUT, and acquisition and presentation of data. For example, it may be desirable to control the sensor to move across a specified area or volume relative to the DUT, and at the same time to receive, process, store, and/or display data outputted by the sensor that relates to an electromagnetic field present in the specified area or volume. In an exemplary implementation, an operating system as described herein coordinates the practice of several methods (e.g. including such functions) according to embodiments of the invention.

Figure 15:
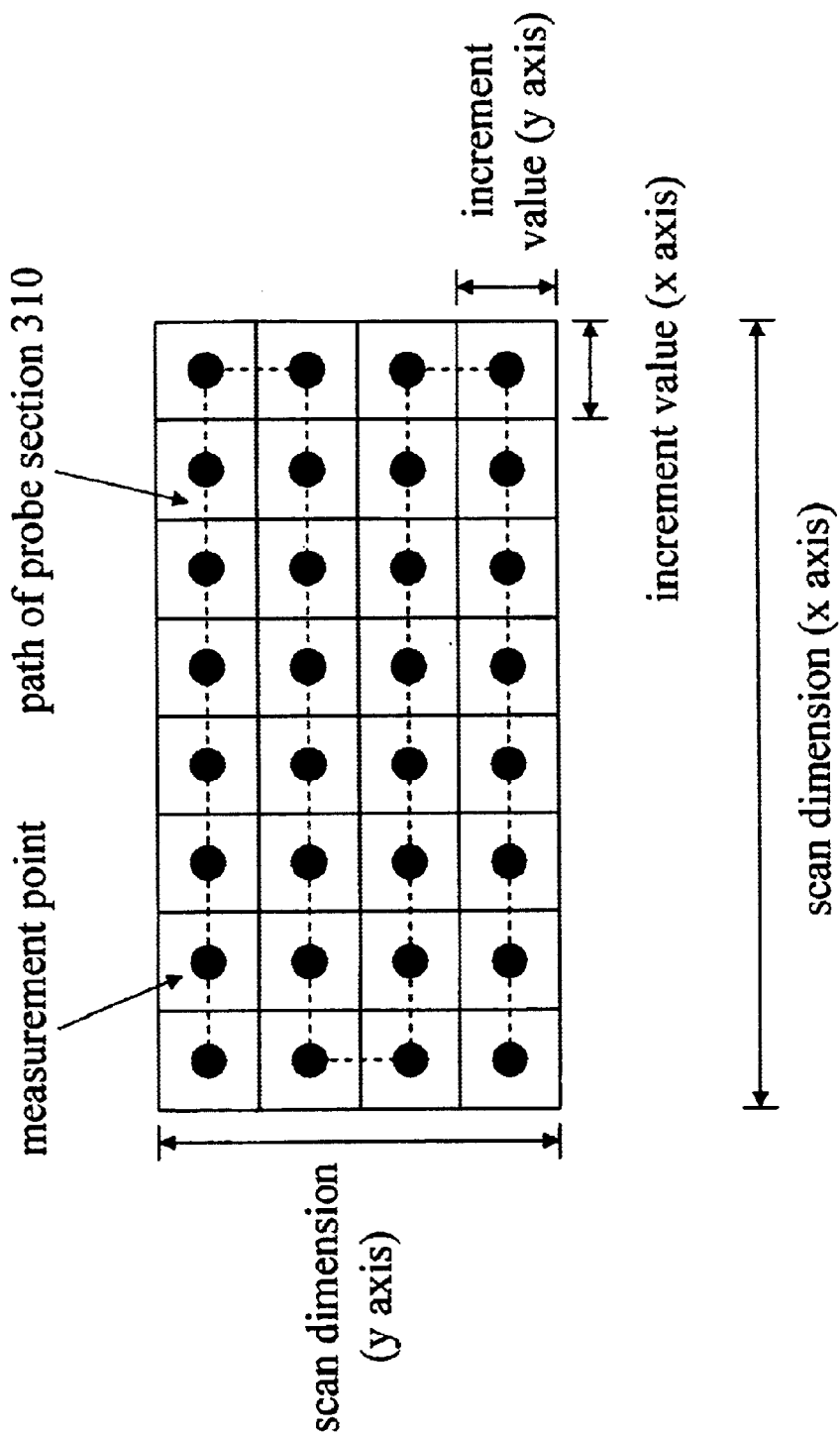
FIG. 15 shows a path of a probe section in a scanning plane.

Such an operating system may be designed to perform essentially the same operations, and using essentially the same interface, regardless of either the size or particular set of features of the sensor and positioning device being controlled or the particular processing, data collection, and/or signal generation equipment that may also be present in the signal path. For scanning operations, a user interface of such an operating system may be broadly divided into three phases: preliminary, scanning, and presentation. Functions that may be performed in the preliminary phase include the following:

1) choose a sensor appropriate for the desired application. Sensor characteristics that may be relevant to such a choice include the type of field that the sensor is designed to detect, sensitivity, signal-to-noise, and resolution or spot size (e.g. as determined with respect to one or more reference sources);

2) configure the signal path. For example, it may be desirable to include a low-noise amplifier (LNA) in the signal path. Alternatively, it may be desirable to reduce the level of gain of an amplifier or preamplifier already in the path. It may be desirable to configure the path to include one or more signal processing units such as filters or to compensate for other factors such as cable losses and amplifier noise figures. It may also be desirable to account for the transfer function of the sensor (e.g. as obtained from a calibration procedure as described herein). In such case, a recognition mechanism (e.g. including a mechanical key and/or an optical and/or electrical mechanism to sense an identifying code of the sensor) may be included to allow automatic recognition of a sensor and consequent selection of the appropriate transfer function (e.g. by selecting a particular file containing the transfer function, or by indicating a directory or folder where such a file may be stored);

3) select a frequency, a range of frequencies, or a number of individual frequencies or ranges of frequencies to investigate;

4) program scan area(s) and resolution. To select and program the volume or area to be scanned, the user may enter such parameters as the range and increment along each of the x, y, and z axes. For example, FIG. 15 shows a scan path of a probe section 310 between defined measurement points, as defined by increment values and scan dimensions in each axis of a plane. In an exemplary embodiment, the user selects the scan area, the number of planes to scan (each plane being parallel to a surface of the DUT), the distance of the first plane from the DUT, and the spacing between adjacent planes (three-dimensional measurements of this kind may be useful for determining characteristics of the decay of the sensed field over distance). If the inputted parameters do not produce an integer number of measurements in each axis, the increment values and/or scan area may be adjusted. In other implementations, scanning may occur only at selected discrete points or along a specified line or curve. The user may be restricted from entering scan parameters that would cause the probe section 310 to pass within a minimum distance from the DUT (e.g. to avoid collision);

5) select a file folder and/or filename at which to store the collected data. A file format may also be selected (e.g. for compatibility with another software package);

6) configure external instruments, such as a spectrum analyzer and/or or an oscilloscope, to process and/or record data outputted by the sensor. Relevant parameters may include reference level and units, resolution and video bandwidth, sweep time and span, peak excursion, and averaging;

7) configure the DUT to operate in a selected mode during the scanning phase and/or configure one or more external sources to provide an input signal to the DUT during the scanning phase and/or to vary such a signal in a controlled manner;

8) configure one or more external sources to provide a signal for susceptibility measurements. In such case, a passive sensor may be used to radiate rather than sense signals, or an antenna unit (e.g. including a loop, monopole, or dipole radiator of suitable dimension) may be used with a positioning device as described herein; and 9) select one or more operations (if any) to be performed during the scanning phase, such as collection of emissions data or collection of susceptibility data. A gated or triggered mode of operation may also be selected (e.g. for sensing fields that are pulsed).

The preliminary phase may include an exploratory scan. In an exemplary implementation, for example, a joystick or computer mouse control is provided for manually positioning sensor 120 with respect to DUT 10 (alternatively, a set of coordinates for a desired destination of the sensor may be entered from a keyboard). This feature may be used to perform preliminary manual scanning of the DUT or for placement of the sensor in peak monitoring mode as described herein. Moreover, the joystick control or a similar manual positioning mechanism may be used to enter an initial placement of sensor 120 and may also be used in conjunction with registration unit 460 to align this initial placement with some identifiable feature of the DUT (e.g. so that images of the DUT and/or of various sensed fields may be more easily aligned for comparison).

Spectrum content and peak monitoring measurements may also be performed (e.g. in preparation for or instead of a scanning operation). For example, a spectrum content measurement may be performed in order to identify frequencies to be investigated during an exploratory scan and/or during the scanning phase (e.g. frequencies where emissions levels are excessive). In a method according to one embodiment of the invention, a spectrum analyzer (or other suitable detector) is used to determine the frequencies at which the fields emitted from the DUT have components of significant strength. The user may then select the particular frequencies to be scanned and can also mark undesired ambient (background) peaks or other features for deletion from the data to be presented. The latter feature may be particularly useful for conducting measurements at a site where a shielded room is not available or practical.

A peak monitoring measurement may be performed to provide a basis upon which to compare one device to another (or one process to another) with respect to total near-field emissions over a selected frequency range. In one such method according to an embodiment of the invention, a sensor is fixed in position near the DUT. A bandwidth s is chosen (where s is measured in MHz), and the frequency and amplitude for each signal are recorded as the sensor's output is scanned over the selected frequency range. From this information, the spectral content figure of merit (SCFM) is calculated as $$SCFM = \frac{N}{s}\left[\sum_{i=1}^{N} A_i^2\right]^{1/2}, \quad (3)$$

where N is the number of signals in a given range and $A_i$ is the amplitude of each signal. The presence of a signal may be defined with respect to the noise floor or, alternatively, with respect to a predetermined threshold. During spectrum content or peak monitoring measurements, the sensor may remain stationary with respect to the DUT, or it may be moved and/or rotated relative to the DUT.

During the optional exploratory scan, the user may move the sensor with respect to the DUT while observing the emissions levels being sensed (e.g. at selected frequencies or ranges of frequencies). According to this information, the user may determine whether an amplifier is needed. The user may also determine whether the emissions being sensed are due to the DUT or to an external source. In a case where an external source is interfering with the measurement, the user may take preventative measures before executing the scanning operation by shielding the DUT, adding an appropriate filter to the signal path, choosing a more selective sensor (e.g. one having a smaller spot size), and/or compensating for the interference by subtracting it from the measured data. If necessary, signal levels may also be reduced by filtering or decreasing a gain factor.

In a case where a directional sensor is used, the preliminary phase may also include verifying a minimum separation between the directional components of the sensed field. For a loop sensor, for example, a minimum signal is obtained when the plane of the loop is parallel to the field, and a maximum signal is obtained when the plane of the loop is perpendicular to the field. If the difference between the minimum and maximum (e.g. in dB) does not satisfy a specified threshold, the user may configure the signal path to include additional gain as necessary or choose a different sensor.

Another operating mode that may be selected is calibration of a sensor with a TEM cell or a microstrip line. Reference fields as emitted by a TEM cell, or by a microstrip line of sufficient length that edge and connector effects may be ignored, are useful in that their field values may be accurately modeled. By correcting for the known field behavior in a sensor's response, a calibration curve may be obtained for the sensor (e.g. relating sensor output level to frequency for a constant input level).

Emissions measurements may be conducted at one or more selected frequencies or ranges of frequencies. Likewise, susceptibility measurements at one or more selected frequencies or ranges of frequencies. Modes of operation that may be selected for execution during the scanning phase include combinations of fixed or rotating sensor, fixed or rotating DUT, electric or magnetic field monitoring, and RF or static field monitoring.

In a time domain measurement mode, an oscilloscope may be used to display time-domain signals radiating from the DUT. Such a mode may be useful in applications where contact measurements would distort the field under study, and it may also be used to monitor triggering events. In a thermal analog monitoring mode, the temperature at a single point on a DUT may be monitored over time. Other modes of operation include mapping DC fields.

In the scanning phase, field strength data at one or more chosen frequencies is measured and recorded as a function of sensor position while the DUT is operating. The apparatus may automatically record the amplitude of each chosen frequency at every sensor position over the area or volume selected. The user may select a type of display by which to monitor the data collected, and readouts for monitoring the scanning process are also provided in an exemplary implementation. If necessary, the sensor's pattern of movement during scanning may be preprogrammed to account for the placement and/or orientation of the DUT. Such compensation may be especially useful in a case where the DUT is being rotated during the scanning phase.

Monitoring of the output of a rotating sensor during scanning may be performed by a spectrum analyzer in zero-span (tuned receiver) mode (or another suitable detector), with the output of the spectrum analyzer being sampled using an analog-to-digital converter (ADC). In an exemplary implementation, detection of a home position of the sensor (e.g. hole 164 in disk 162) is used to trigger sampling by the ADC. The sampled data may then be processed (e.g. by the host computer) to determine the magnitude and direction of the field vector at each scanning location. For example, measurements taken at two orthogonal directions of the loop (e.g. the maximum and minimum measurements) for each fixed x, y, z position of the sensor may be unambiguously combined to obtain a resultant magnetic field intensity at that sensor position.

Monitoring of the output of a rotating sensor may also include a glitch monitor to detect and indicate possible problems with, e.g., the rotary connector. Wear and tear of this connector, or failure of the preamplifier, may introduce glitches or spikes on the RF line. In accordance with an indication by this monitor, a scanning procedure may be paused (possibly including storing data collected thus far) for correction of the problem and subsequent completion of the procedure. In a further implementation, indication by a glitch monitor during an unattended scanning procedure may trigger transmission of a notification to the user, e.g. via pager and/or e-mail.

In the presentation phase, data collected during the scanning phase (and/or retrieved from storage) may be displayed as, e.g., false-color images of RF field intensity, IR intensity, source impedance, and/or power as distributed over a preselected area or volume; contour plots of current density distribution over the surface of the DUT; and/or plots of field intensity decay with distance from the DUT. It is also possible to obtain and compare several plots, each of which may represent a different property of the near-field emissions. One or more such plots may also be displayed in real time during data collection, together with parameters of the present test (e.g. as selected during the preview phase). Additional examples of display forms that may be used in the presentation phase include the following:

a) a two- or three-dimensional image showing field strength variation over the area or volume scanned. In an exemplary implementation, field strength values are shown in false color, e.g. with red representing locations of higher field strength and violet representing locations of lower field strength. Electric (magnetic) fields are measured in linear units of volts (amps) per meter and logarithmic units of dB microvolt (microamps) per meter. Evolution of the field above the DUT may be depicted by an integrated collection of two-dimensional representations of parallel planes at different heights above the DUT; in an exemplary application, these planes may be spaced from 1 to 3 mm apart;

b) plots of field strength versus distance (e.g. in linear, logarithmic, or semilog form), showing field decay with distance for a specific point on the device. These plots may be used to determine the boundary between the near- and far-field regions and/or to identify the type of near field detected. They may also be used in designing board and enclosure level shielding;

c) field direction contour plots. These plots are obtained by rotating the field sensor and recording the orientations at which field maxima occur. For example, the sensor may be rotated through either 180° or 360°, and field direction at each scan point in a grid may be represented by an appropriately oriented line or arrow. Near-field information obtained in this fashion is related to current density distributions in the DUT;

d) raw or filtered data suitable for use by other analysis programs such as MATLAB;

e) RF power density plots, wherein each point represents the total RF power (i.e. within a predetermined bandwidth) detected at that location; and f) thermal (e.g. infrared) field images from data obtained in a similar manner as for electric and magnetic fields. Correlation of such plots with RF power density plots is useful for examining RF heating effects on the device package, for example. By comparing hot and cool spots in the thermal images with the high and low intensity spots on plots of field strength versus position, it can be determined whether the heating is caused by RF energy or some other source.

In cases where the measured data includes a directional value, plots as described above may also be displayed in polar coordinates. Additional information that may be captured and displayed during the presentation mode includes images from other equipment in the signal path (e.g. from the screen of the spectrum analyzer). Display of images and information as described herein may also include printing color and/or black-and-white images.

Assuming that suitable registration steps are performed before scanning, plots obtained as described herein may be combined with each other and/or with other images of the DUT (and/or an image of an outline of the DUT) to reveal correlations between the fields detected and other features of the DUT. For example, a cursor in a digital image of the DUT may be ganged to cursors in one or more displays of collected data such that corresponding spatial locations among the various displays may be easily identified. In one such arrangement, for example, movement of the cursor to a hot spot in an intensity plot will cause the cursor in a bitmap image of the DUT to move to the location corresponding to the hot spot. Alternatively, features of the collected data plot (such as contour lines) may be overlaid onto a digital image of the DUT.

In an exemplary implementation, routines to perform control, processing, and display functions as described herein are coordinated under a single integrated interface using the LabVIEW software package (National Instruments Corp., Austin, Tex.). This particular approach was chosen for ease of development only, however, and must not be construed as a limitation of the invention, as methods according to embodiments of the invention may be practiced using any other suitable software package or suitable combination of packages. For example, any or all of the functions described herein may also be performed using a program written in C, C++, C#, Visual Basic, Java, or any other suitable computer language.

A Scanning System Constructed According to One Embodiment of the Invention

In this section, an automated, high-precision placement and scanning system constructed according to one embodiment of the invention is discussed. Combined with control, signal recording, and processing software, this scanning system provides accurate, high-resolution mapping of the near fields. This discussion relates to a particular embodiment of the invention and does not limit the more general description of other embodiments as presented herein.

This near-field emissions scanning system may be used for both diagnostic and research and development purposes. As a diagnostic tool, for example, the scanning system may be used for such tasks as:

1) The identification of unexpected sources of radiated emissions at the chip, package, board, and system level.
2) The identification of interference mechanisms that may impact component and system functionality.
3) The investigation of changes in emissions levels from a specific ASIC due to changes in, for example, device feature size, power distribution, and overall layout.
4) The investigation of the effectiveness of specific shielding practices and/or materials on electromagnetic noise suppression.

Figure 16:
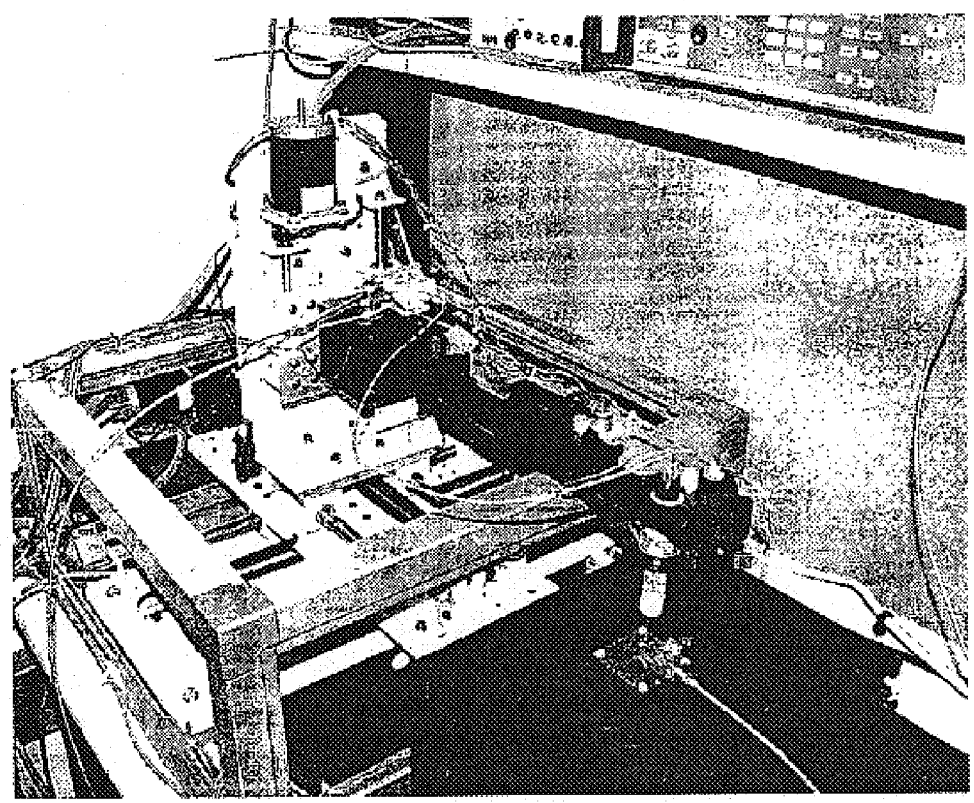
FIG. 16 shows a photograph of a near-field scanner constructed according to one embodiment of the invention.
Figure 17:
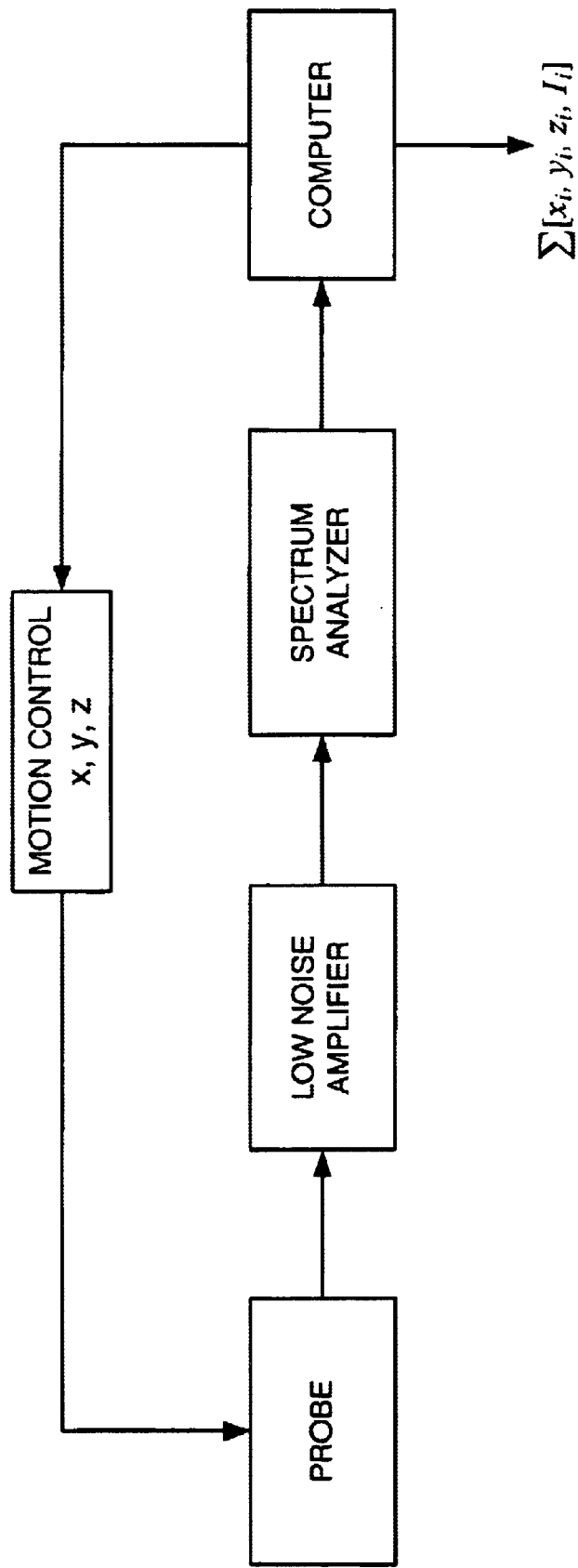
FIG. 17 shows a block diagram of a near-field scanner constructed according to one embodiment of the invention as used with a fixed sensor.

In its basic configuration, a system according to this particular embodiment of the invention includes a passive (E or H) sensor mounted on a robot arm, a three-axis positioning system, a low noise amplifier, a signal detector (e.g. a spectrum analyzer), and a host personal computer that is programmed to perform motion/instrument control and data acquisition tasks. Due to its modular design, the system (as shown in FIG. 16) may accommodate standard or user-defined/designed sensors and other signal processing and detecting hardware as may be desirable for the specific application at hand. A block diagram of this basic configuration is shown in FIG. 17.

Figure 18:
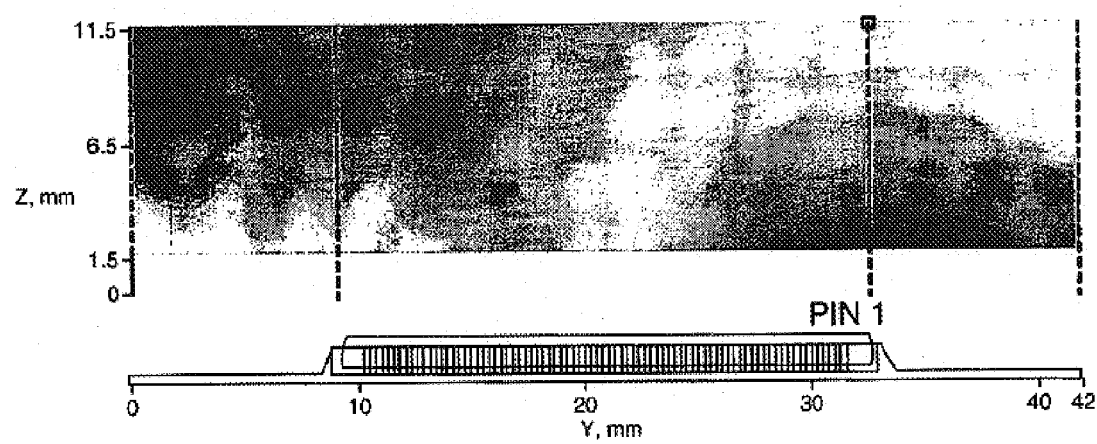
FIG. 18 shows a VLSI chip emission profile.

The system may be used to obtain an emissions profile in the following manner: Once scan area/space above a DUT is defined by the user, voltage(s) sensed by the sensor at each scan position and at the frequency or frequencies of interest are amplified and subsequently recorded by the spectrum analyzer. The host computer then reads the signal level via a GPIB bus (National Instruments Corp., Austin, Tex.; also called 'IEEE-488') and records the field intensity. A field intensity distribution for each frequency is constructed by plotting the recorded intensity for each scan position (or pixel) and may be presented as a false-color image. Typical output is of the format:

$$\Sigma[x_i, y_i, z_i, I_i], \quad (4)$$

where $x_i$, $y_i$, and $z_i$ denote the spatial coordinates of the i-th sample and $I_i$ denotes the recorded intensity at that sample. FIG. 18 shows an example of an intensity plot obtained with a fixed sensor.

The same configuration may also be used to acquire frequency content information with respect to a device. This acquisition may include measurements at a fixed position (e.g. directly above the die). The program records the signals emitted by the device within a given bandwidth for further analysis.

Figure 19:
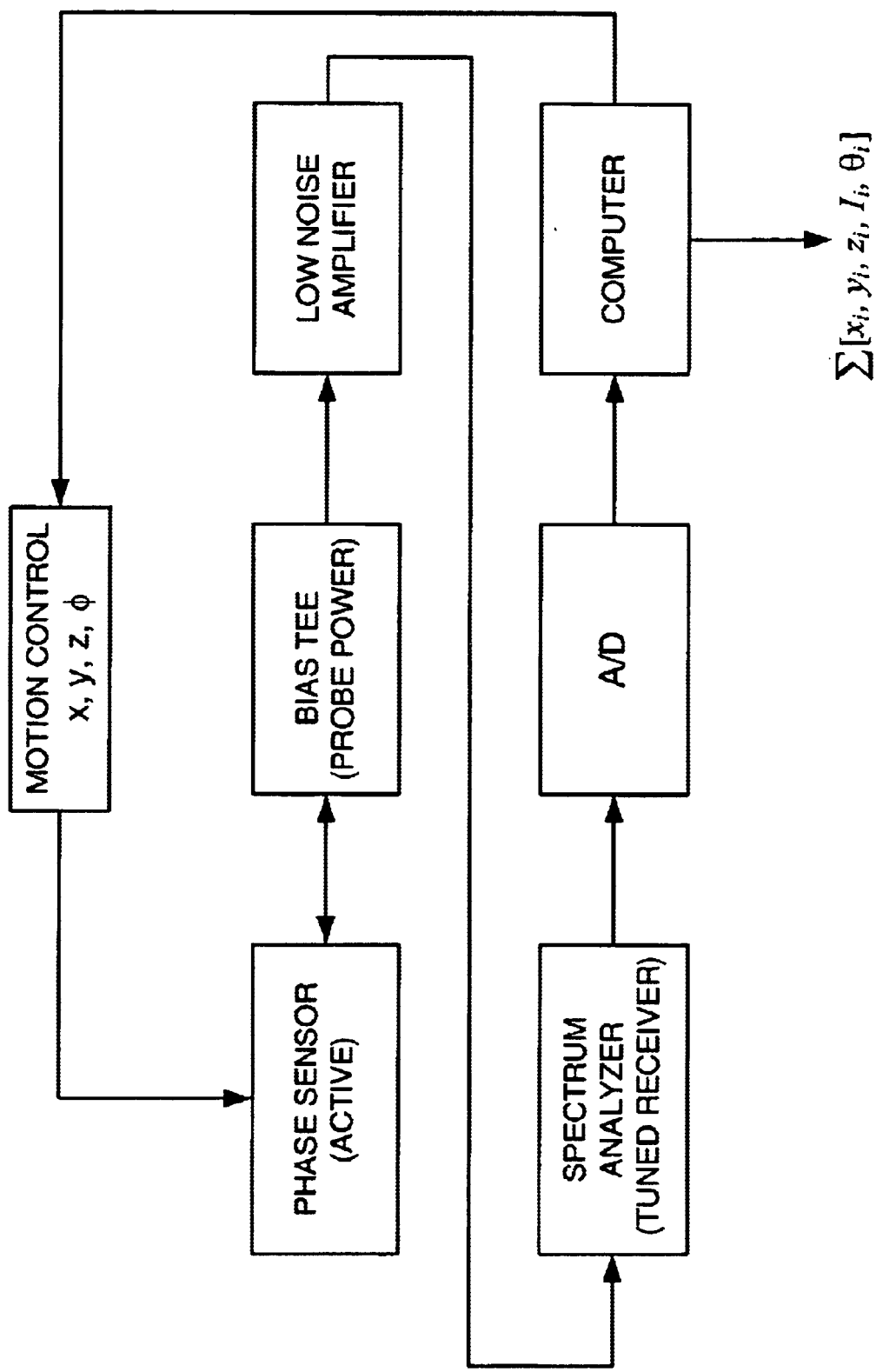
FIG. 19 shows a block diagram of a near-field scanner constructed according to one embodiment of the invention as used with a rotating sensor.
Figure 20:
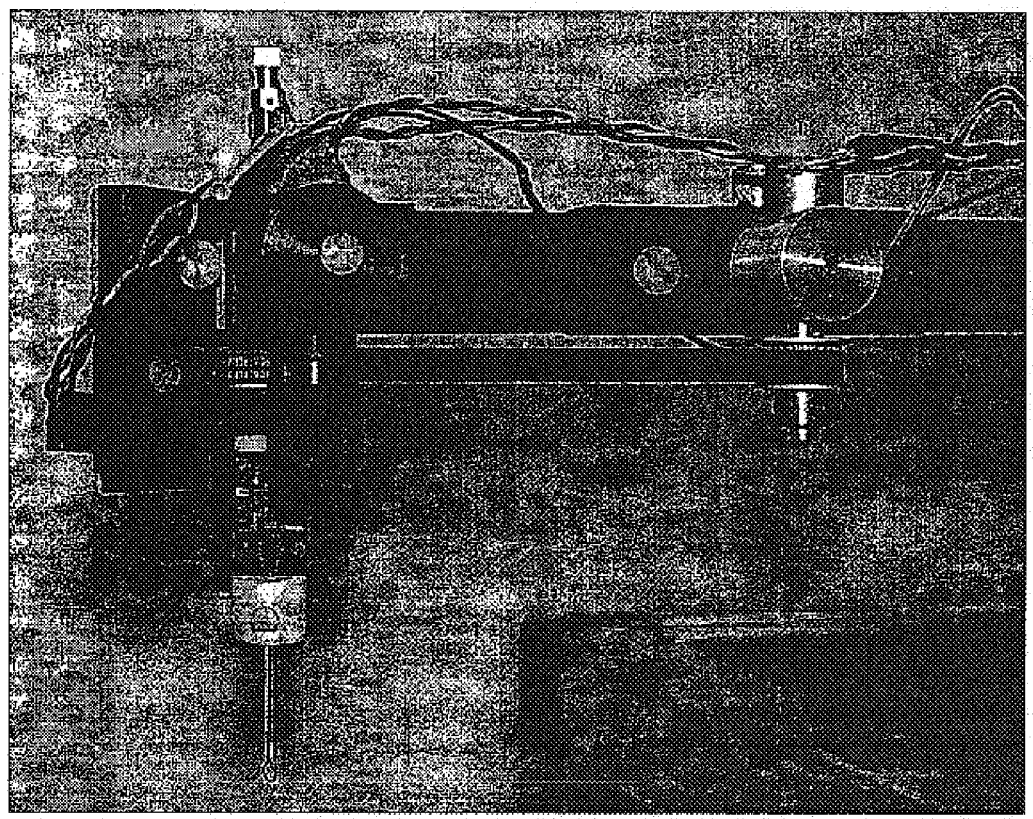
FIG. 20 shows a photograph of a rotating sensor and rotation mechanism constructed according to embodiments of the invention.

A more complete picture of the field may be obtained through the use of a rotating sensor. A system configuration for this application is shown in FIGS. 19 and 20. In this configuration, a maximum field intensity at each scan position is recorded, together with the angle at which it occurs. This information may be obtained using a rotating sensor assembly mounted on the scanner arm, as shown in FIG. 20.

Figure 21:
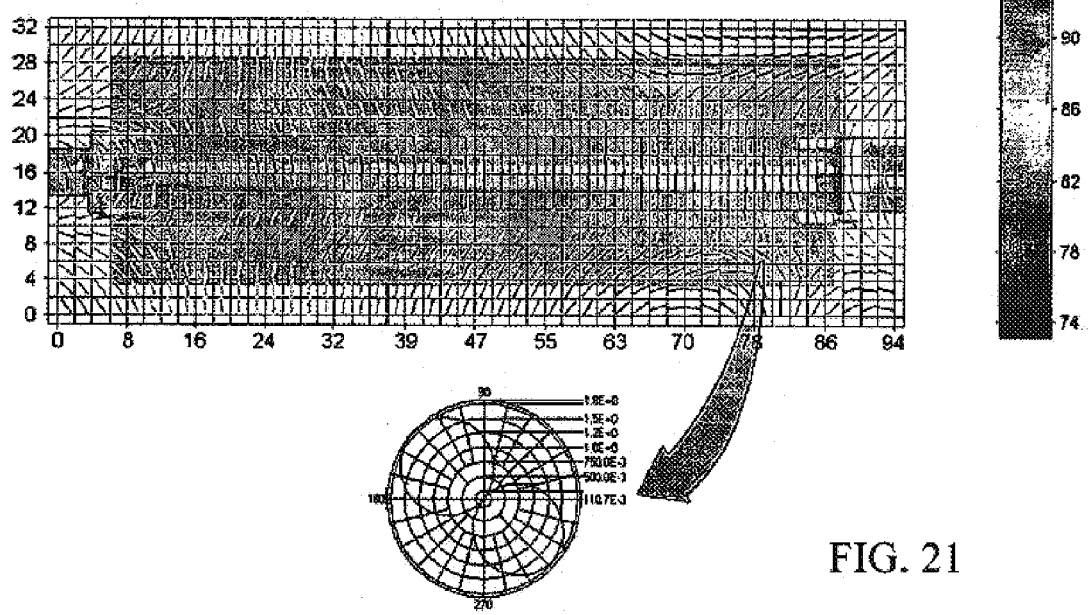
FIG. 21 shows a presentation of information collected using a rotating sensor as shown in FIG. 20.

A typical output for such a configuration may depict a magnetic field or the current that gives rise to such a field. Each scan position (or pixel) is now represented by a vector whose magnitude may be coded as above according to a color chart. FIG. 21 illustrates an example of an emissions profile obtained for a microstrip line terminated in its characteristic impedance.

Features that may be realized in a scanning system according to this embodiment of the invention may include the following:

a) Instrument has three degrees of freedom and operates with electromagnetic and static field sensors.
b) Modular design permits user choice of detector, sensor, and signal processing hardware.
c) Capable of 1 micron stepping.
d) Sensitivity: H field, 1 $\mu$A/m; E field, 0.1 mV/m (for a 10 mm magnetic field sensor at 1000 MHz).
e) Multiple frequency sweeps in one scan.
f) Adaptive spectrum analyzer settings optimized for each frequency. Frequencies of interest may have individual settings, including triggered measured.
g) Interactive sensor transfer function editor, with entries available for LNA (low noise amplifier) gain and cable losses.
h) Scan area defined with a laser pointer or based upon the dimensions of the DUT.
i) Scan step size selectable for each dimension.
j) Sweeps a range of emission frequencies and displays field intensity of each peak found. Saves the selected frequencies for scanning.
k) Manual control of sensor position for preview. Sensor position may be set by using a joystick, moving a screen cursor, or entering coordinates from the keyboard.
l) H field sensors for recording direction and magnitude of field emissions.
m) IR sensor for monitoring and imaging.
n) During automatic scans, one or more false-color images of field intensity may be displayed in real time. Scaling may be set automatically or manually.
o) After scanning is complete, a presentation/analysis engine may be called to provide the user with additional information such as one or more of the following:
 1) a digital image (e.g. a bitmap) of the DUT may be shown in conjunction with the field intensity false-color image. Ganged cursors may be used to facilitate visualization of a correspondence between hot spots and specific locations of the DUT;
 2) for multiple planes, a plot showing decay of field intensity over distance may be displayed;

3) for each frequency, the captured spectrum waveform may be displayed;
4) for directional sensors, field strength vs. angle may be displayed at each position.

Development and Use of Sensors According to Particular Embodiments of the Invention In this section, a number of E and H field sensors capable of detailed, high-resolution mapping of the field are discussed. This discussion relates to particular embodiments of the invention and does not limit the more general description of other embodiments as presented herein.

Figure 22:
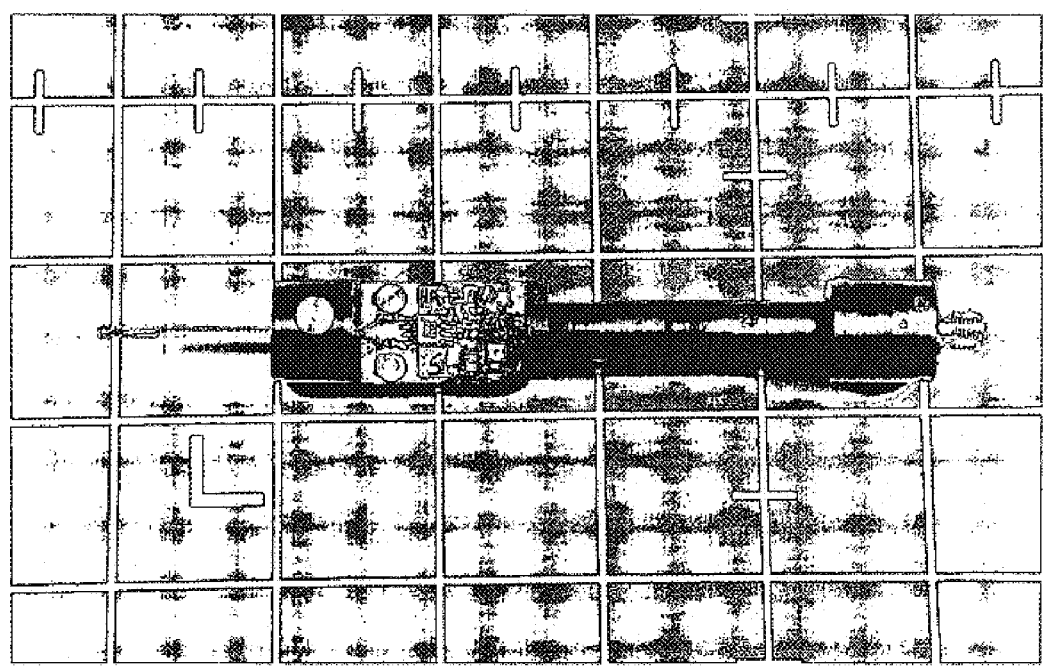
FIG. 22 shows a photograph of an active magnetic field sensor constructed according to one embodiment of the invention.
Figure 23:
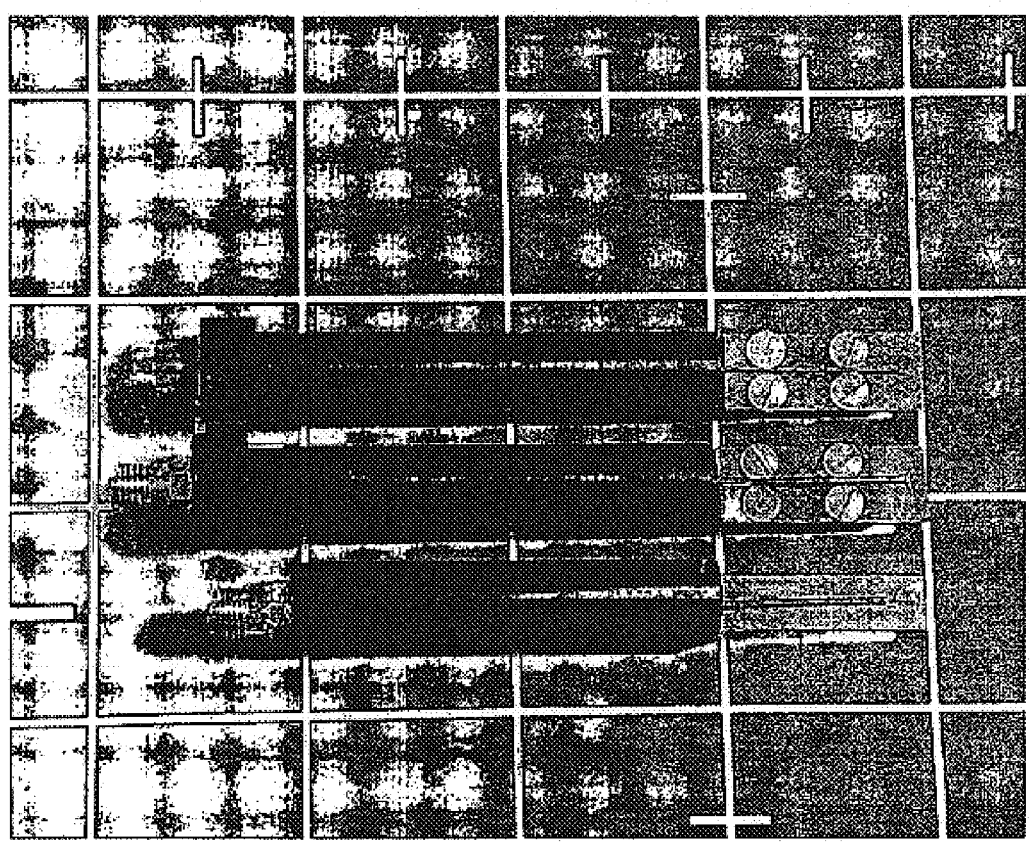
FIG. 23 shows a photograph of several loop sensors constructed according to embodiments of the invention.

In order to obtain near-field measurements, it is desirable to use sensors capable of measuring magnetic and electric components of the field accurately and with high resolution. Type (e.g. whether passive or active) and size of a sensor used may depend upon the intensity and distribution of the source under investigation. FIG. 22 shows one example of an active sensor constructed according to an embodiment of the invention, and FIG. 23 shows additional examples of sensors constructed according to embodiments of the invention.

Figure 24:
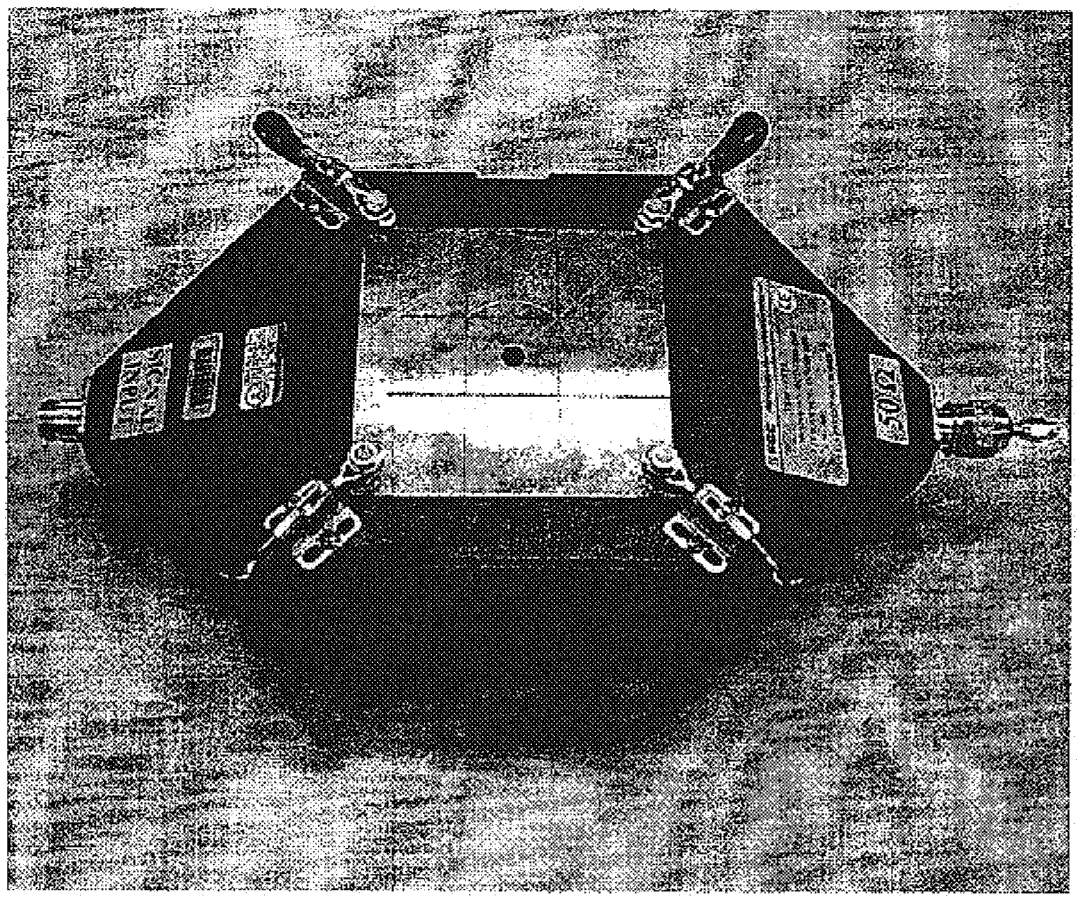
FIG. 24 shows a photograph of a TEM cell.

Field sensors may be calibrated against a reference source in a TEM or Crawford cell. Such a cell is commonly used (e.g. in standards promulgated by the Federal Communications Commission) to establish a uniform field for device susceptibility and sensor calibration measurements. The basic structure of a TEM cell (as shown in FIG. 24) can be viewed as a modified stripline with side-walls added. The dimensions of the cell and the two tapered sections are chosen so that a characteristic impedance of 50 ohms is maintained throughout. A reference field is set in the cell through application of a source voltage.

Figure 25:
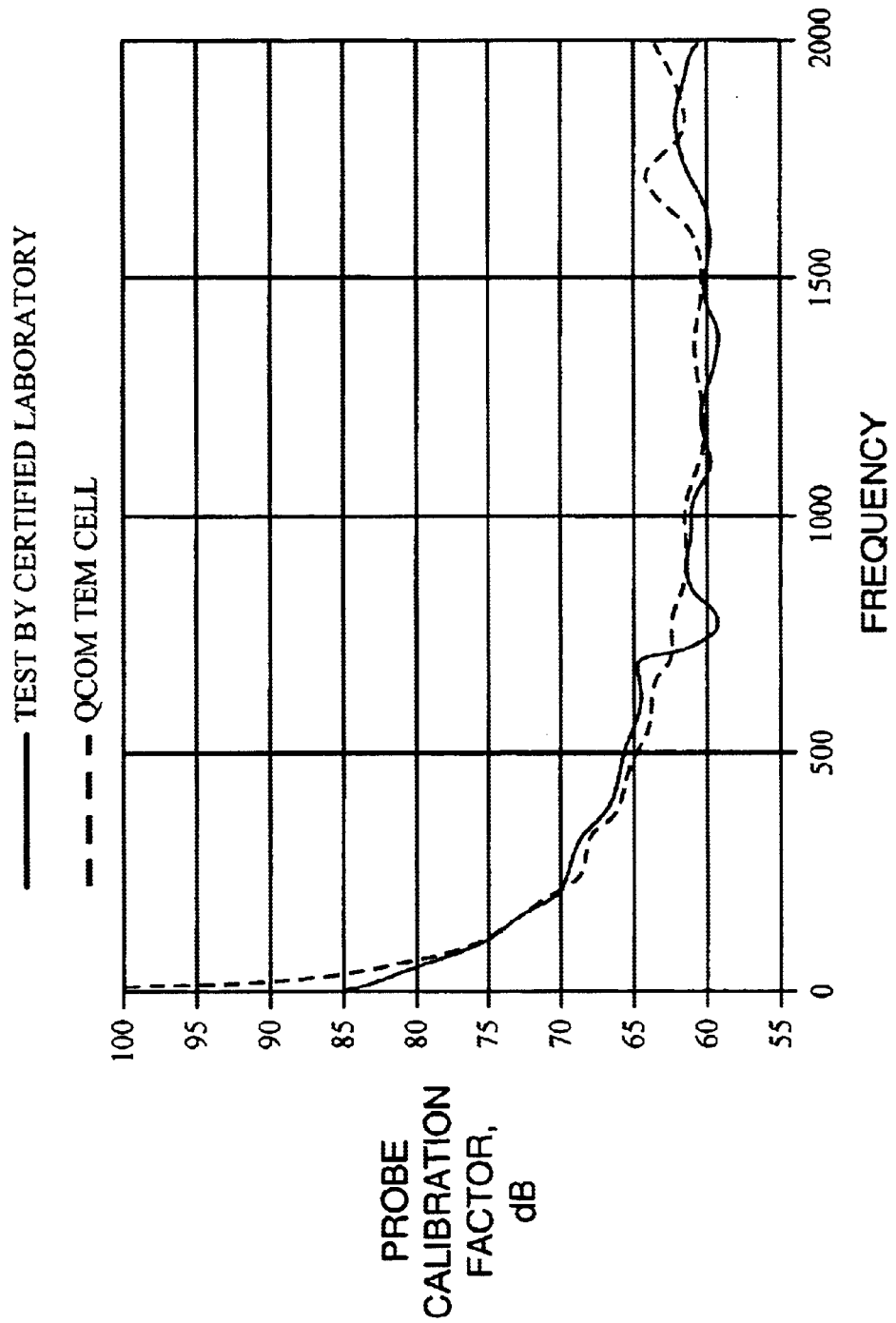
FIG. 25 shows a comparison of results from two calibration tests conducted on a 10 mm loop sensor.

A computer-controlled setup has been developed for automatic calibration of sensors in the frequency range of interest. A formula or look-up table is then obtained and applied as the transfer function of the sensor. In order to verify the accuracy of our procedure, several commercial probes were purchased and sent for calibration to a certified laboratory. The laboratory's results were then compared with the calibration results we obtained with those commercial probes in our own lab using a method according to an embodiment of the invention (see FIG. 25 for a comparison of calibration results for a 10 mm loop probe).

A loop sensor design may be used to measure time-varying magnetic fields. We have developed a number of passive loop sensors that may be calibrated in the TEM cell. While such calibration provides a relatively accurate transfer function, problems may arise with sensors that include passive loop sensors. Due to the asymmetric nature of the loop sensors made from sections of semi-rigid coaxial cable, for example, the sensor may act to some extent as an E field sensor. This problem may be reduced by adding impedance-matching components in-line between the loop (balanced line) and the semi-rigid coaxial cable (unbalanced line). However, this solution may be detrimental to the bandwidth of the sensor, due to a limited bandwidth of the matching transformer (balun). Also, passive sensors do not provide isolation between the loop (the sensing element) and the amplifier. Therefore, the section of the line connecting the loop to the detection circuitry (which may in some cases reach one foot in length) may become part of the sensor, possibly affecting measurement accuracy and distorting the results.

For such reasons and in order to obtain more accurate results, a sensor including an active loop sensor was designed. Such a sensor may be used as a fixed sensor or as a rotating sensor. The sensor is powered through its RF output line, such that DC power for the circuitry on the sensor is delivered through the sensor's RF output line. This delivery is accomplished by using a bias tee device at the output end, which allows the user to apply DC and still maintain isolation with the main amplifier in the circuit. At the preamplifier on the sensor, the DC is kept decoupled from the RF output of the amp by using two inductors.

Figure 26:
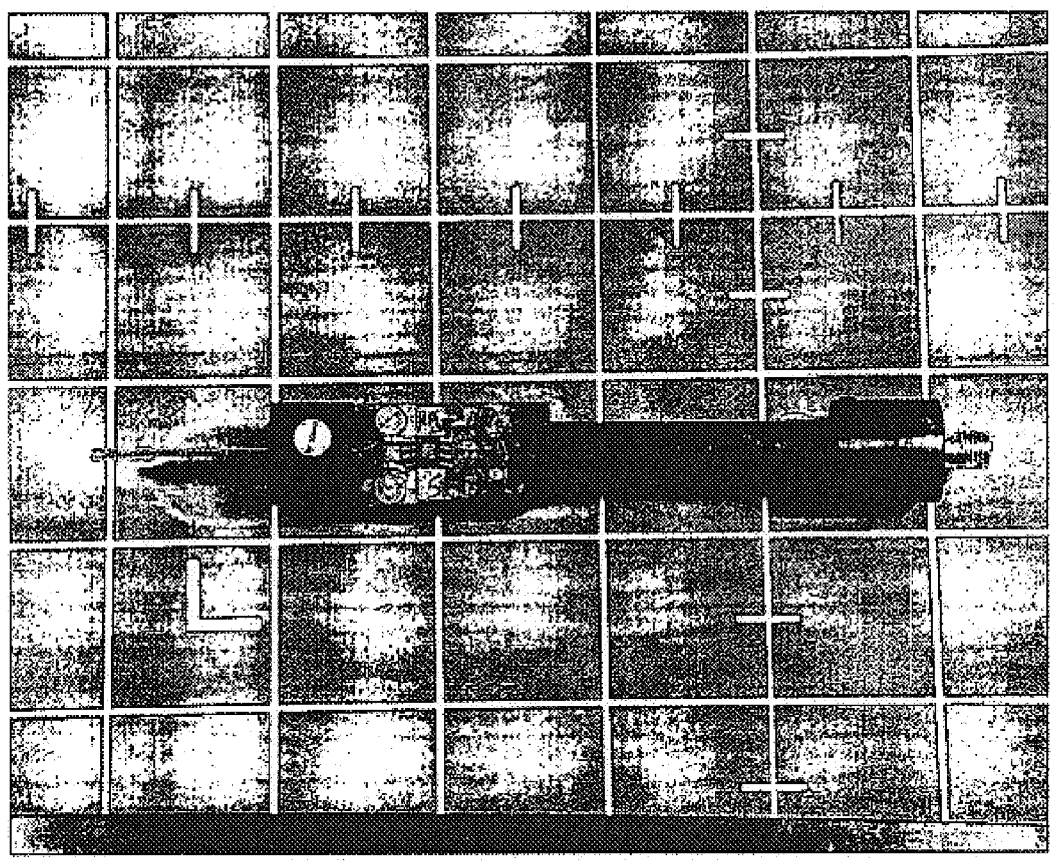
FIG. 26 shows a photograph of an active sensor constructed according to one embodiment of the invention.
Figure 27:
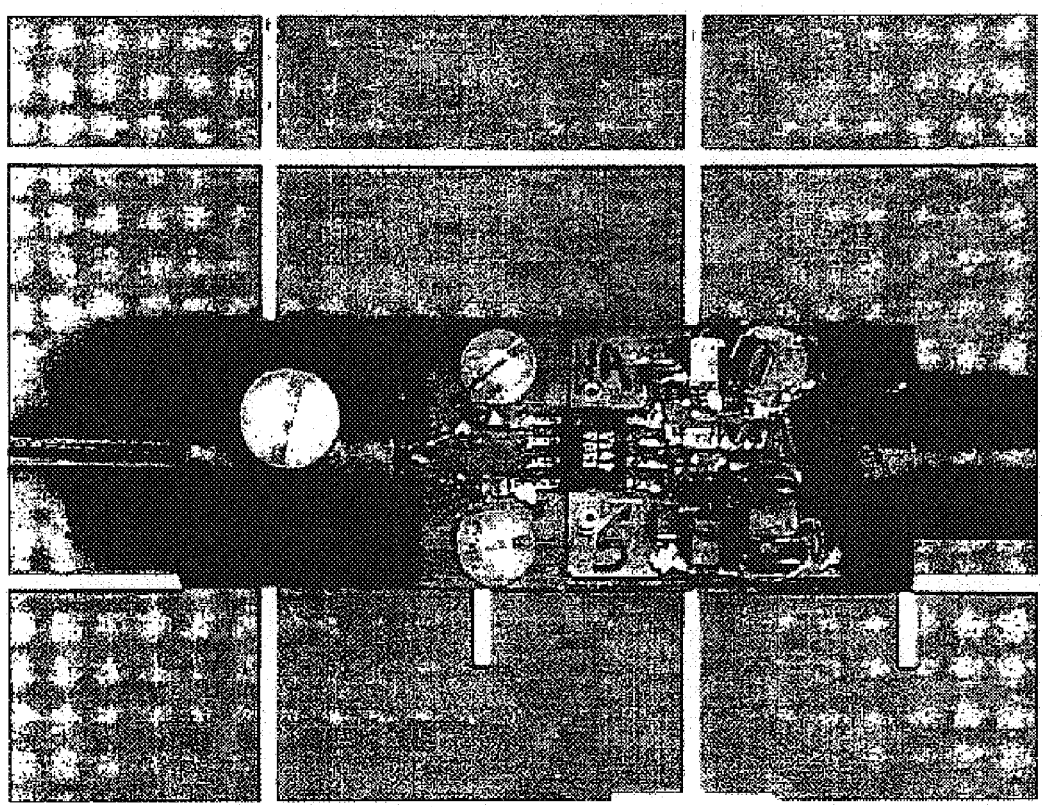
FIG. 27 shows a close-up photograph of the sensor shown in FIG. 26.
Figure 28:
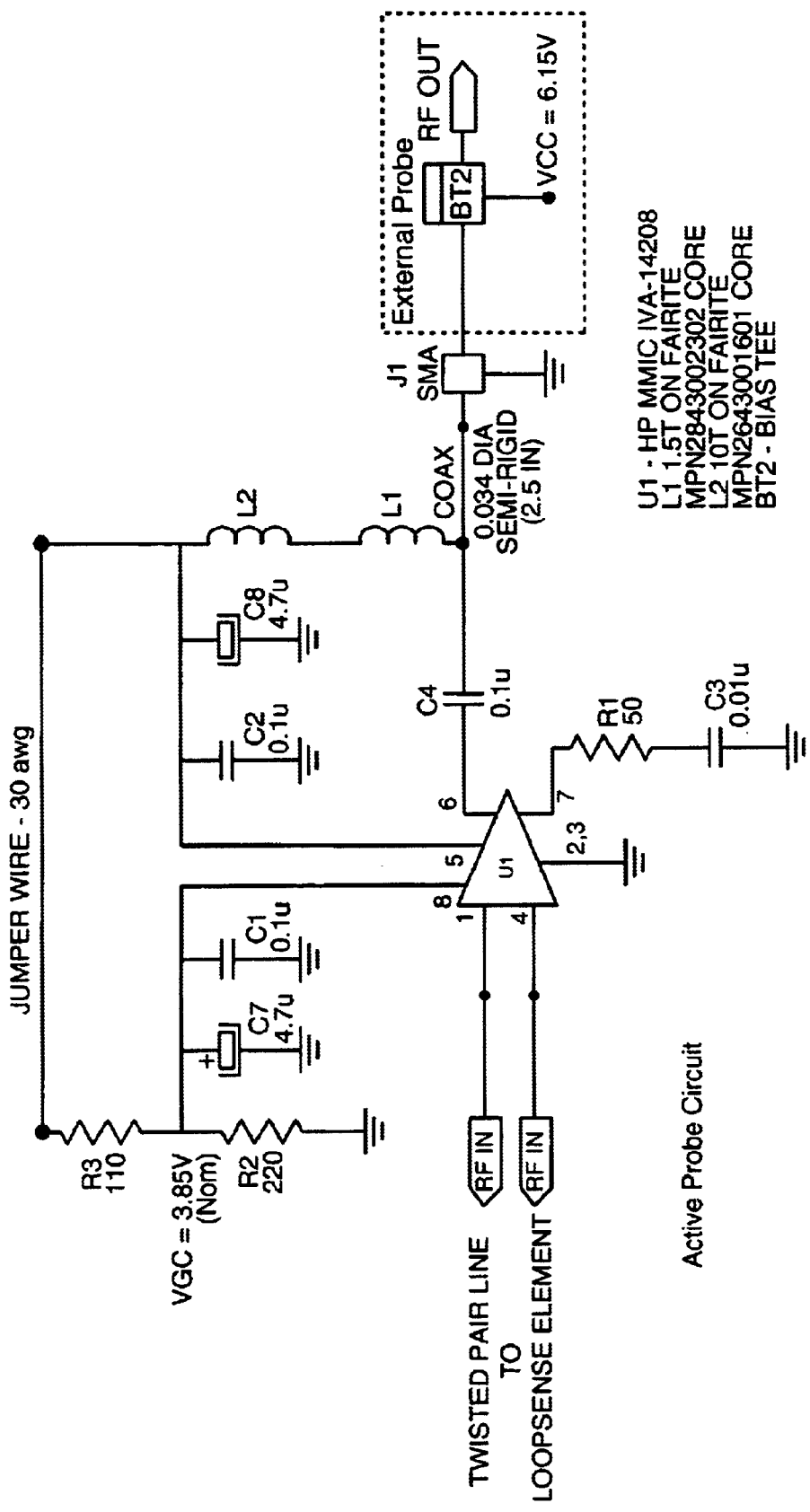
FIG. 28 shows a schematic diagram for the sensor shown in FIG. 26.

The loop is connected to the amplifier via a twisted-pair transmission line. Both the sensor loop and the twisted-pair line are inherently balanced. The signal picked up by the sensor is then applied differentially to the preamp input. The combination of the twisted-pair line and a differential amplifier configuration offers excellent noise immunity. FIGS. 26 and 27 show photographs of an active sensor constructed according to one embodiment of the invention, and FIG. 28 shows a schematic diagram for a circuit of such a sensor.

Figure 29:
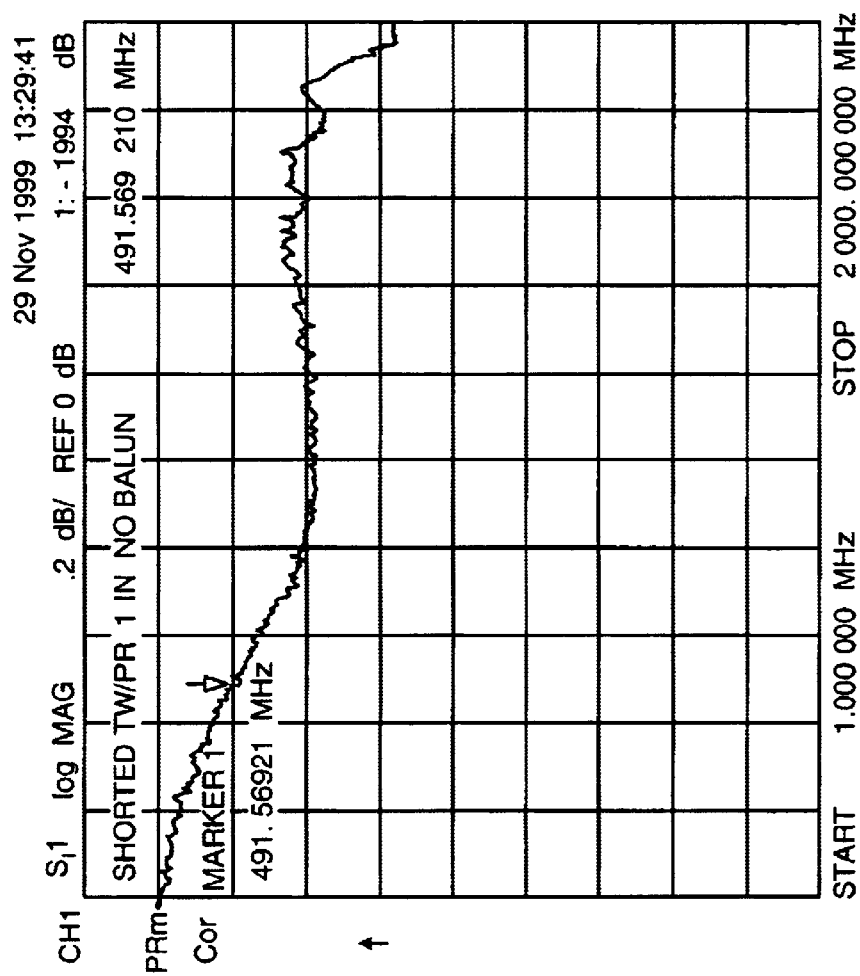
FIG. 29 shows a graph of S11 for a shorted twisted-pair line.

The probe output voltage may be characterized by the application of Faraday's law:

$$V = B\omega A \cos\theta, \qquad (5)$$

where V denotes induced voltage at the loop's terminals, B denotes magnetic flux density, $\omega$ denotes the frequency of the field, A denotes loop area, and $\theta$ denotes the angle that the loop plane makes with the applied field. FIG. 29 shows a plot of the return loss (S11) of a shorted twisted-pair line.

In order to obtain high-resolution measurements, it may be desirable to decrease the loop area. Ideally, an ability to determine a field's characteristics at any point in space may be desired. In practice, however, loop response decreases with loop area, and the use of external high-gain, low-noise amplifiers may become necessary.

A passive loop sensor may be fabricated using semi-rigid coaxial cable or may be etched on FR4 material. Effective diameter sizes for use at the system level (e.g. for testing of stretch boards or cellular phones) may range from 2 to 10 mm.

A more complete picture of the H field, direction and intensity may be obtained through the use of a vector field sensor. Such measurements may be accomplished by rotating an active sensor (e.g. using a miniature stepper motor assembly mounted on the scanner arm). In this setup, maximum field intensity at each scan position, and the angle at which it occurs, is recorded.

For this configuration, DC power to the sensor and RF output of the sensor may share the same path through a 50-ohm rotary joint. The sensed signal is amplified and sent to the spectrum analyzer, which is used as a tuned receiver with an envelope detector. The analyzer's analog output is connected to an A/D converter board, such that all further processing may be done in software. Rotation and data acquisition operations may be synchronized by applying the stepper motor indexer pulses to the A/D converter scan clock.

Figure 30:
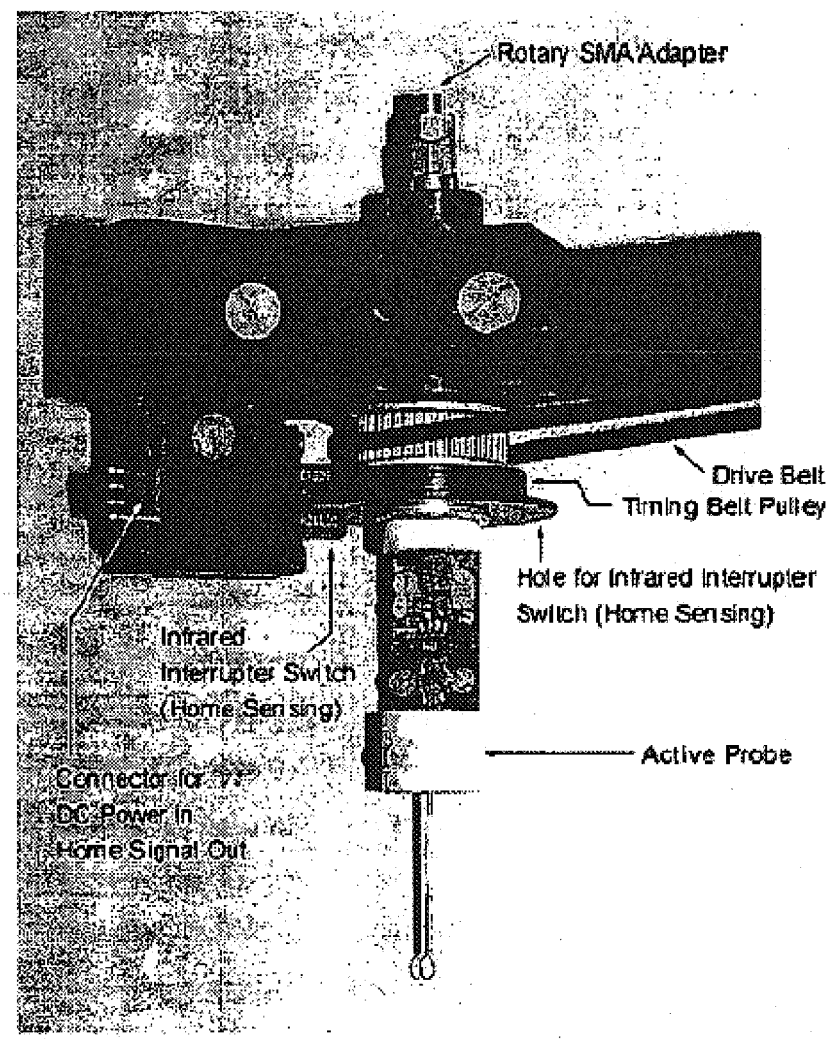
FIG. 30 shows a photograph for a rotating sensor and rotation mechanism constructed according to embodiments of the invention.
Figure 31:
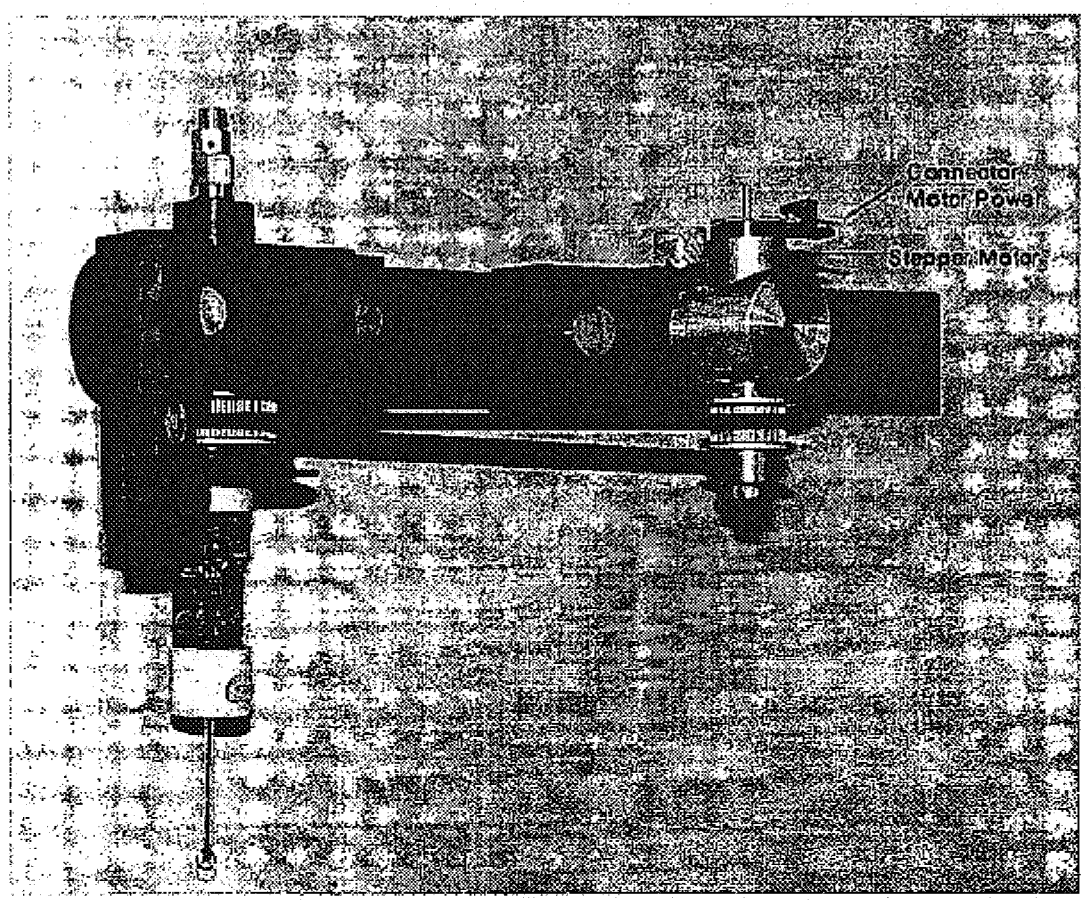
FIG. 31 shows a photograph of a rotating sensor and stepper motor rotating mechanism constructed according to embodiments of the invention.
Figure 32:
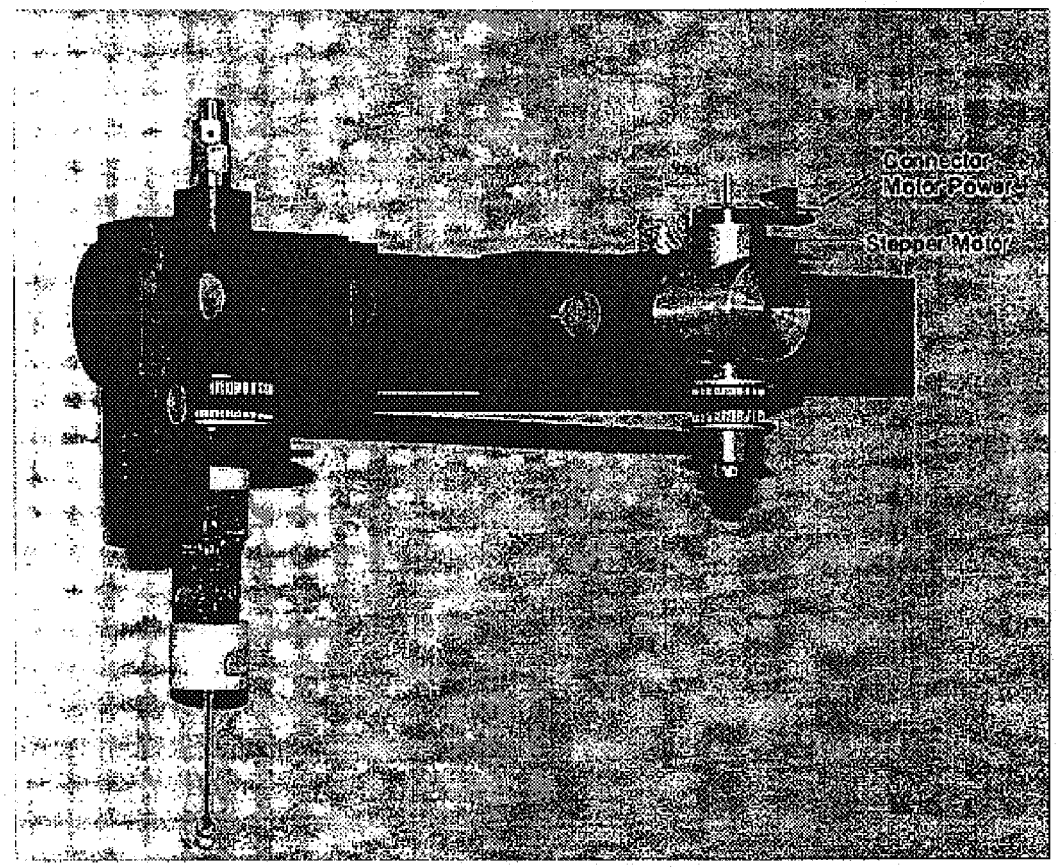
FIG. 32 shows a photograph indicating a positioning laser on a rotating mechanism constructed according to one embodiment of the invention.
Figure 33:
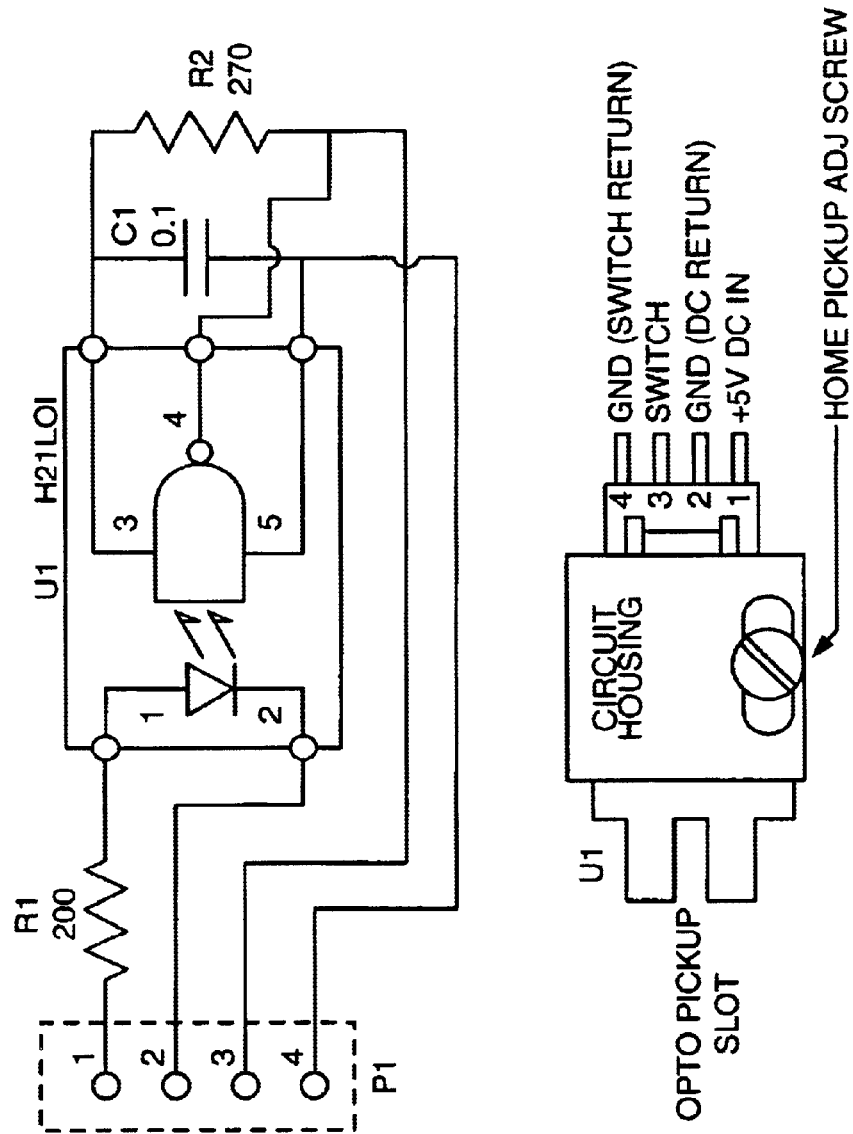
FIG. 33 shows a schematic diagram of a home position switch of a rotating mechanism constructed according to one embodiment of the invention.
Figure 34:
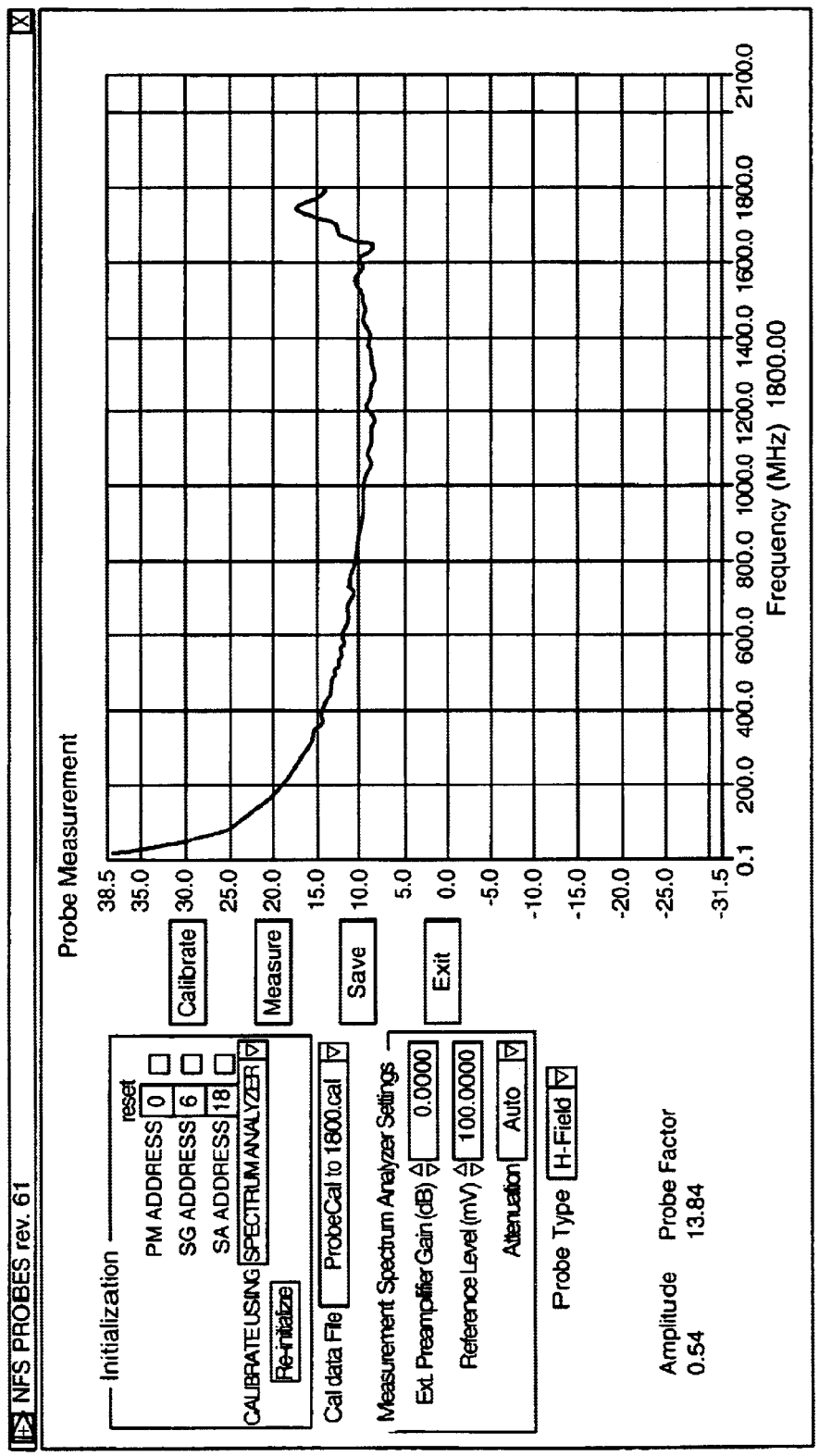
FIG. 34 shows a screen display of calibration results obtained using an active sensor constructed according to one embodiment of the invention and a TEM cell.
Figure 35:
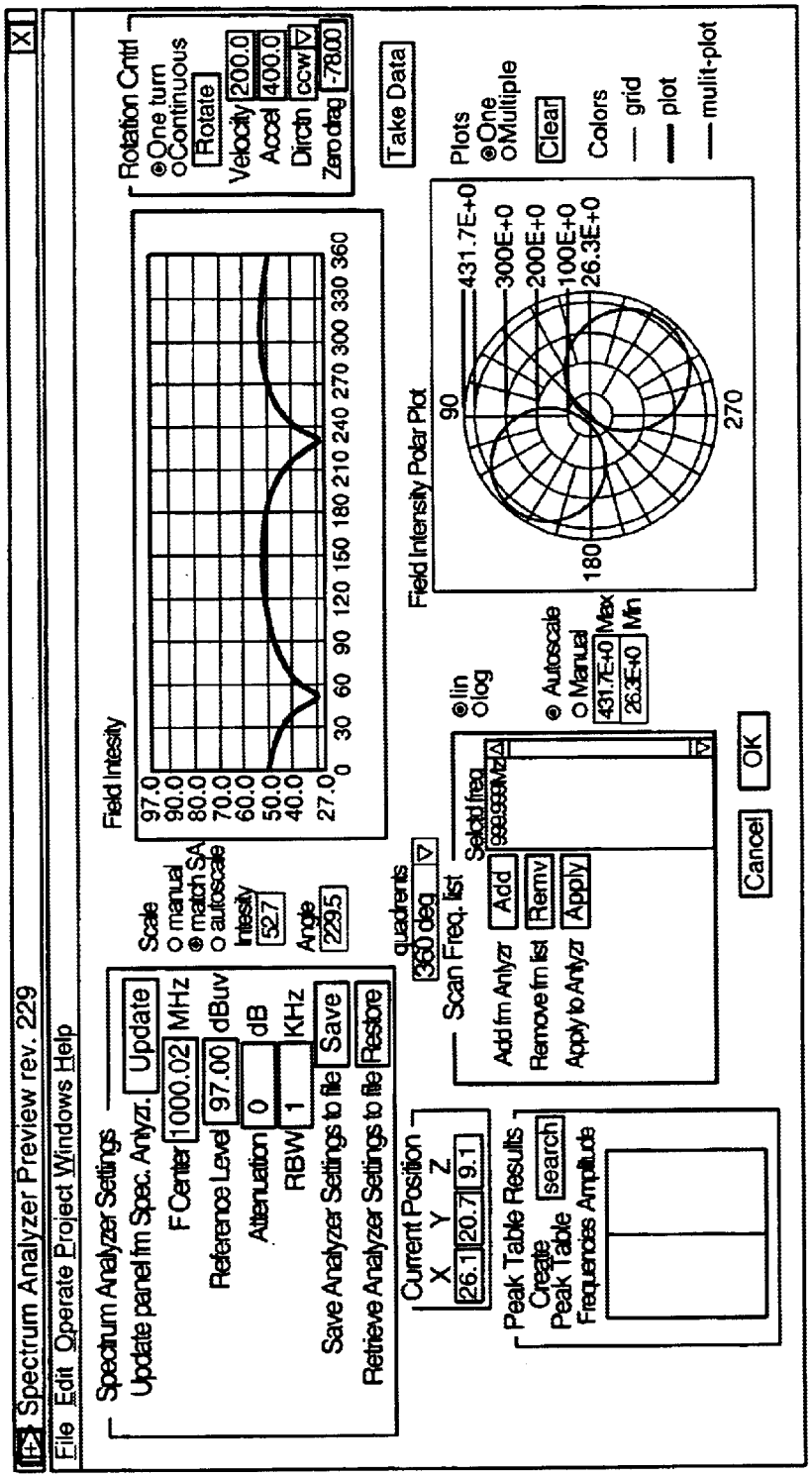
FIG. 35 shows a screen display of results obtained using a rotating sensor constructed according to one embodiment of the invention.

To establish a reference sensor position, an optointerrupter switch mounted on the arm transmits a position of a pinhole drilled on a sensor pulley to the A/D converter board. A typical sensor rotation velocity for this embodiment is 3 revolutions per second. FIGS. 30 and 31 show elements of the sensor and rotation mechanism, FIG. 32 shows a positioning laser that may be used in establishing a reference relation between the sensor and the DUT, and FIG. 33 shows a schematic circuit diagram for one embodiment of an optointerrupter switch assembly. FIG. 34 shows a screen display of calibration results for an active sensor as obtained using a method according to an embodiment of the invention and a TEM cell, and FIG. 35 shows a screen display of results obtained using a rotating sensor.

Figure 36:
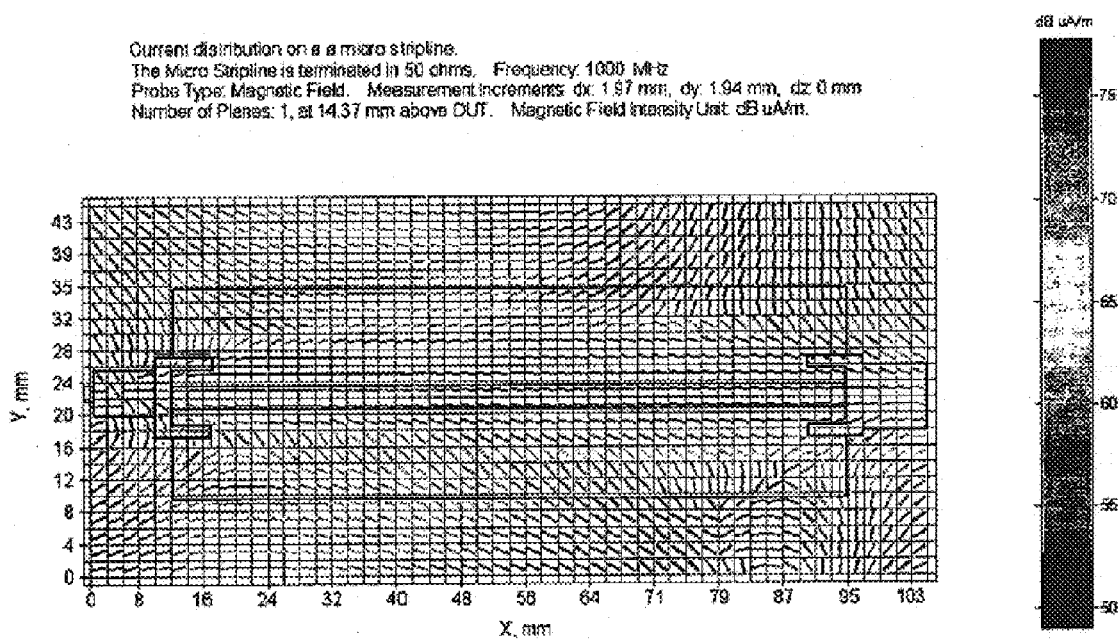
FIG. 36 shows a presentation of information collected using a rotating sensor constructed according to one embodiment of the invention.

An output as displayed using a method according to an embodiment of the invention may depict a magnetic field vector or the current that gives rise to such a vector. For example, a vector whose magnitude is coded according to a color chart may be used to represent each scan position (pixel). FIG. 36 shows an example of a display of an emissions profile obtained for a microstrip line terminated in its characteristic impedance.

Figure 37:
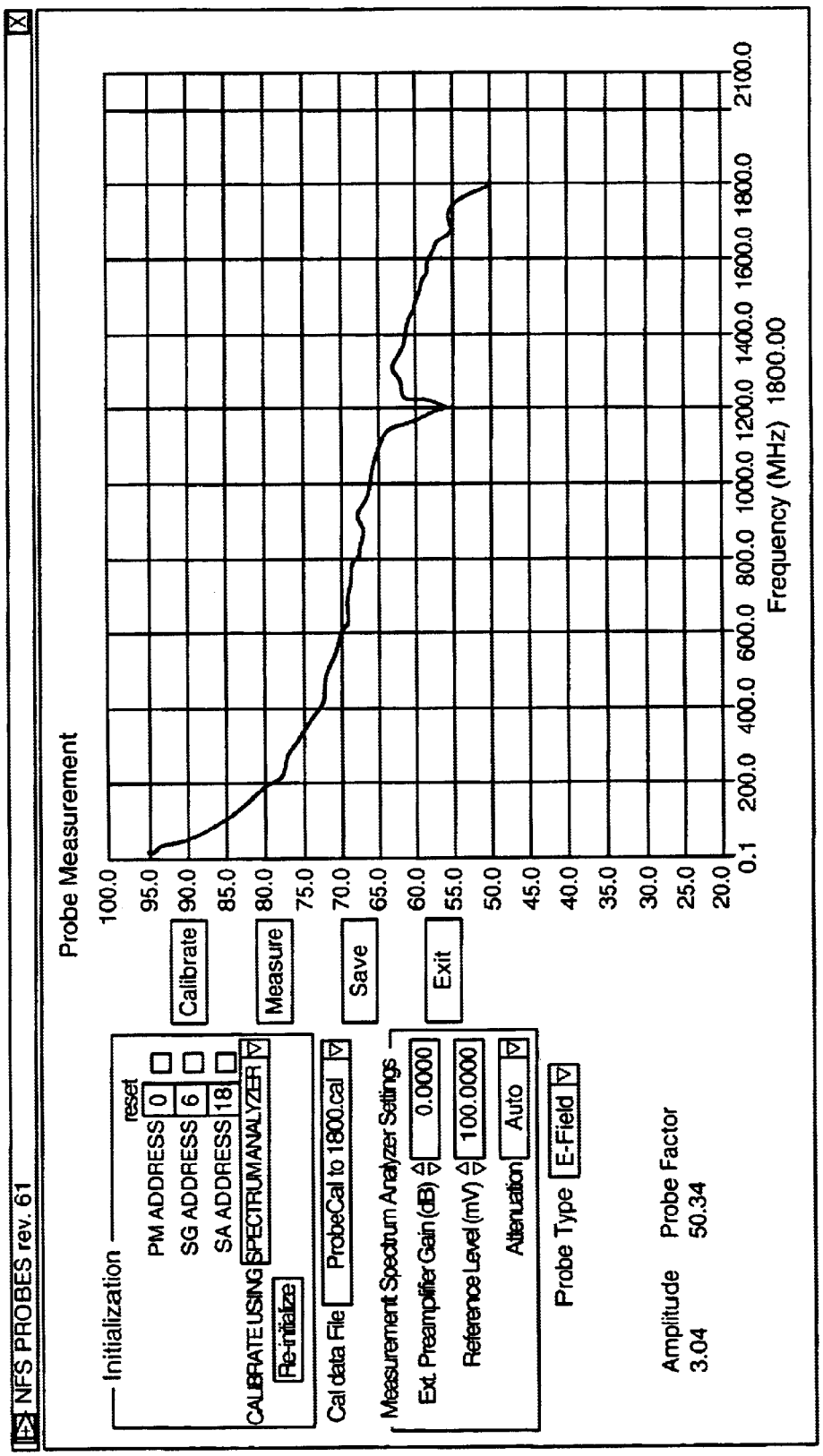
FIG. 37 shows a screen display of calibration results obtained using an E field stub sensor constructed according to one embodiment of the invention.

In its simplest form, an electric field sensor may be a small piece of wire protruding above a ground plane as a monopole antenna. In a time-varying electric field E, the voltage produced at the output of the sensor is V=L×E, where L is the effective length of the monopole, i.e. one half of the physical length. FIG. 37 shows a screen display of calibration results for an E field sensor as obtained using a method according to an embodiment of the invention.

The following discussion of the development of the transfer function for a ball sensor assumes that the probe is placed in a homogenous medium and is exposed to an electromagnetic field of known polarization and electric field intensity. This discussion also assumes that the probe is electrically small (i.e. that its size is much smaller than the wavelength of the measured electromagnetic field). The specific probe under consideration is a 2 mm ball probe, and a coaxial cable to which the probe is connected is assumed to be match-terminated.

Figure 38:
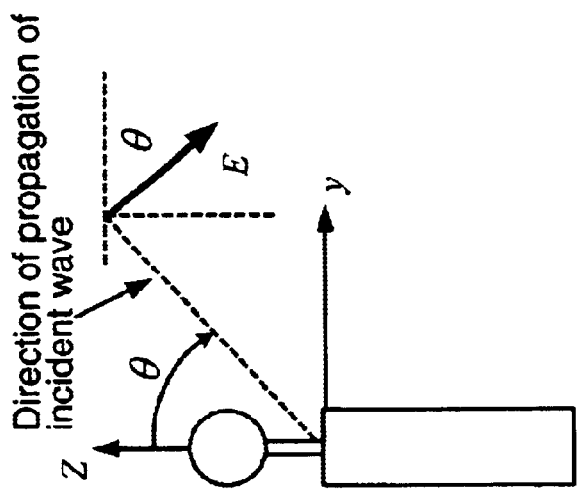
FIG. 38 demonstrates a definition of plane of incidence for a 2 mm ball sensor constructed according to one embodiment of the invention.

Under these assumptions, a probe transfer function may be defined as follows:

$$H(\theta) = \frac{\text{Magnitude of the induced voltage in the coaxial cable (mV)}}{\text{Magnitude of incident electric field (V/m)}}, \quad (6)$$

where θ is the angle of the direction of propagation of the incident electromagnetic field with respect to the axis of the coaxial cable, as illustrated in FIG. 38.

In FIG. 38, the electric field shown is for the case of parallel polarization. The case of perpendicular polarization is the case where the electric field has only the x component (i.e. perpendicular to the plane of incidence).

It is noted that FIG. 38 depicts the so-called parallel polarization case where, with the yz defined as the reference plane of the incident electromagnetic field, the electric field vector is parallel to the plane of incidence. It is a well-known fact in electromagnetic field theory that any incident field can be decomposed into two parts, a transverse magnetic part (having only the x component of the magnetic field and y, z components of the electric field), and a transverse electric part (having only the x component of the electric field and y, z components of the magnetic field). The transverse magnetic part constitutes the parallel polarization case depicted in FIG. 38. The transverse electric part is referred to as perpendicularly polarized, since its electric field vector is perpendicular to the defined plane of incidence. For a complete characterization of the receiving properties of the probe, transfer functions should be defined for both components of the field.

The transfer function (6) is derived through a series of simulations where the probe is excited by an incident electromagnetic field represented by a plane wave with the appropriate polarization (parallel or perpendicular) and with the direction of propagation of the incident field as a parameter. It is noted that, under the assumption that the wavelength is much larger than the dimensions of the probe, the received voltage will be controlled primarily by the electric dipole moments of the ball (which are proportional to the volume of the ball). More specifically, the probe tip functions as a capacitive load. The induced current on the probe is proportional to the time derivative of the electric field. Thus, assuming a match-terminated coaxial cable, the received voltage is also proportional to the time derivative of the electric field.

Figure 39:
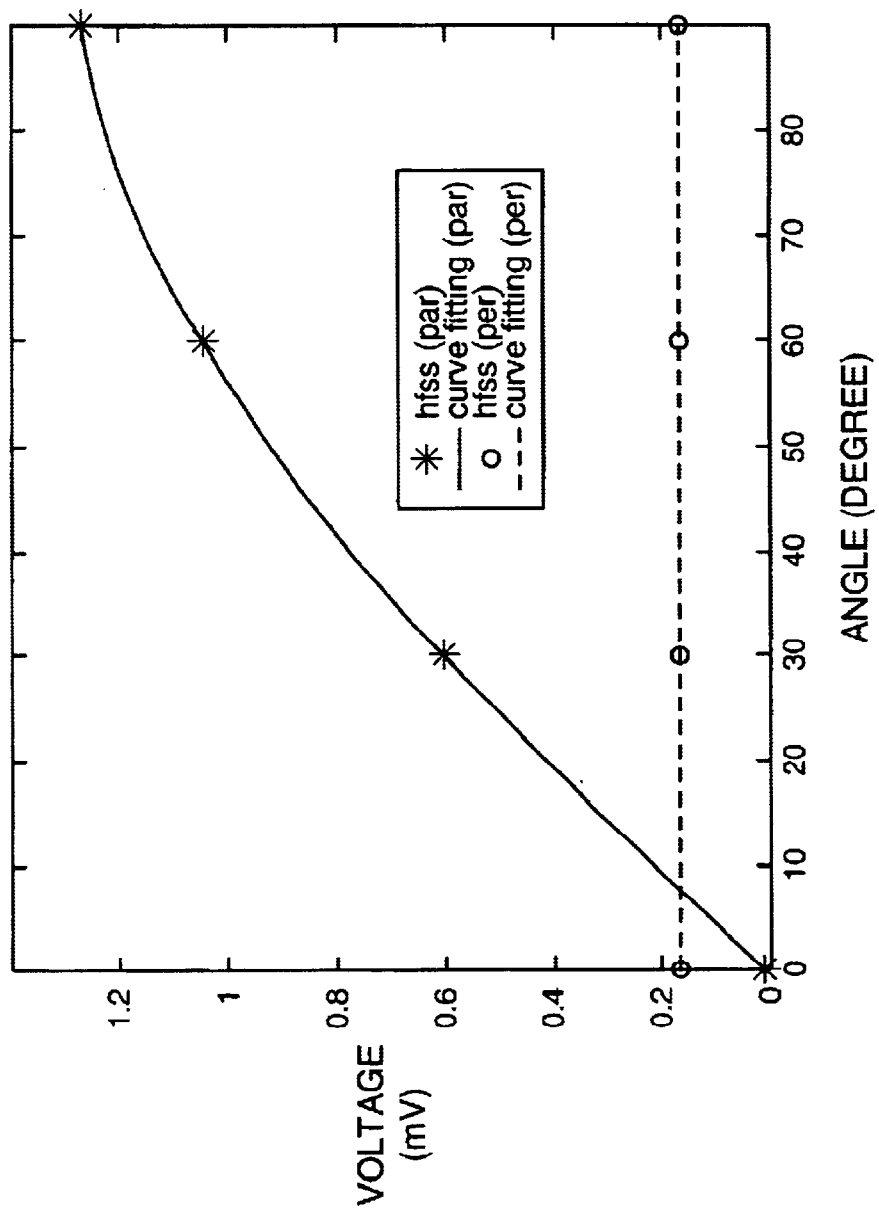
FIG. 39 shows plots of the transfer functions for a 2 mm ball sensor constructed according to one embodiment of the invention for the case of parallel and perpendicular polarizations.

Using results from simulations, the following expressions were obtained for the transfer function (6), for the case of parallel and perpendicular polarization:

$$H_{par}(\theta)=0.0158+0.1556\theta+1.0072 \sin \theta,$$

$$H_{perp}(\theta)=0.1634+0.0162\theta-0.0204 \sin \theta, \quad (7, 8)$$

where the angle θ0 is in radians. FIG. 39 provides a pictorial description of expressions (7) and (8). These equations lead to the following observations:

Perpendicular Polarization. The transfer function is for all practical purposes independent of the angle of incidence of the field. This fact is easily correlated with the fact that the electric field is always transverse to the axis of the coaxial cable. Thus, the magnitude of the electric field interacting with the probe is independent of the angle of incidence.

Parallel Polarization. The transfer function exhibits a strong dependence on the angle of incidence of the electromagnetic field. The transfer function attains its maximum value when the electric field is parallel to the axis of the probe.

An Operating System According to a Particular Embodiment of the Invention

FIGS. 40–69 show aspects of an operating system according to a particular embodiment of the invention. This discussion relates to a particular embodiment of the invention and does not limit the more general description of other embodiments as presented herein.

Figure 40:
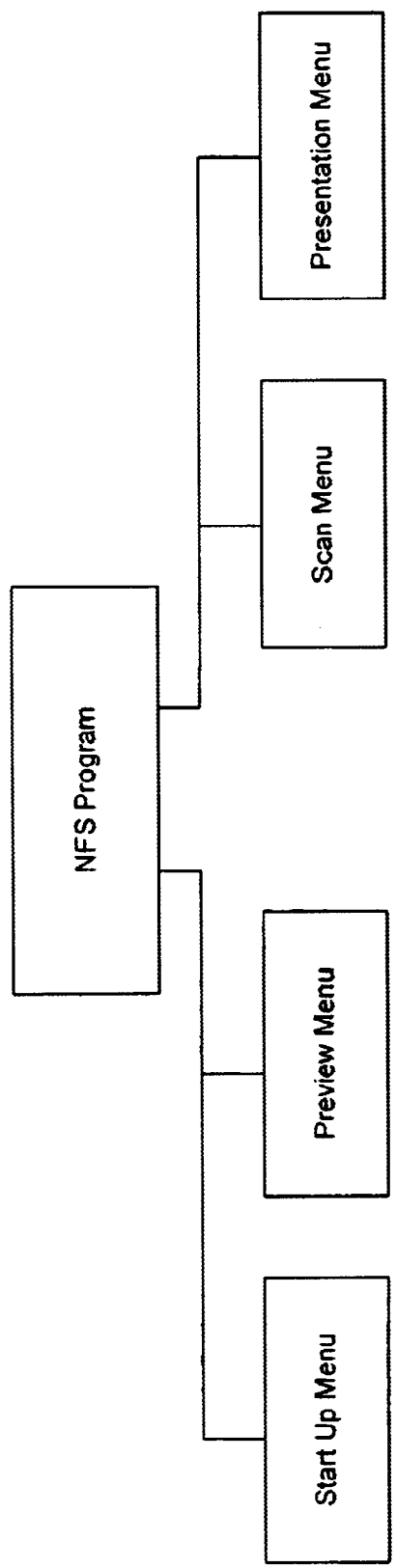
FIG. 40 shows an overview of an operating system according to a particular embodiment of the invention.
Figure 41:
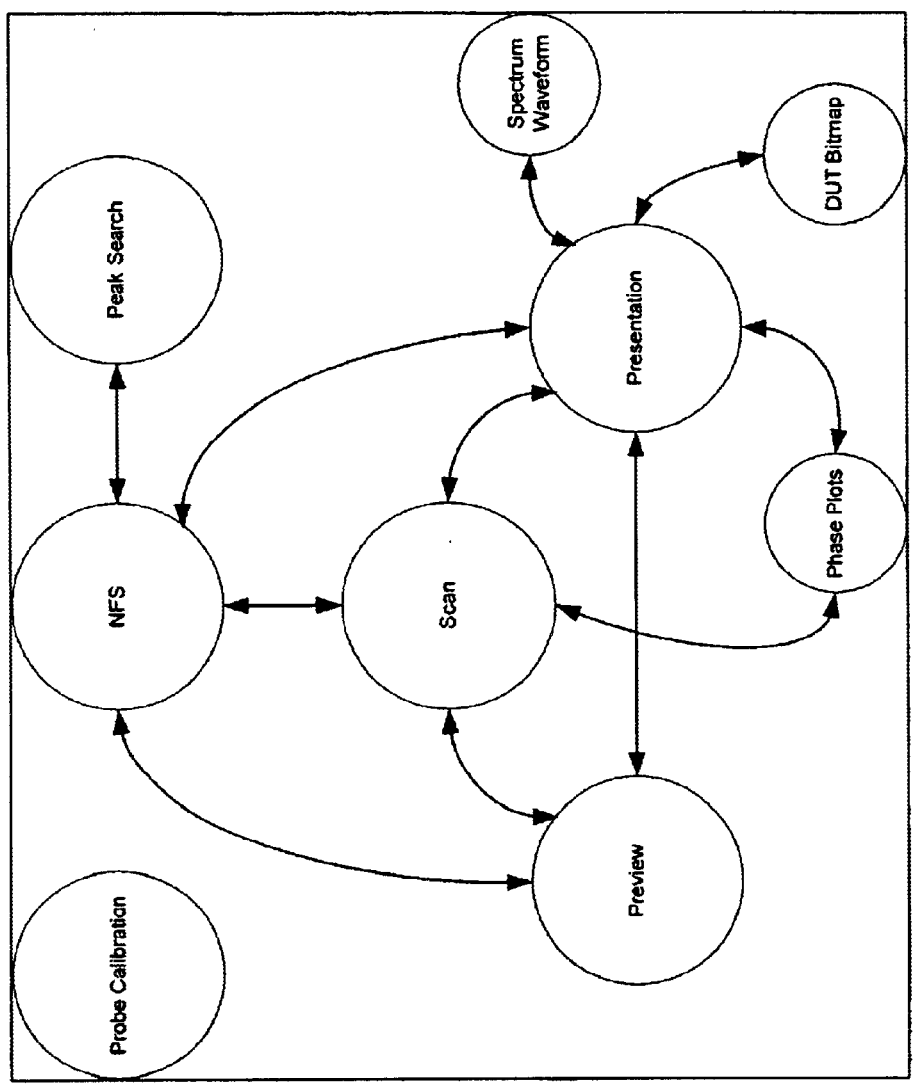
FIG. 41 shows a state diagram of programs and engines in an operating system according to a particular embodiment of the invention.
Figure 42:
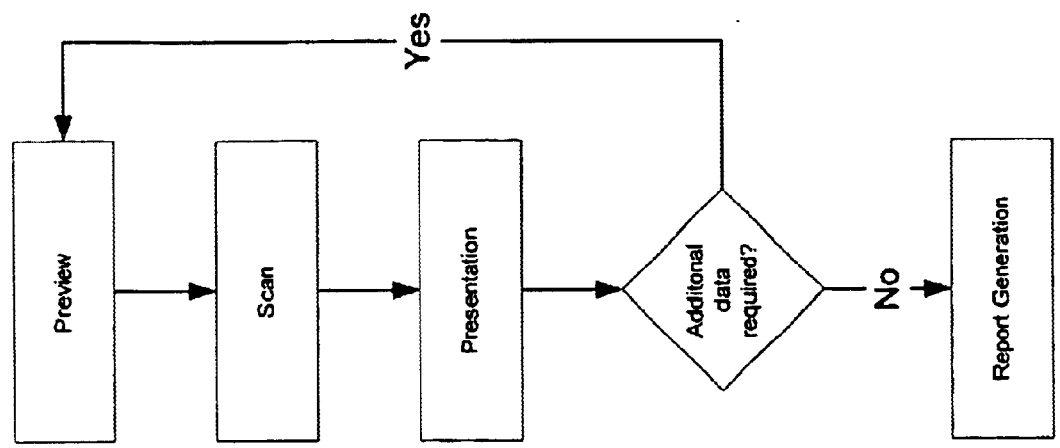
FIG. 42 shows a flowchart of a process of an operating system according to a particular embodiment of the invention.
Figure 43:
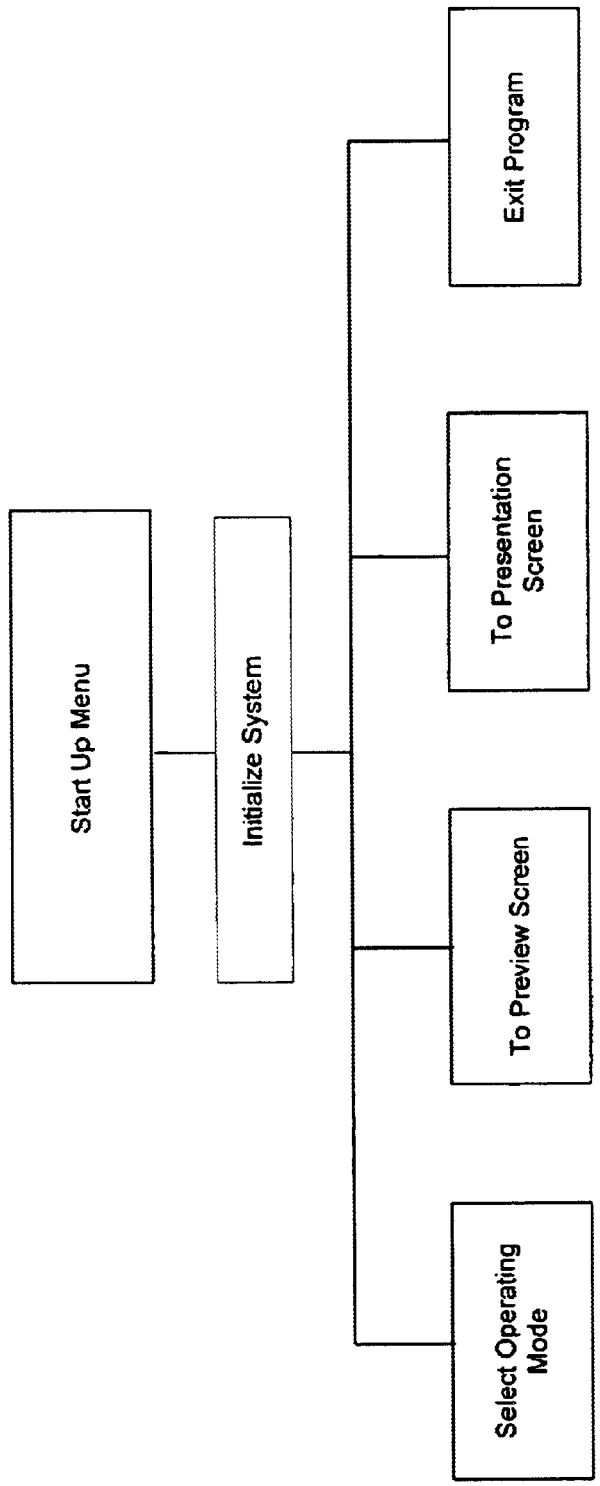
FIG. 43 shows a block diagram of a start up menu of an operating system according to a particular embodiment of the invention.
Figure 44:
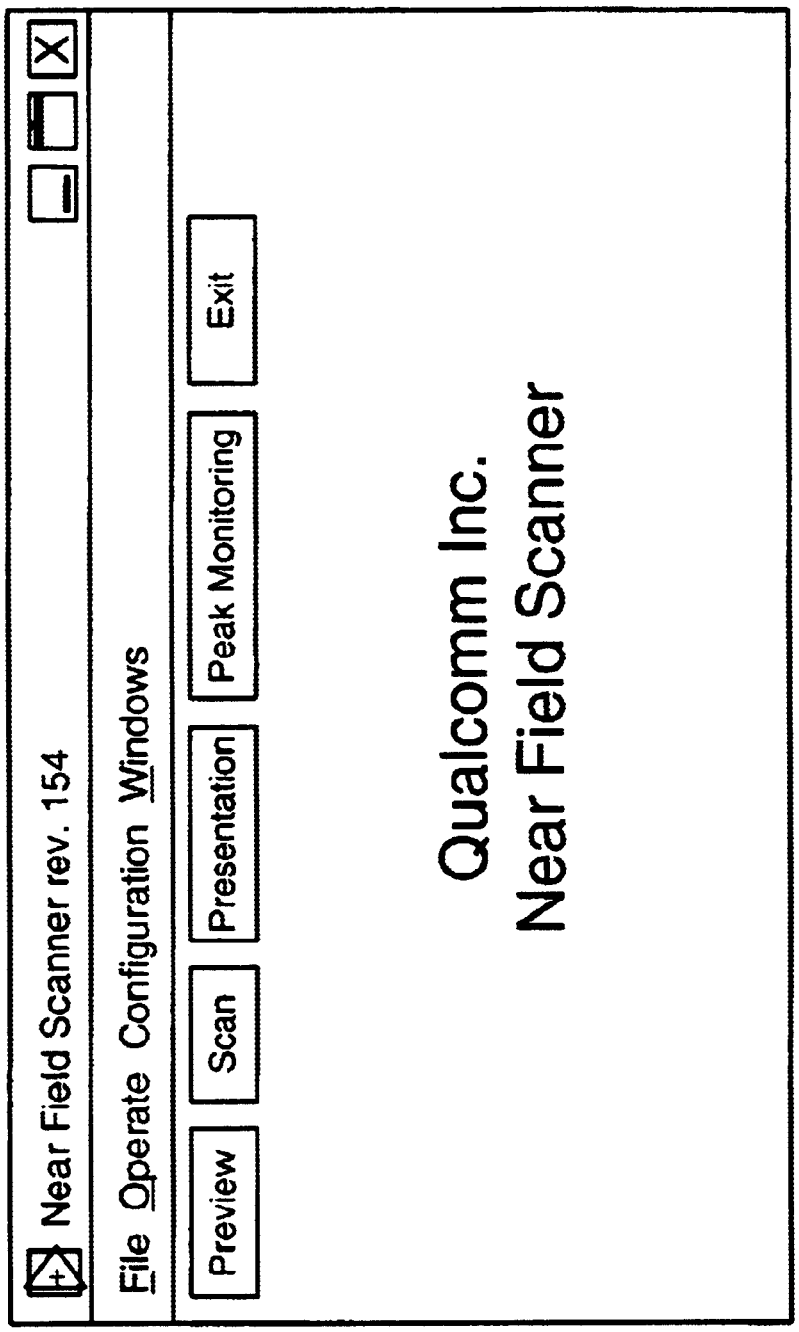
FIG. 44 shows an entry screen of an operating system according to a particular embodiment of the invention.

FIG. 40 shows an overview of the operating system. FIG. 43 shows a structure of a startup menu. Operating modes that may be selected include:

electromagnetic sensor, time-varying output;

field sensor, DC output (e.g., IR or Hall effect sensors);

analog output, measurement at a single point;

sensor calibration;

peak monitoring;

and time domain measurements.

A new test may be selected at a preview screen, or an existing file may be recalled for analysis or review at a presentation screen.

Figure 45:
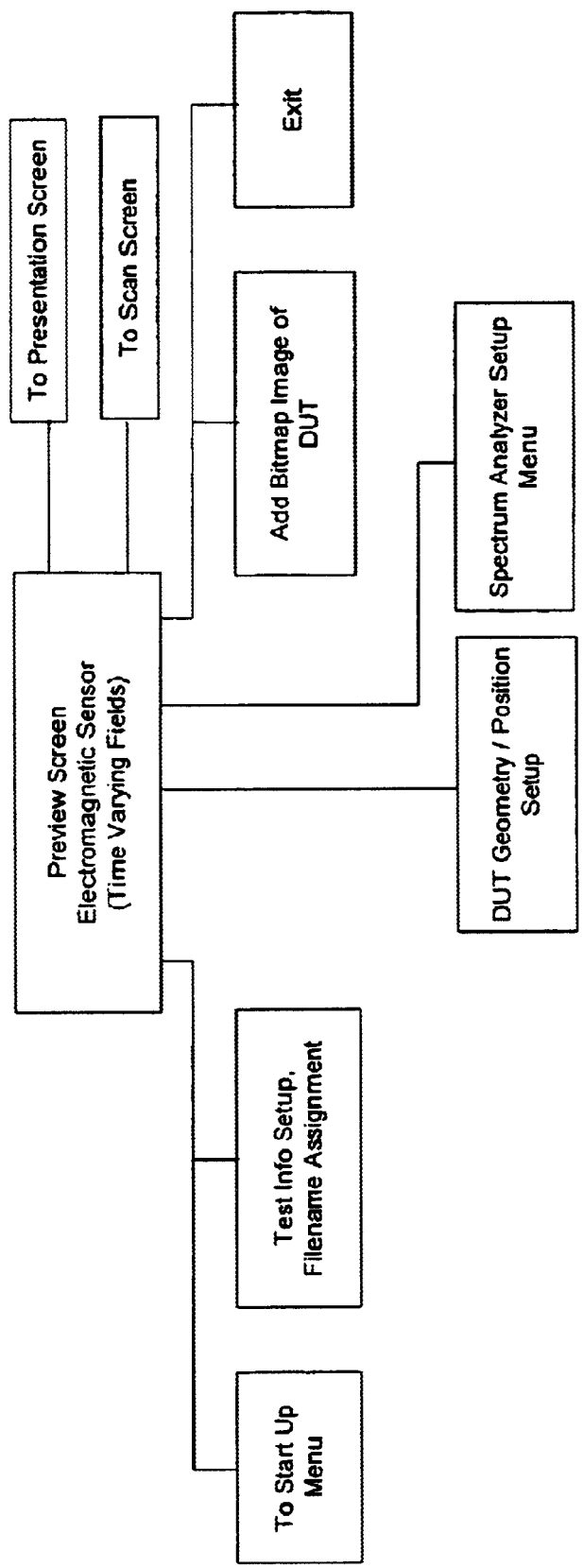
FIG. 45 shows a block diagram of a preview screen of an operating system according to a particular embodiment of the invention.
Figure 46:
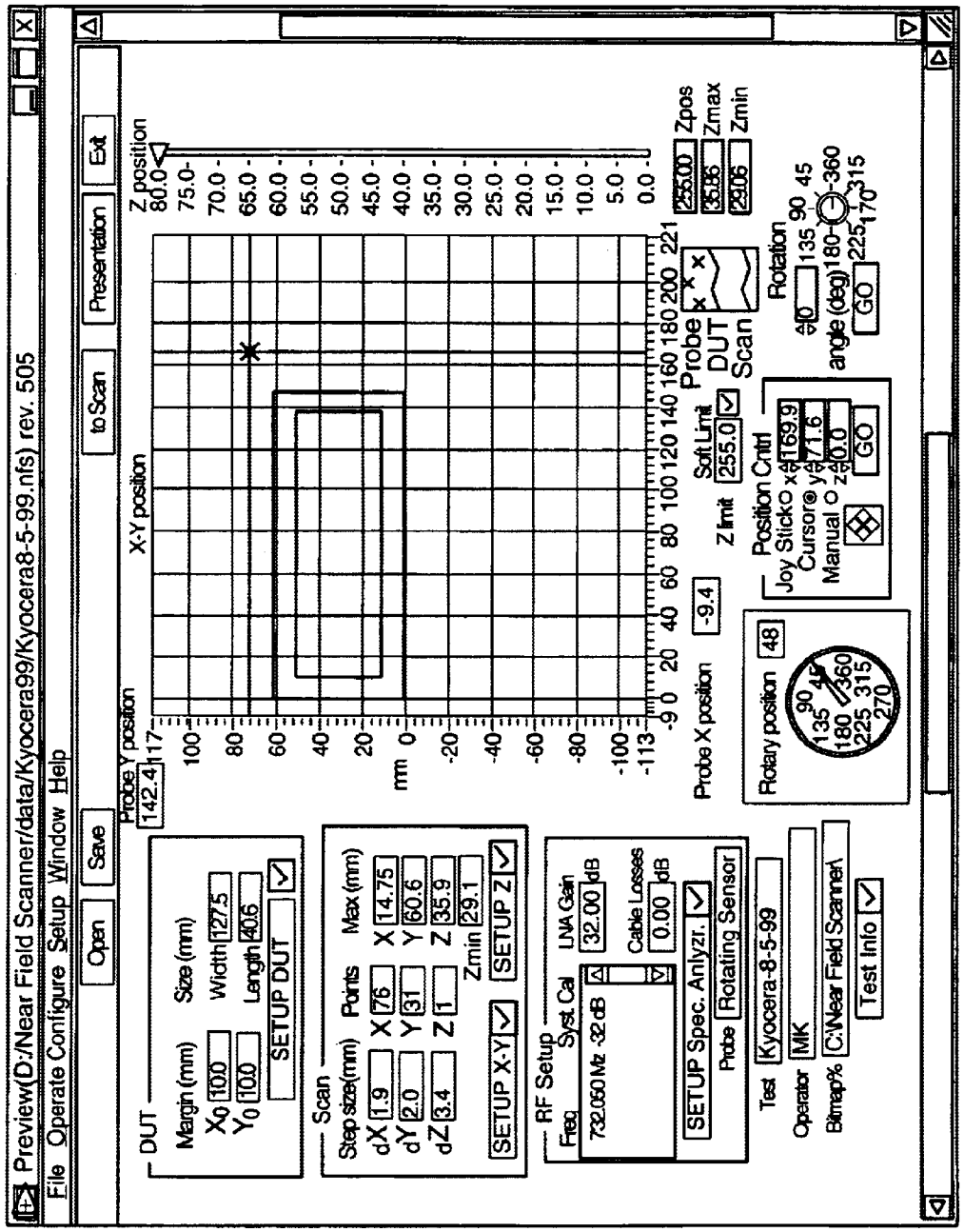
FIG. 46 shows a preview screen of an operating system according to a particular embodiment of the invention.

FIG. 45 shows a structure of a preview screen for an electromagnetic sensor for time-varying fields. At a test information setup/filename assignment screen, the following functions may be performed:

sensor selection (i.e. fixed or rotating, active or passive), assign sensor transfer function;

assign filename;

enter gain or loss for amplifier, filter, and/or cable;

enter test information.

At a DUT geometry/position setup screen, the following functions may be performed:

X, Y, Z range;

X, Y, Z increments;

number of planes above DUT;

location with respect to test table.

This setup may be done by using a laser crossbeam and/or by using machine vision for alignment.

At a spectrum analyzer setup menu screen, the following functions may be performed:

select spectrum analyzer model;

manual control/setup of spectrum analyzer for frequencies to be monitored;

set parameters such as resolution bandwidth, sweep time, video bandwidth, span, peak excursion, averaging, units, reference level;

select frequencies;

save corresponding waveform;

Under a source control submenu (i.e. for a signal source applied to the DUT), the following functions may be performed:

signal generator setup menu: frequency and/or amplitude;

pulse generator setup menu;

select model;

select test parameters.

Figure 47:
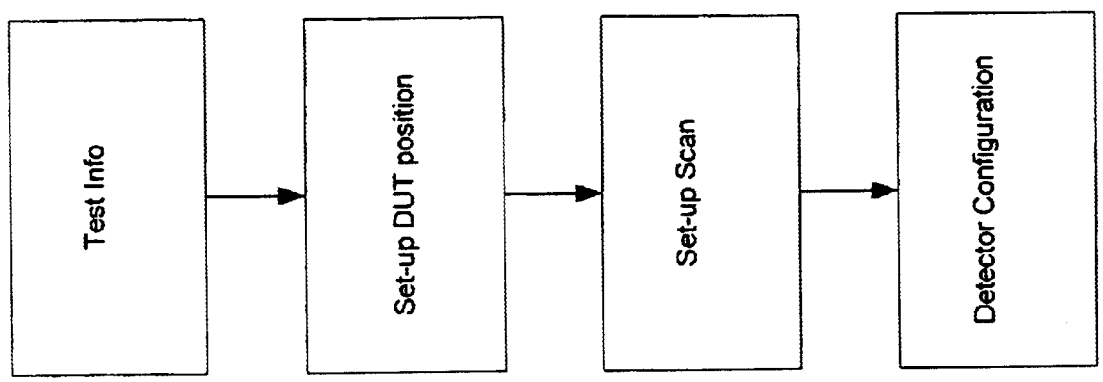
FIG. 47 shows a process flow of a preview stage of an operating system according to a particular embodiment of the invention.
Figure 48:
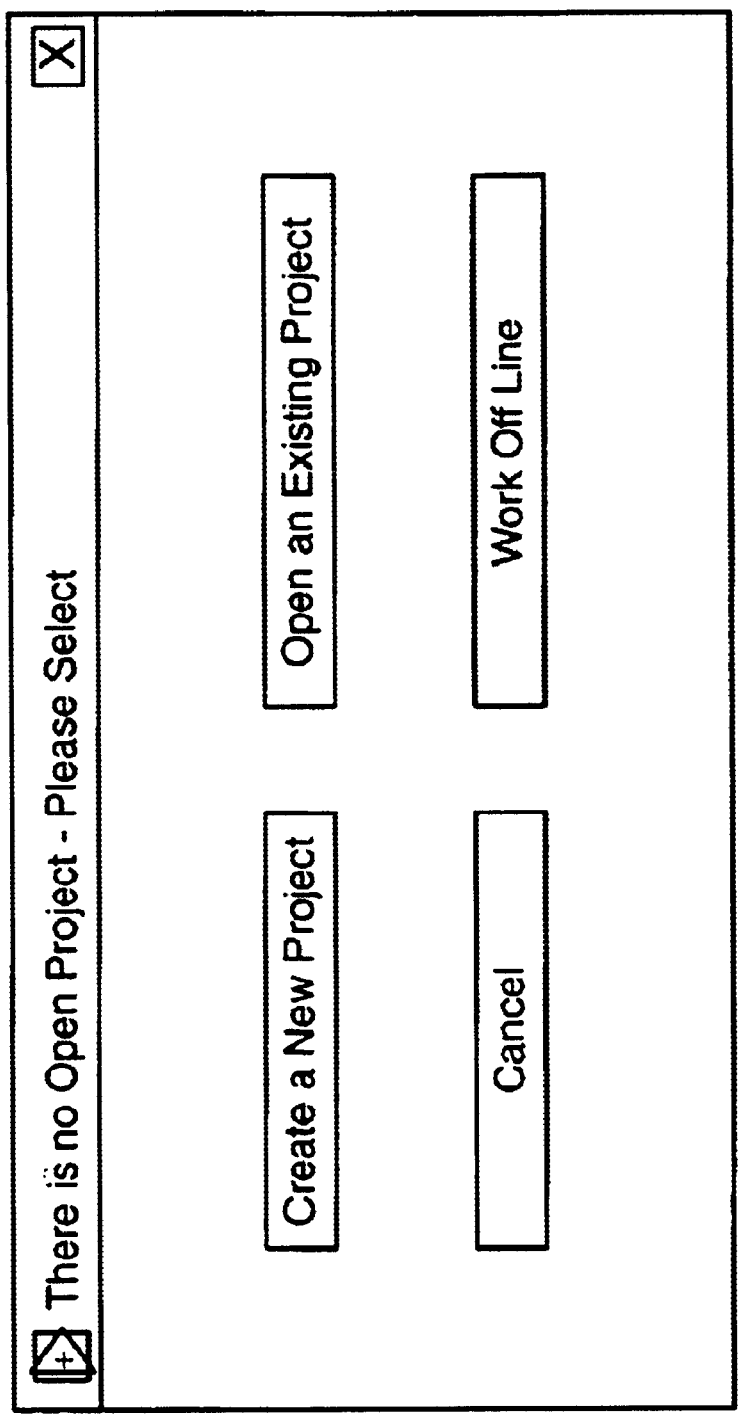
FIG. 48 shows a startup selection screen of an operating system according to a particular embodiment of the invention.
Figure 50:
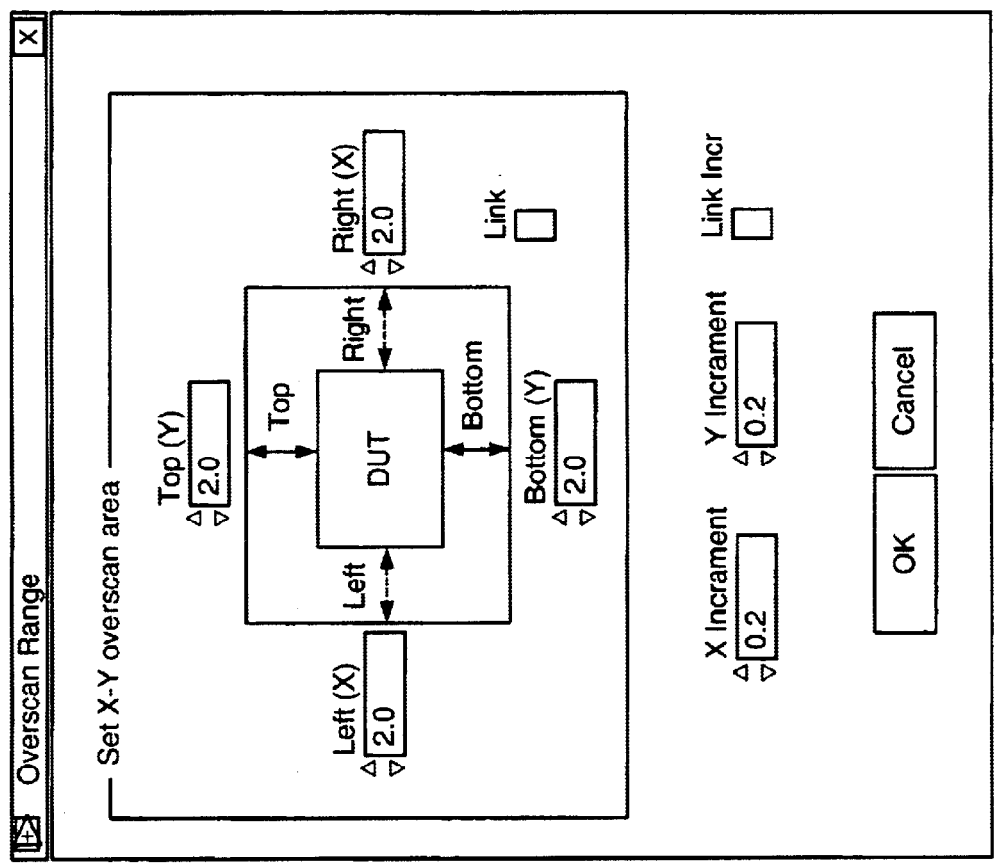
FIG. 50 shows a window displaying how a DUT scan area and increment for a particular test may be defined in a preview screen of an operating system according to a particular embodiment of the invention.
Figure 51:
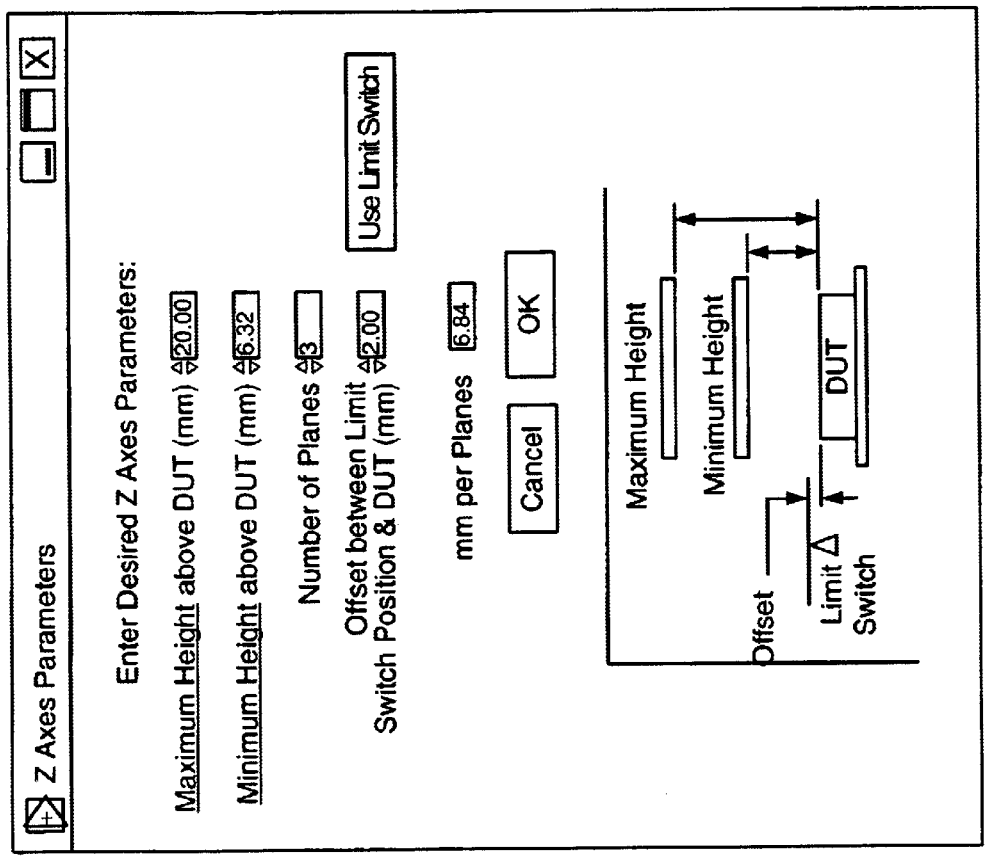
FIG. 51 shows a screen displaying a Z axes parameter selection dialog of an operating system according to a particular embodiment of the invention.
Figure 52:
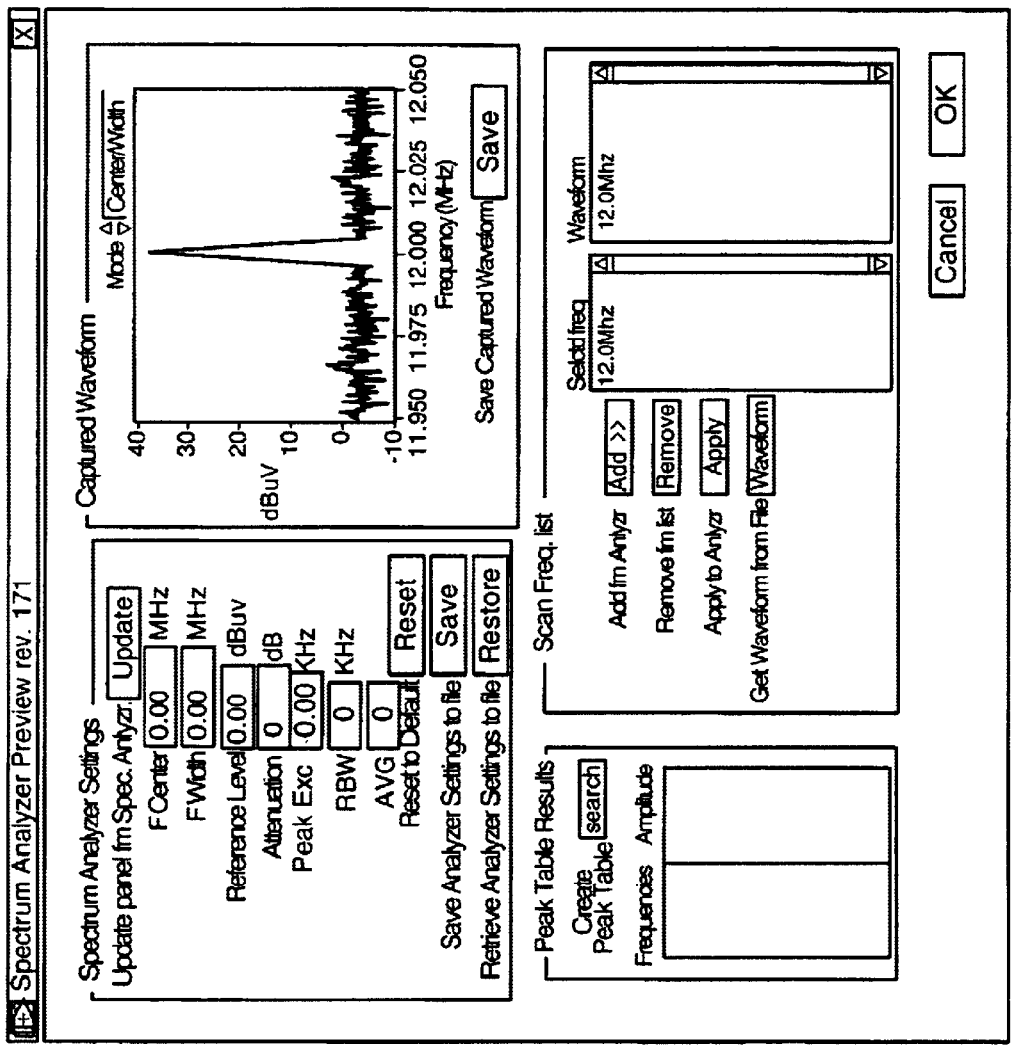
FIG. 52 shows a screen displaying a spectrum analyzer setup for a fixed sensor scanning operation of an operating system according to a particular embodiment of the invention.
Figure 53:
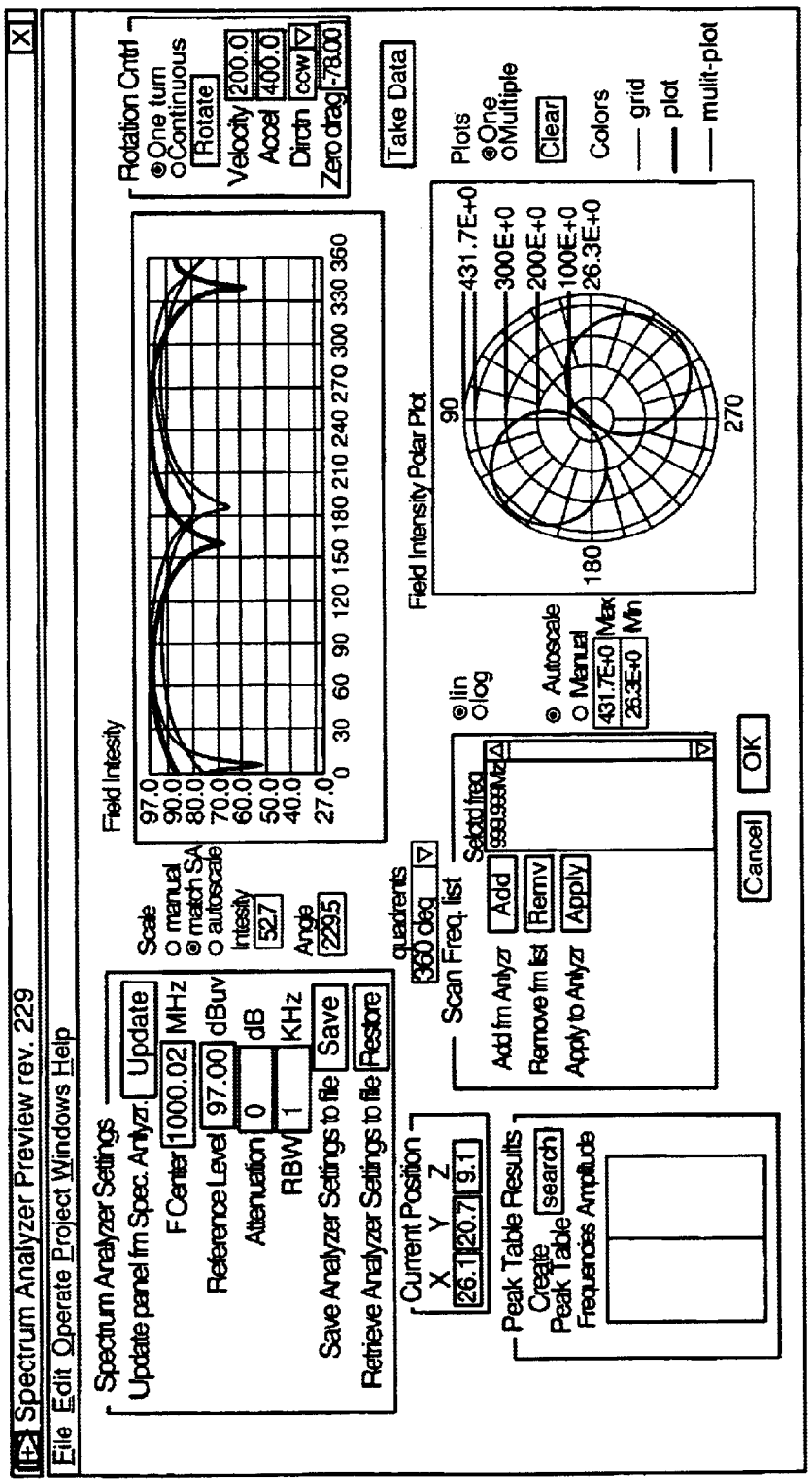
FIG. 53 shows a screen displaying a spectrum analyzer setup for a rotating sensor scanning operation of an operating system according to a particular embodiment of the invention.
Figure 54:
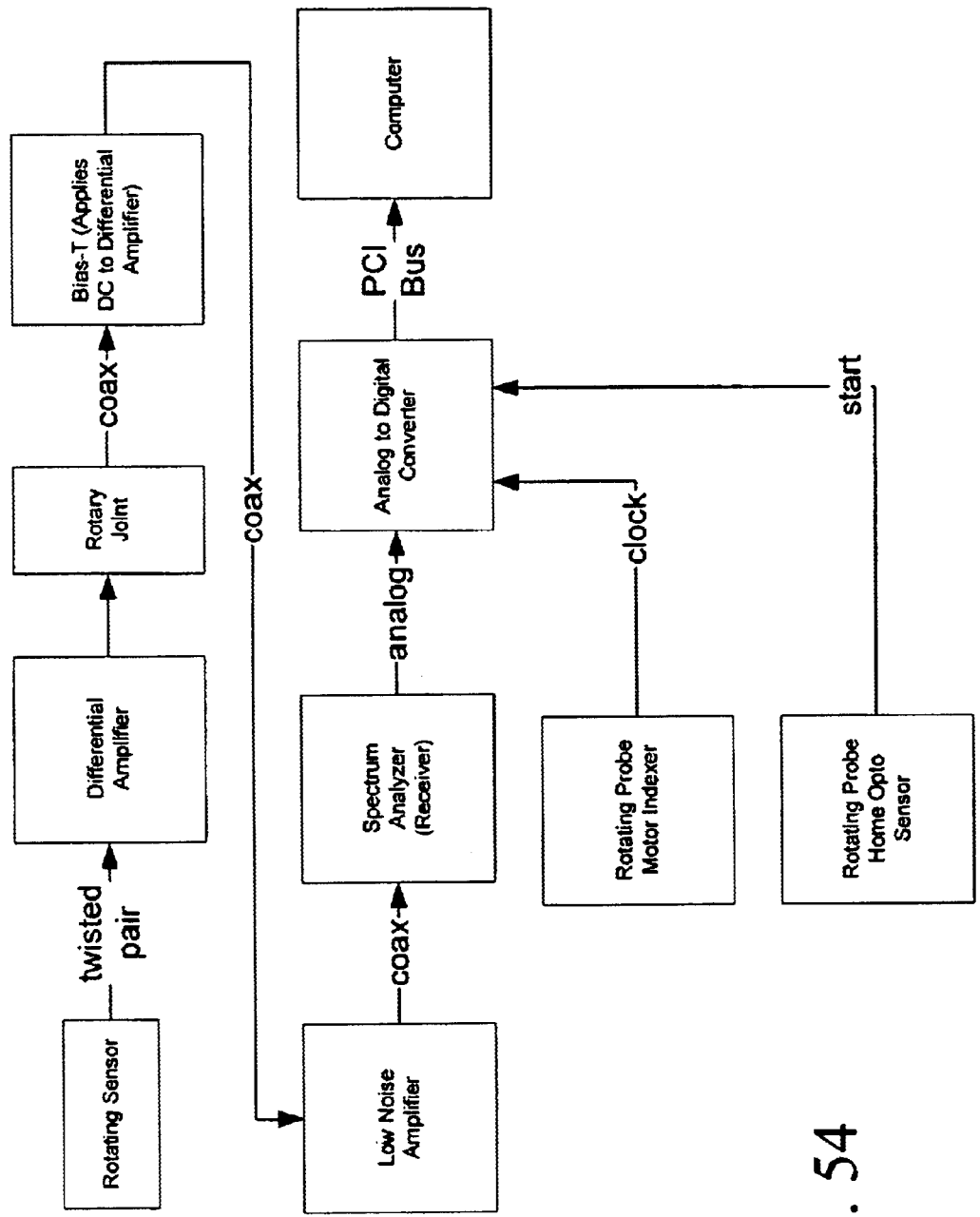
FIG. 54 shows an electrical block diagram of a rotating sensor scanning operation using an operating system according to a particular embodiment of the invention.

FIG. 47 shows a process flow of a preview stage. In a test information task, the following functions may be performed:

define sensor type;

edit sensor transfer function;

enter LNA gain & cable losses;

select bitmap file;

save setup.

In a set-up scan task, the following selections may be made:

X/Y axes area;

step size;

number of planes and position.

In a detector configuration task, the following functions may be performed:

monitor DUT;

capture waveforms;

find all peaks in a band;

define RF settings.

A preview screen for RF rotating sensor is similar to that for the fixed sensor. The main difference is in the spectrum analyzer setup menu. The spectrum analyzer operates in the zero-span mode, i.e., as a tuned receiver for the selected scan frequency. The spectrum analyzer detector output is read by an A/D converter, and variation of signal strength with rotation angle of the sensor is recorded.

A preview screen for the DUT on rotating platform mode is similar to the fixed sensor case, but with these changes. The sensor now follows a contour around the DUT as defined by user (e.g. equations describing the contour may be entered by the user). The DUT is placed on a rotary table and rotated by incremental angles as defined by the user. The sensor and alignment laser are now mounted parallel to the robot arm.

Figure 55:
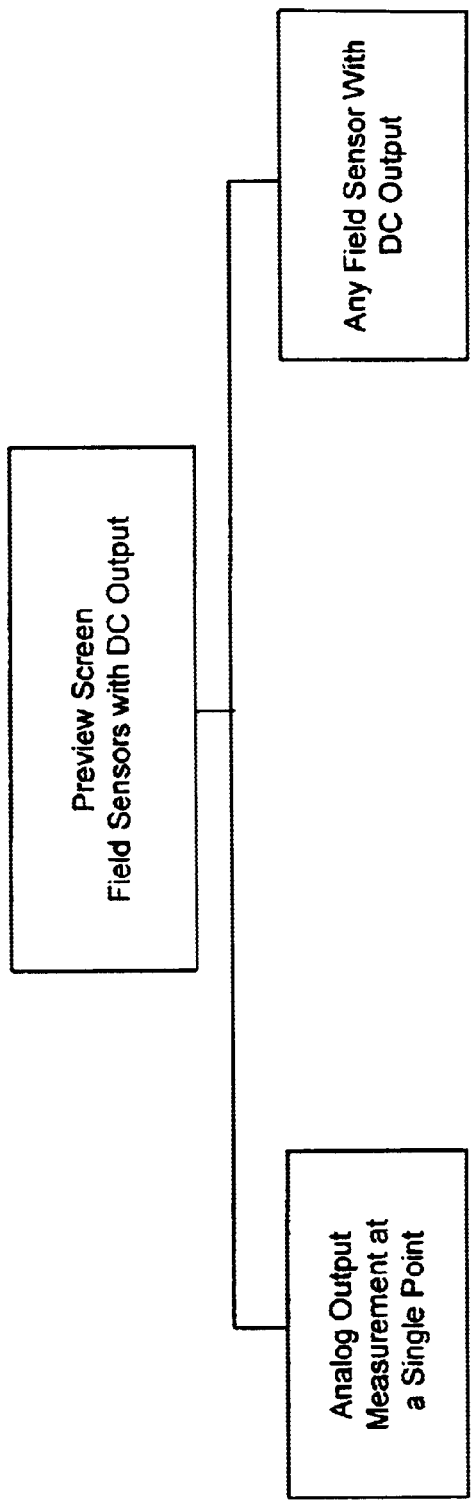
FIG. 55 shows a structure for a preview screen of an operating system according to a particular embodiment of the invention.
Figure 56:
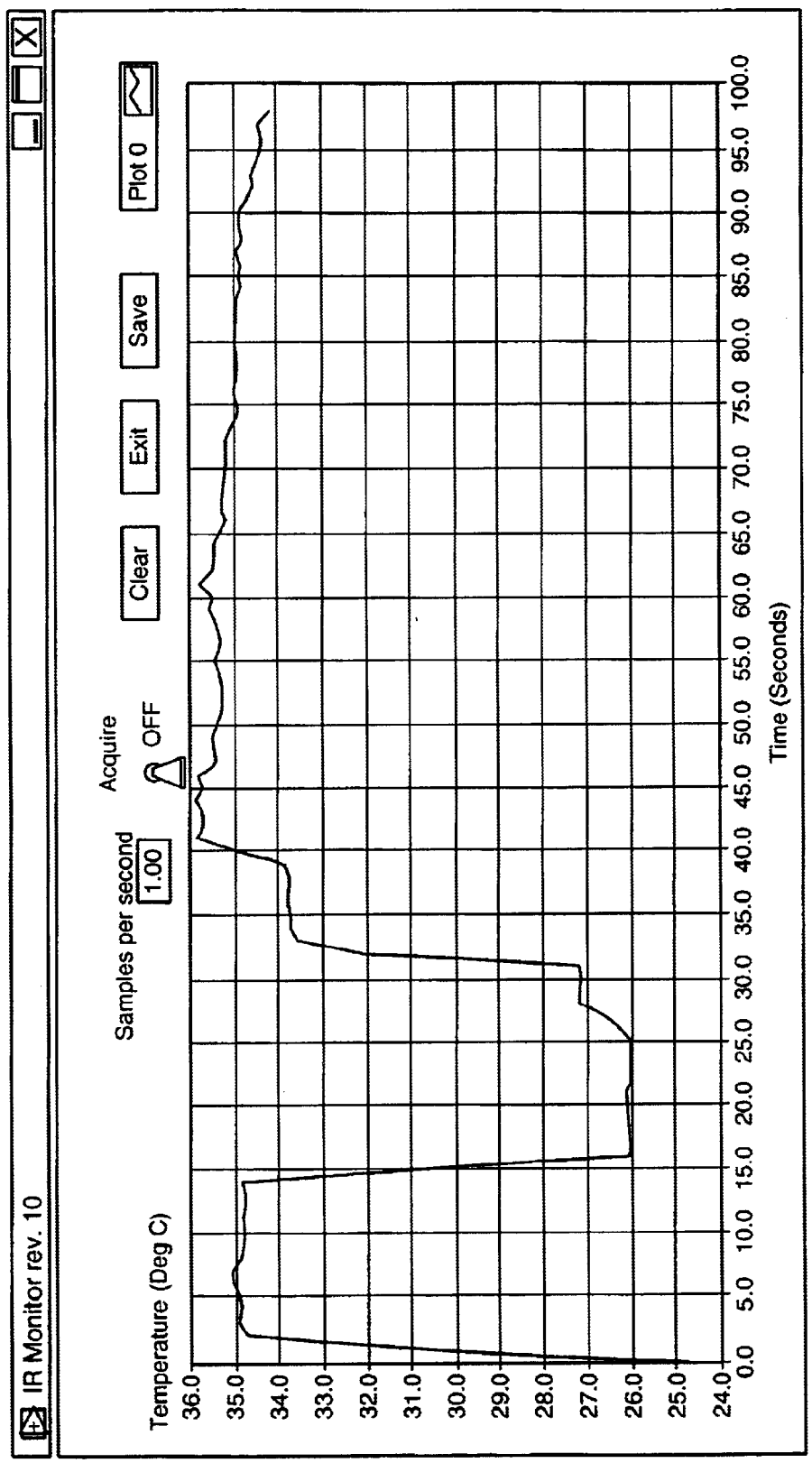
FIG. 56 shows an IR sensor setup screen of an operating system according to a particular embodiment of the invention.
Figure 57:
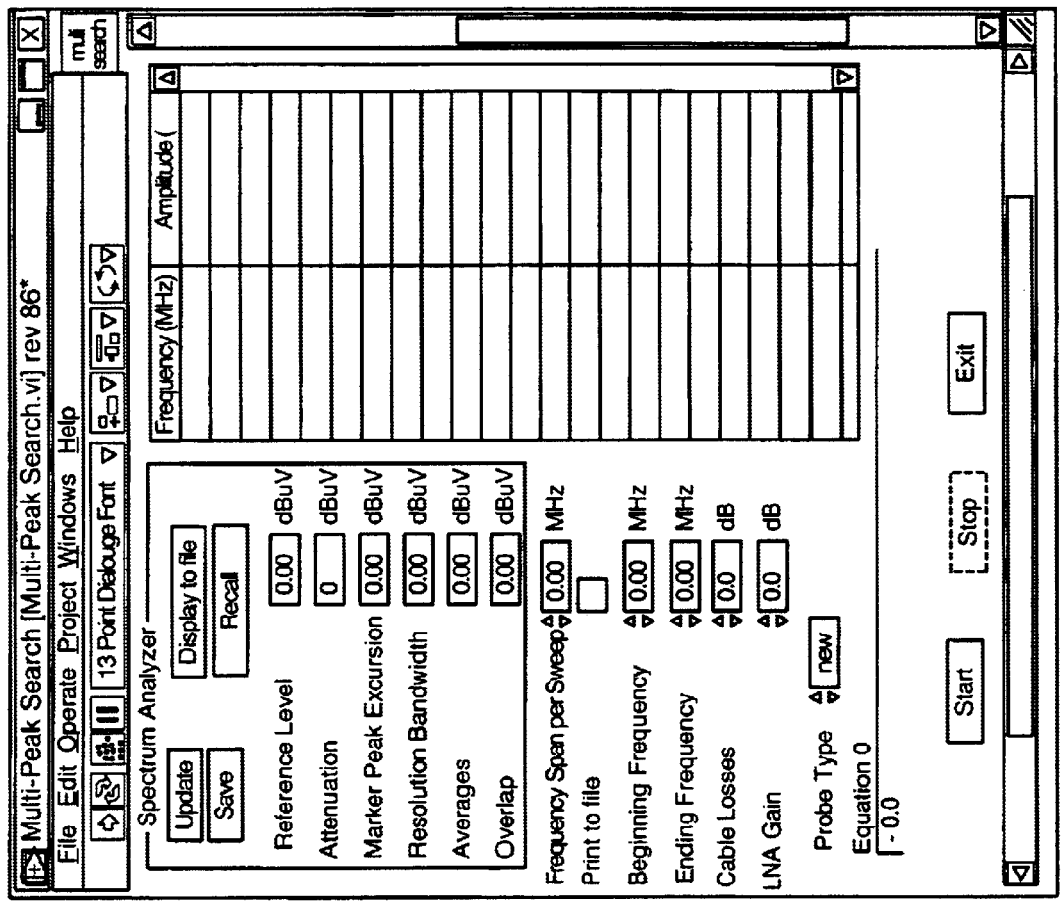
FIG. 57 shows a peak monitoring search setup screen of an operating system according to a particular embodiment of the invention.

FIG. 55 shows a structure for a preview screen for using field sensors with DC output. At an analog output measurement at a single point screen, the following functions may be performed (for the example of an IR sensor):

configure detector output to A/D;

set emissivity;

define spot on DUT to be monitored;

define spot size by adjusting detector height.

At a screen for any field sensor with DC output, functions may be similar to those for a fixed sensor but with these changes: measurement is performed at one frequency only, and detector output is sent to an A/D converter.

A preview screen for peak monitoring is similar to the RF fixed sensor case but with these changes:

a single fixed sensor position above the DUT;

spectrum analyzer setup parameters include marker peak excursion, resolution bandwidth, number of averages, and reference level;

selections include frequency span per sweep, initial and final frequencies, cable loss, amplifier gain, and sensor type.

The program then records emission frequencies for the DUT and the corresponding amplitudes.

Figure 58:
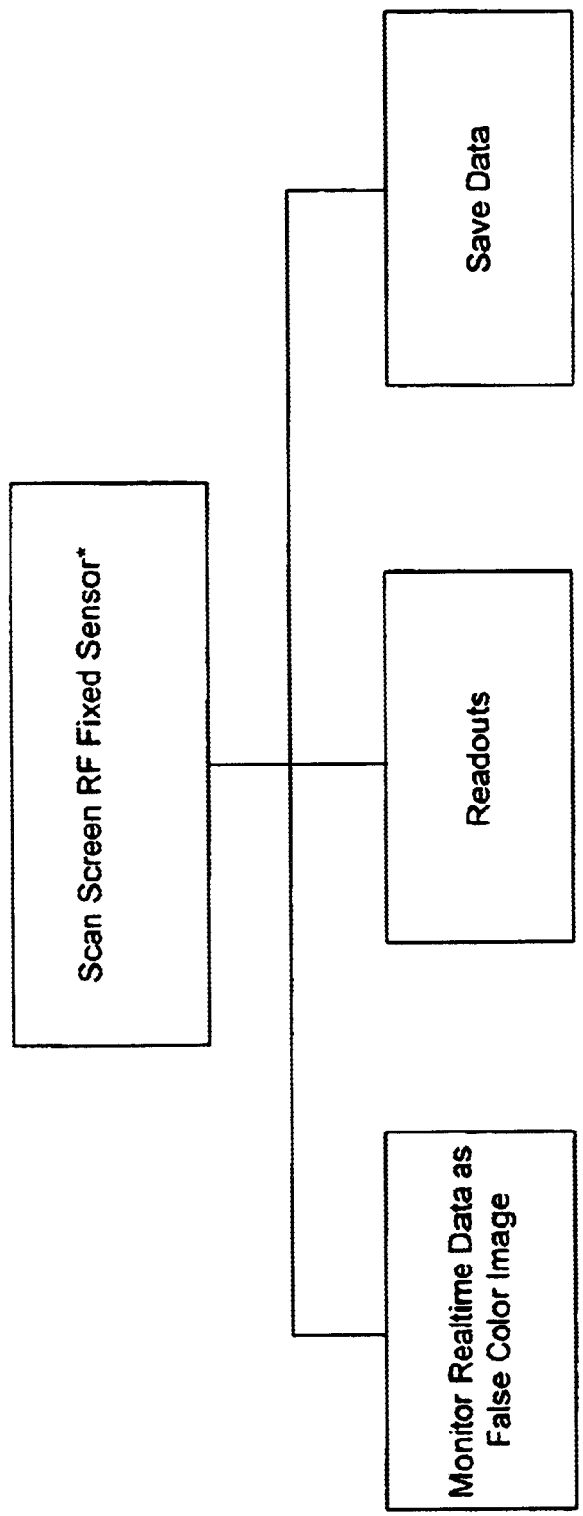
FIG. 58 shows a structure for a scan screen of an operating system according to a particular embodiment of the invention.
Figure 59:
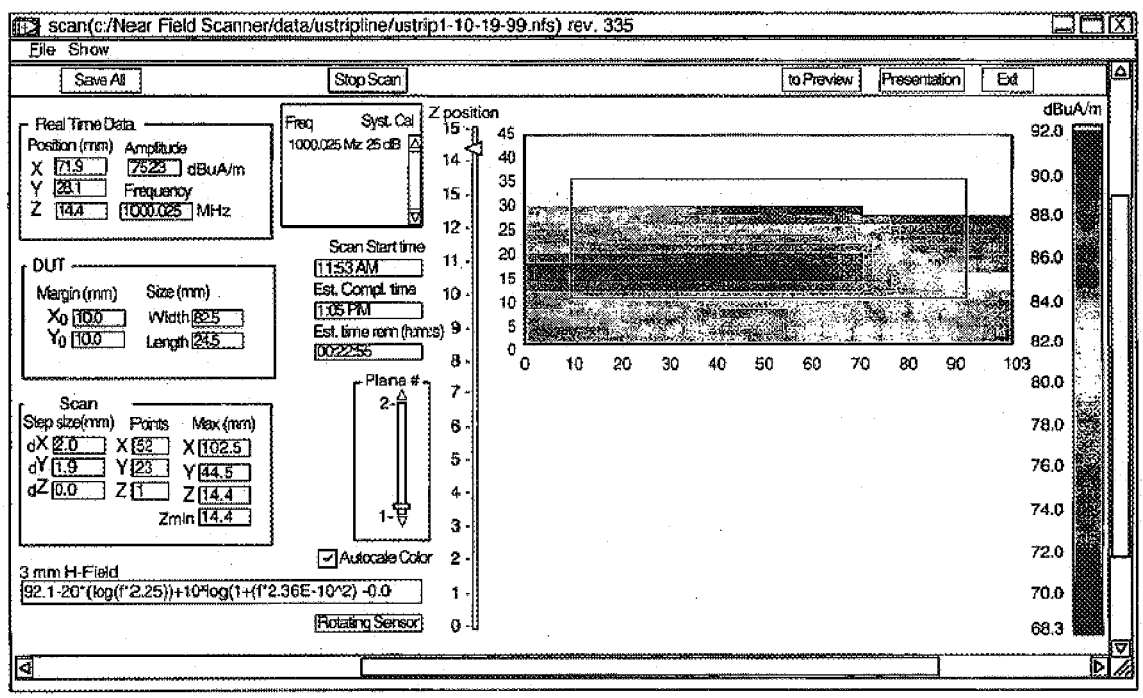
FIG. 59 shows a screen including a real-time display of a scanning operation as performed using an operating system according to a particular embodiment of the invention.
Figure 60:
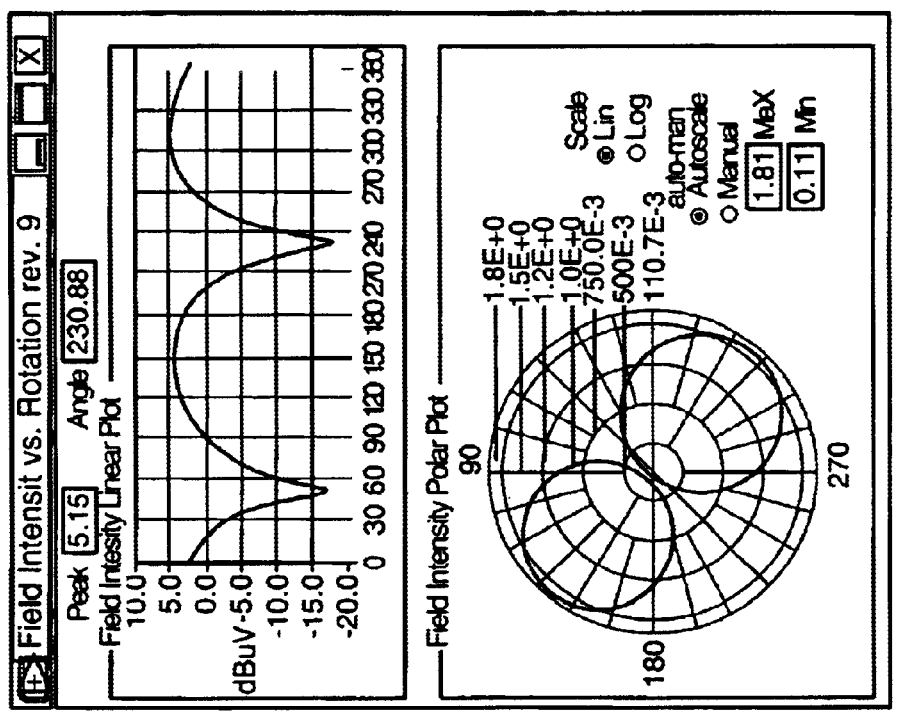
FIG. 60 shows a screen display of an operating system according to a particular embodiment of the invention indicating field intensity versus rotation.

FIG. 58 shows a structure for a scan screen for RF fixed sensor. This mode may include recording multiple points of data at each scan position for test conditions as defined by the user (signal amplitude, frequency, rise time, etc.). At a monitor real-time data as false-color image screen, the following selections may be made:

for each plane above DUT, or for each emission frequency, or for each specific setting of the signal source applied to DUT (e.g., frequency, amplitude, rise time).

At a readouts screen, the following selections may be made:

sensor position;

field intensity;

frequency;

sensor calibration factor for each frequency;

Z axis plane number above DUT;

sensor transfer function;

X, Y, Z limits.

A scan screen for RF rotating sensor is similar to the RF fixed sensor case but with these changes:

a real-time false-color image may show maximum field intensity recorded at each pixel;

a polar/linear plot may show intensity versus angle for each scan position;

sensor rotational position control may be available.

A scan screen for RF/DUT rotary motion is similar to the RF fixed sensor case but with this change: a real-time image shows field intensity for each cross-section of the defined scan space.

Figure 61:
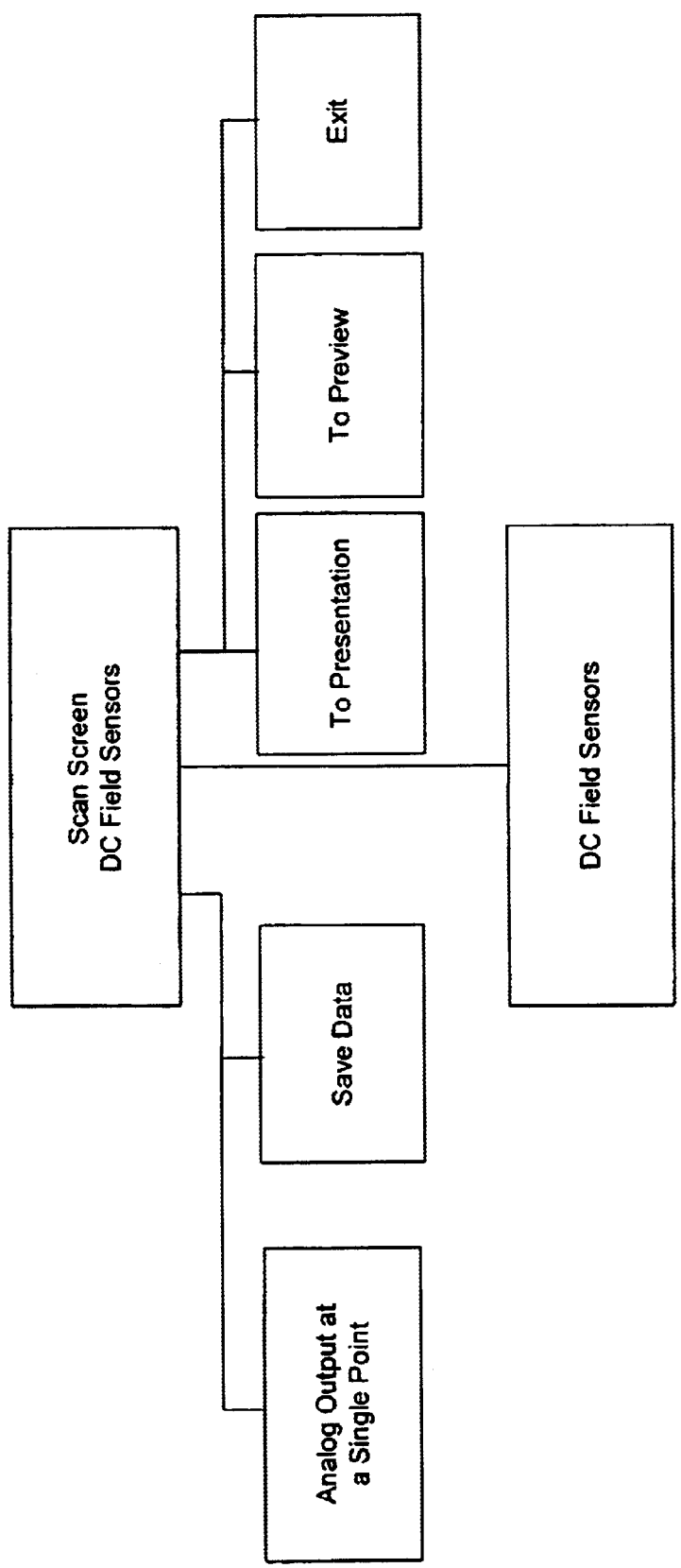
FIG. 61 shows a structure for a scan screen of an operating system according to a particular embodiment of the invention.

FIG. 61 shows a structure for a scan screen for DC field sensors. A DC field sensors screen may be similar to the RF fixed sensor case but with this change: a real-time image to show static (DC) field intensity for each scan position.

Figure 62:
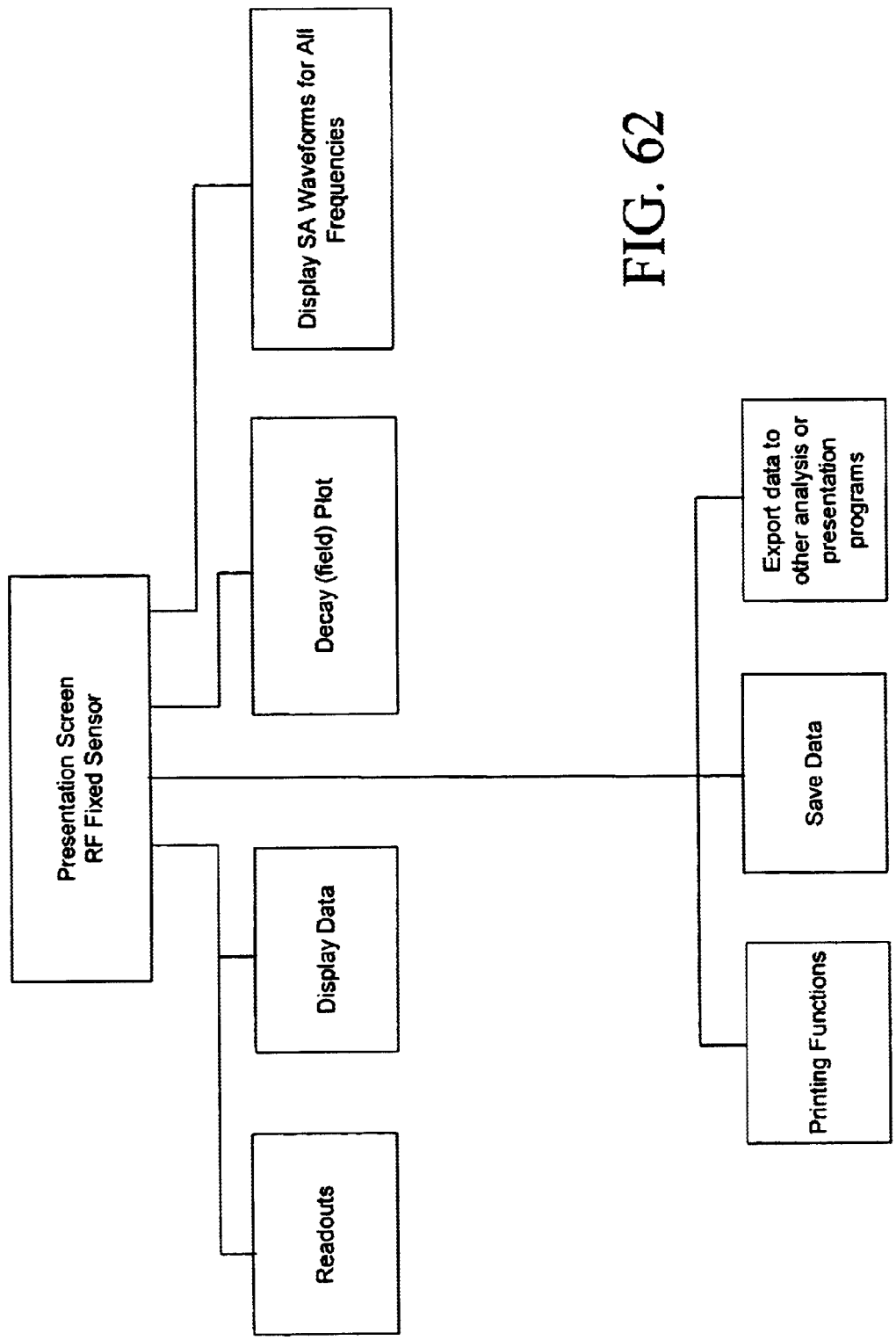
FIG. 62 shows a structure for a presentation screen of an operating system according to a particular embodiment of the invention.
Figure 63:
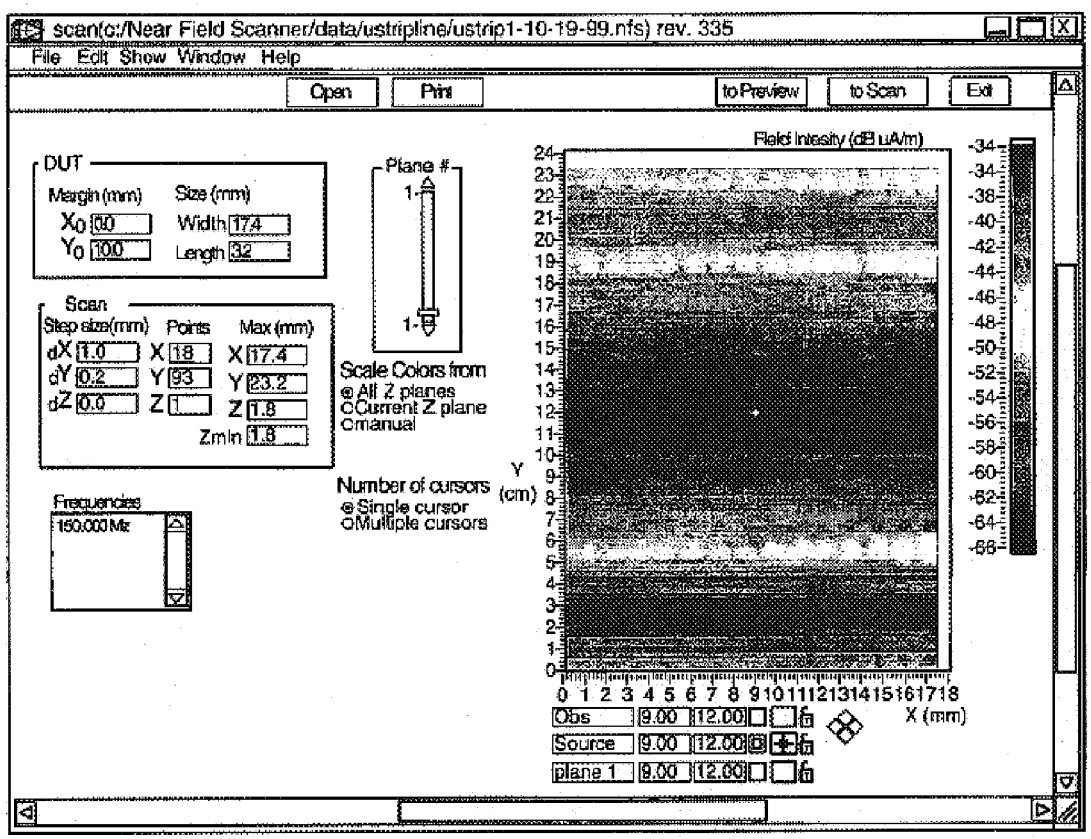
FIG. 63 shows a presentation screen of an operating system according to a particular embodiment of the invention.
Figure 64:
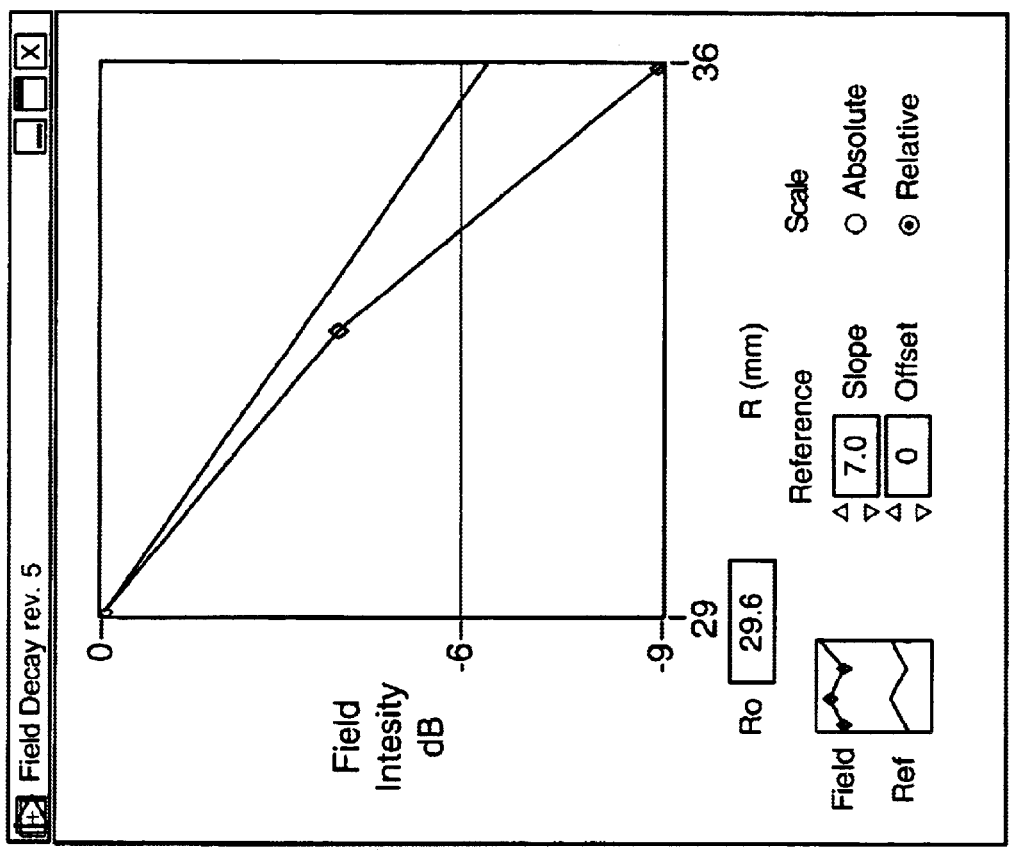
FIG. 64 shows a screen display of an operating system according to a particular embodiment of the invention indicating field decay.
Figure 65:
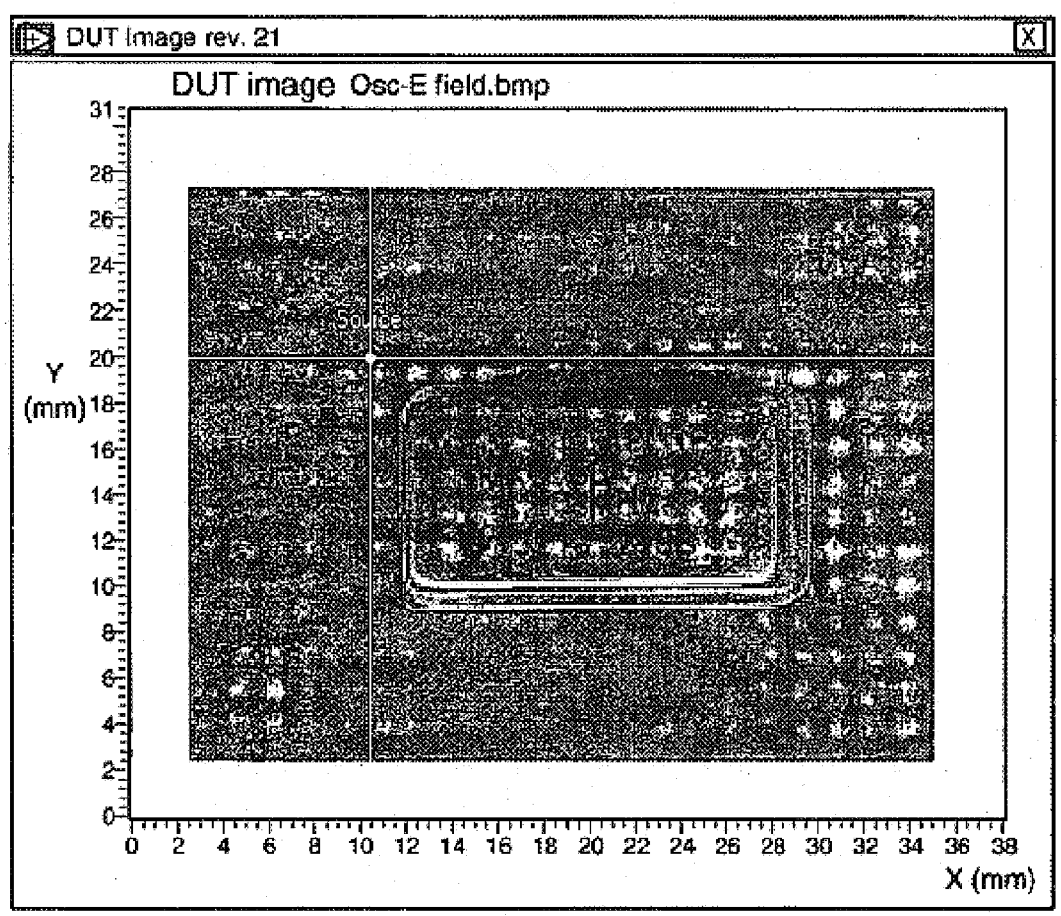
FIG. 65 shows a screen display of an operating system according to a particular embodiment of the invention indicating a position of a sensor with respect to a device under test over a bitmap image of the device.
Figure 66:
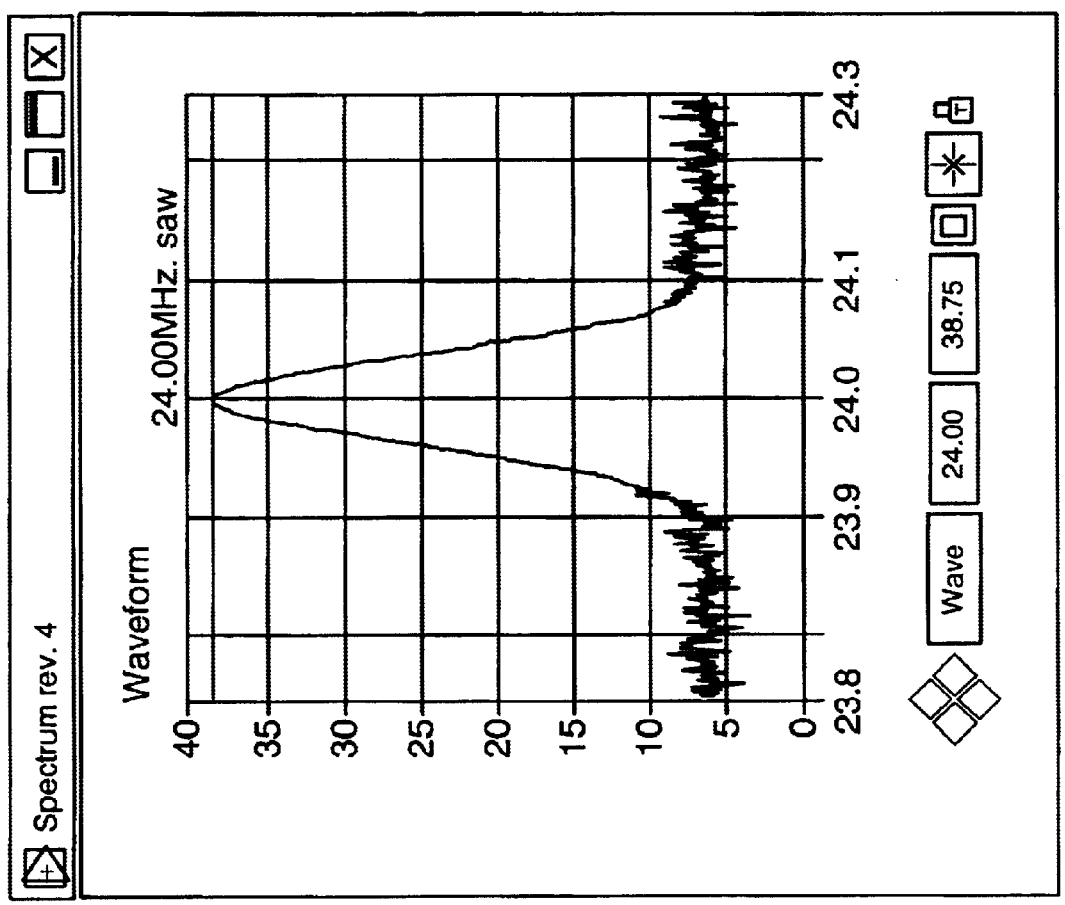
FIG. 66 shows a screen display of an operating system according to a particular embodiment of the invention indicating a spectrum analyzer waveform of a monitored signal.

FIG. 62 shows a structure for a presentation screen for RF fixed sensors. A readouts screen may include the following selections:

Z plane number;

X, Y, Z;

frequency;

Z elevation.

A display data screen may include the following features:

electric/magnetic field intensity profile in false color, for each frequency;

bitmap of DUT;

ganged cursors for examination of the emission profile with respect to the DUT image.

In an example of a function performed from an export data to other analysis or presentation programs screen, the software package Matlab is called by a Matlab VI from within the Labview program. Once the Matlab GUI interface is active, the emission profiles may be created using raw data obtained by the operating system discussed herein.

A decay (field) plot screen may include the following selections:

select observation point;

select reference point on DUT;

plot E or H field decay rate;

compare with $1/r$, $1/r^2$, $1/r^3$ slopes.

A presentation screen RF/DUT rotary motion screen may be similar to the RF fixed sensor case but with these changes: a three-dimensional plot of the E or H emission profile, and/or display of transverse and longitudinal cross-sections of the emission profile.

A presentation screen for RF rotating sensor may be similar to the RF fixed sensor case but with these changes:

An emissions profile is created from max field intensity at each scan position;

direction and amplitude readout for each scan position;

contour plot showing direction and magnitude of the magnetic field (or current) at each scan position;

magnitude of the field is coded as before according to a color chart;

polar plot of field intensity at each scan position;

variation of field direction angle/amplitude with Z at each scan position;

variation of field direction angle with Z, if any.

Figure 67:
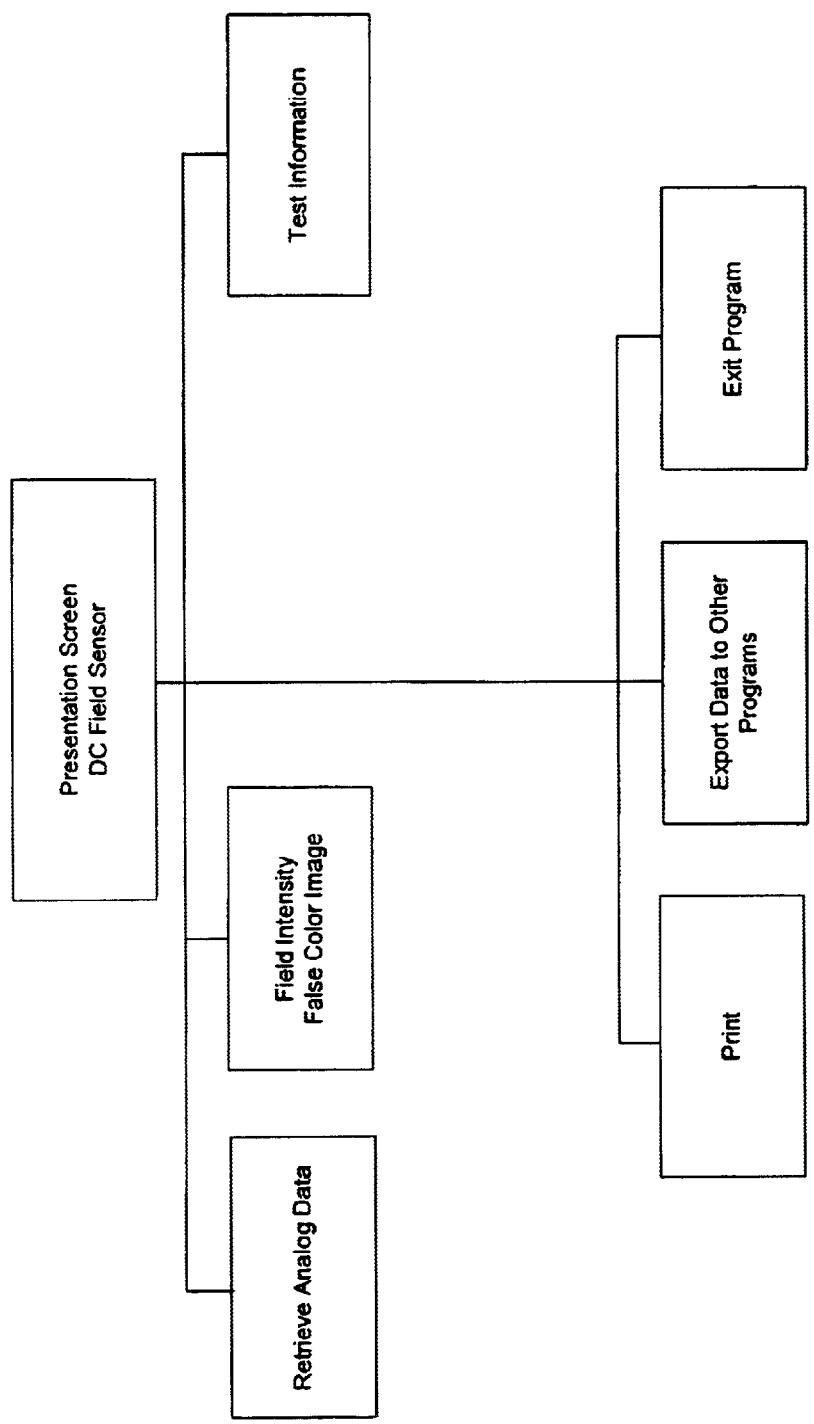
FIG. 67 shows a structure for a presentation screen of an operating system according to a particular embodiment of the invention.

FIG. 67 shows a structure for a presentation screen for a DC field sensor. At a retrieve analog data screen, analog data recorded over a period of time for a specified position on the DUT may be retrieved. A field intensity false-color image screen may be similar to that for a fixed EM sensor, but analog output is added for the over selected duration. A test information screen may include detector parameters, background temperature, and/or scan parameters.

Figure 68:
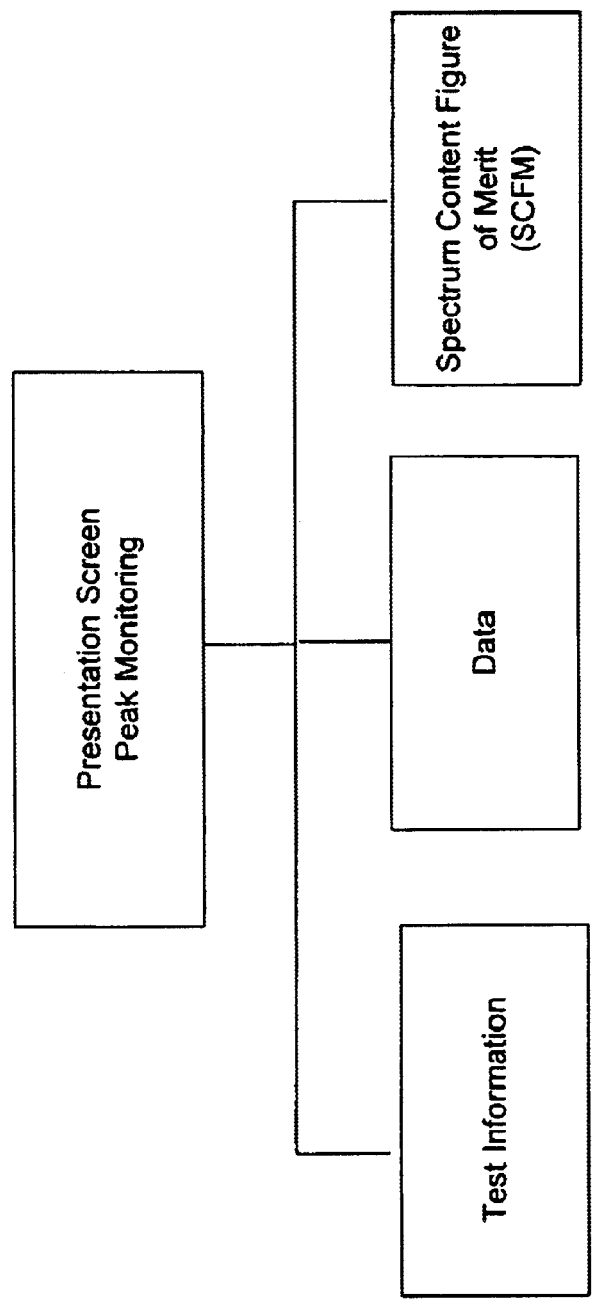
FIG. 68 shows a structure for a presentation screen of an operating system according to a particular embodiment of the invention.
Figure 69:
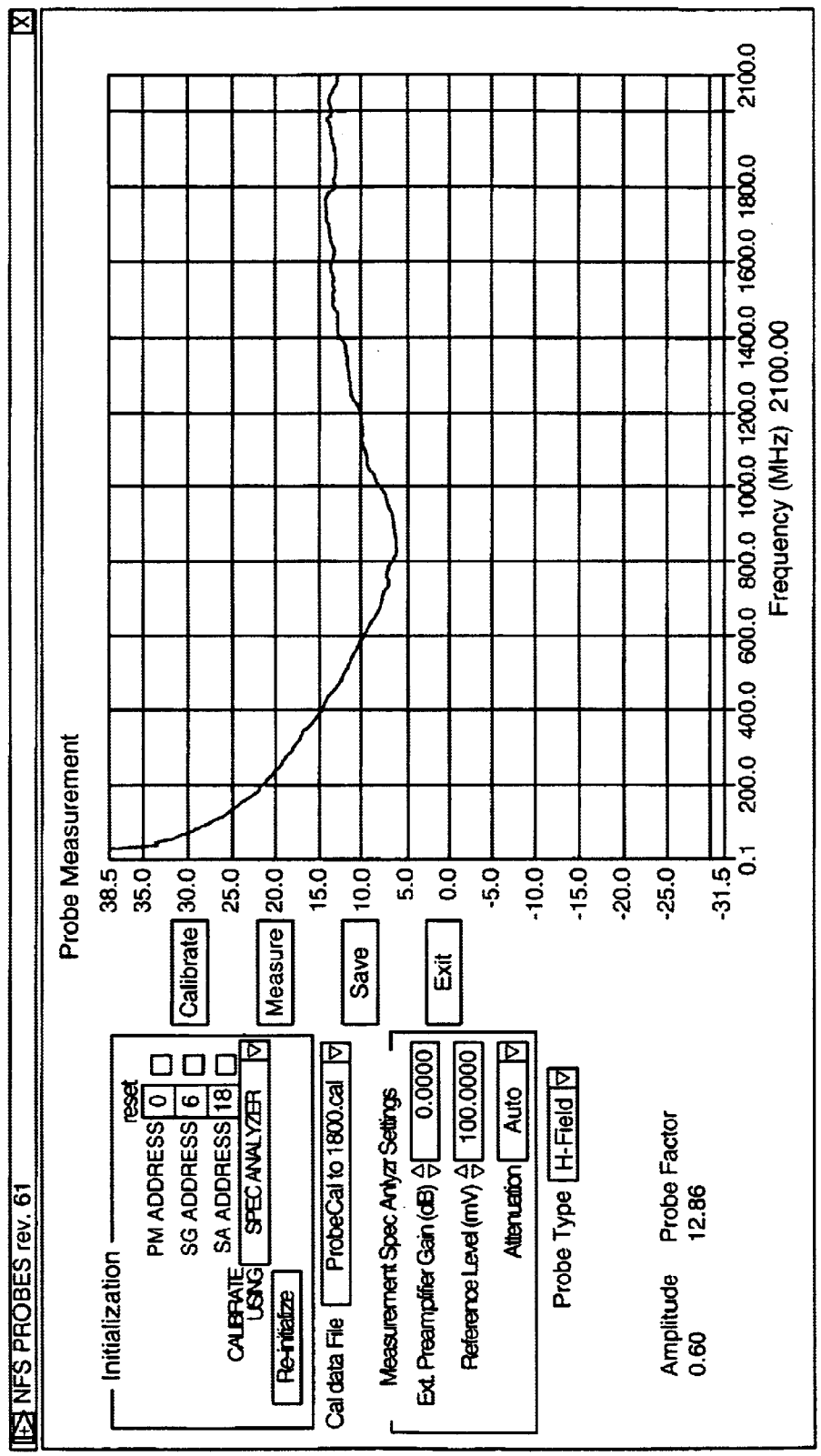
FIG. 69 shows a sensor calibration screen display of an operating system according to a particular embodiment of the invention.
Figure 70:
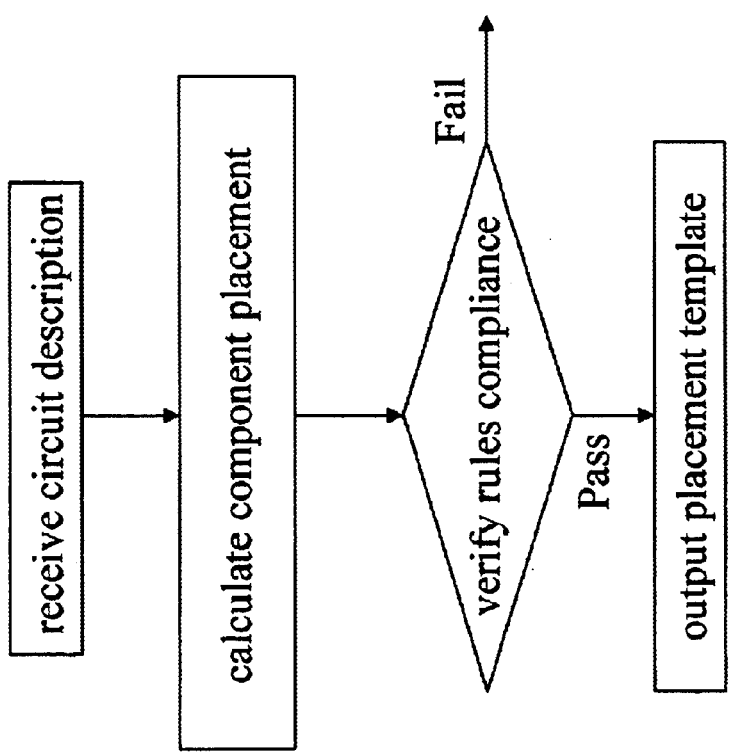
FIG. 70 shows a flowchart for an automated placement tool.

FIG. 68 shows a structure for a presentation screen for peak monitoring. A test information screen may include spectrum analyzer parameters, DUT information, sensor information, and/or scan position. A data screen may include a table bar chart listing each amplitude and corresponding data. A spectrum content figure of merit (SCFM) screen may include selection of the entire bandwidth of measurements or selected bands within the bandwidth.

A time domain measurements screen may be similar to those for frequency domain measurements, with the detector being an analog/digital oscilloscope and a time variation of signal at each scan position being recorded.

An objective of a sensor calibration using a TEM cell screen includes the following:

create a reference field in the TEM cell;

calibrate sensor in the presence of reference field for a specific frequency range;

create a lookup table to be used as transfer function of the sensor or for analysis/research purposes, for design of new sensors.

A user may select the following:

frequency range;

reference field level inside the TEM cell;

sensor type.

Other functions at this screen may include plot calibration data, create lookup table, save, and print.

Determination of Near- and Far-field Patterns From Near-field Measurements

It will be useful in our discussion of EMI to distinguish near-field effects from far-field effects. Far fields, or radiating fields, have a field strength that decreases as $1/r$ (where r is the distance from the source). Near fields are non-radiating and may include one or more of the following components:

electrostatic fields, non-time-varying fields induced by charge accumulation that have a field strength that decreases as $1/r^3$, quasi-static fields, non-time-varying fields induced by current flow that have a field strength that decreases as $1/r^2$, and standing-wave fields, which vary in time at RF or microwave frequencies.

In a more complete description, the fields of a dipole are assumed (see, e.g., pages 38–42 of Christos Christopoulos, *Principles and Techniques of Electromagnetic Compatibility*, CRC Press, Boca Raton, Fla., 1995). In the near-field region, terms decaying as $1/r^3$ represent electrostatic fields and hence capacitive energy storage. Terms decaying as $1/r^2$ represent a quasi-static field due to a current element and hence associated energy storage around the dipole; this contribution is described as an inductive near field.

It is important to note that in the near-field region, the electric and magnetic field components are not related simply by the intrinsic impedance of the medium ($Z_{in}$), as is the case in free space. The near-field impedance $Z_{near-field}$ differs from $Z_{in}$ both in magnitude and direction. For the case of the dipole, this implies that the E field component is larger than would be expected for a far field. If we consider a loop antenna instead of a dipole the situation is reversed: the H component is now dominant.

Near a source, therefore, the character of the source is reflected in the EM properties of the emitted wave. In the far field, on the other hand, nothing exists in the field properties from which the character of the source may be identified. This consequence adds to the importance of near-field measurements.

The boundary between the reactive and radiating regions may be regarded to exist at a distance of approximately $\lambda/2\pi$ from the source, where $\lambda$ is the wavelength of the signal component being measured. As an example, for a signal at 1000 MHz, $\lambda$ is approximately 30 cm, so the near-far field boundary would be located only about 5 cm from the source. For a signal at 2000 MHz, the boundary would be at a mere 2.5 cm from the source. Of these two regions, the reactive near-field region is of primary interest for reasons described herein.

While regulatory standards may require compliance with certain criteria for far-field emissions, near-field effects are actually more likely to cause interference within a circuit. For example, near-field emissions by one component, device, or circuit may interfere with the operation of adjacent components or devices, or may interact with the circuit shielding or the product enclosure, or may encounter other mechanisms by which they become radiating fields and thus contribute to far-field emissions. Thus it is possible to combine two components, devices, or circuits, each of which complies with a specified emissions limit, and obtain a device that fails to comply or even fails to operate because of problems caused by near-field effects.

In a method according to an embodiment of the invention, a near-field emissions profile of a device or system under test (DUT) is collected, and an radiation intensity (e.g. at a specified distance from and/or orientation with respect to the DUT) is calculated based on the emissions profile. An emissions profile may be compiled by measuring near fields of a given device or functional block over a predefined area, which may be on a plane above the device (e.g. parallel to a surface of the DUT). The size of the plane (i.e. the scan area) may be smaller than, the same as, or larger than the size of the device. For example, the scan area may be larger than the device by approximately 20 mm on each side. Depending in part on the sensitivity of the sensor being used, it may not be possible or desirable to measure near fields beyond this distance. However, it may not be necessary to measure the fields beyond such distance, as the information over the scan area may nevertheless be sufficient to support reliable calculation of fields due to emissions from the device everywhere on the circuit board (or other structure) being planned, as discussed below.

Once the magnetic near fields are measured, the corresponding current densities may be calculated. From the current densities, the vector magnetic potential everywhere on the board (or everywhere in the space surrounding the DUT) may be derived, which in turn provides a characterization of both H and E fields everywhere on the board. This result is based on the Huygens-Fresnel Principle or the Surface Equivalence Theorem (discussed generally in *Advanced Engineering Electromagnetics*, Constantine A. Balanis, Wiley, 1989 and "Determination of Far-Field Antenna Problem from Near-Field Measurements," Richard C. Johnson, Proceedings of the IEEE, vol. 61, no. 12, December 1973). The Huygens-Fresnel Principle states that each point on a given wavefront can be regarded as a secondary source that gives rise to a spherical wavelet, and that the field at any point exterior to the wavefront can be derived from the superposition of these elementary wavelets. By applying this principle, the complete electromagnetic field configuration of a source may be computed if either the current or charge distribution over the source structure is known exactly.

As introduced by Schelkunoff, the Surface Equivalence Theorem is a more rigorous formulation of the Huygens-Fresnel Principle which states that each point on a primary wavefront can be considered to be a new source of a secondary spherical wave and that a secondary wavefront can be constructed as the envelope of these secondary spherical waves. The theorem is based on a Uniqueness Theorem which states that a field in a lossy region is uniquely specified by the sources within the region plus the tangential components of the electric field over the boundary or, the tangential components of the magnetic field over the boundary, or the former over part of the boundary and the latter over the rest of the boundary. The fields in a lossless medium are considered to be the limit (as losses go to zero) of the corresponding fields in a lossy medium. Thus, if the tangential electric or magnetic fields are sufficiently known over a closed surface, the fields in the source-free region can be determined.

In one application of this theorem, actual sources (e.g. a device) are replaced by equivalent sources. The calculated sources are said to be equivalent to the actual sources within a given region because they produce within that region the same fields as the actual sources. A rotating sensor as described herein may be used to measure tangential magnetic fields and therefore support calculation of the tangential H components.

A second method for determining fields based on near-field measurements may be described as follows: The emissions profile of a given circuit component is described in terms of the components of the magnetic field vector, as measured on the surface of a plane at some distance above the component. In one example, the area over which the magnetic field is measured is a rectangular area that encompasses the footprint of the circuit component on the integrating substrate. The field components are measured at a given set of frequencies, dictated by the functional attributes of the circuit component.

For each frequency, electromagnetic theory of radiation can be used to obtain the electric and magnetic field components at any point in space above the plane over which the emissions profile is measured. One mathematical operation suitable for this calculation is an integration over the emissions profile plane of the product of the magnetic field components tangential to the emissions profile plane. In an exemplary implementation, the integration is performed using Green's functions, which may be used to express the electromagnetic fields generated at a given frequency at some point in space (called the observation point) due to a so-called dipole current source located at another point in space (called the source point). The dipole current is calculated as the product of the measured tangential magnetic field at a selected point on the emissions profile plane with a rectangular area corresponding to the resolution of the field measurement grid (i.e. as defined by the distance in each dimension between adjacent field measurements). The integration is performed numerically and can be interpreted as the vector superposition of the electromagnetic fields as contributed by individual dipoles located at the points where the emissions profile was measured.

This process makes possible the prediction of component emissions at any point in the space above the component once its emissions profile has been obtained over only a limited portion of space (in this example, a plane just above the component and of sufficient extent to encompass the component footprint). As described herein, for example, this electromagnetic emissions capability from components on an integrating substrate may be used to guide system floor planning, whereby circuit component placement is decided on the basis of whether electromagnetic interference due to circuit components can cause the malfunctioning of other circuit components.

A third method for determining fields based on near-field measurements is based on an expression of the total electromagnetic field in terms of a modal expansion. The magnitudes and directions of these modes can be derived from measurements of the electromagnetic field over an appropriate surface in the near field (for example, over a plane surface for a plane wave expansion). Knowledge of the magnitude and direction of each component in the modal expansion permits a complete description of the radiated field.

File Formats

It may be desirable to format measurement data (e.g. data collected using a sensor and positioning device as described above, such as an emissions profile) for storage and/or transfer. For example, the measurement data may be formatted into one or more matrices or arrays and stored as a file. The header of such a file may include information (e.g. in an ASCII or text format) such as the initial distance between sensor 120 and DUT 10 (e.g. along an axis orthogonal to a surface of DUT 10); the distance that separates each sampling point in the x, y, and/or z directions; the dimensions of the scan area or volume in the x, y, and/or z directions; the frequency or frequency range to which the measurement data pertains; the type of sensor used and/or the transfer function of the sensor; the type of data being stored and/or the particular data format being used; and information relating to other devices in the data processing path such as amplifier gain and spectrum analyzer resolution bandwidth. The file may also include a bitmap or other digital image of DUT 10 showing a relative location of the first measurement, an outline of the scan area, and/or grid lines.

In an exemplary implementation, data measured over each of several planes (e.g. each plane corresponding to a different distance from DUT 10 along an axis orthogonal to a surface of DUT 10) is stored as a separate matrix, with the dimensions of the matrix corresponding to the planar axes. The matrix entries may represent the intensity of the sensed field as measured at the corresponding location. Alternatively, data may be interpolated between measurement points to obtain additional matrix entries.

A file may contain data values corresponding to more than one measurement frequency, with values for each measurement frequency being stored in different matrices or sets of matrices. Data corresponding to directional measurements may be stored in two matrices: one for magnitude or intensity and one for direction (e.g. in degrees).

Values representing other measurement data may be stored in a vector format rather than a matrix or array format. Measurement data obtained during peak monitoring, for example, may be stored in two corresponding vectors: one for measurement frequency and one for the intensity recorded at that frequency. Alternatively, the frequency information may be stored in the file header as an initial value and an increment value (e.g. in a case where the frequency measurements are uniformly separated). For a sensor that provides measurements for components in two orthogonal directions (e.g. a directional magnetic field sensor such as a nonrotating loop sensor), a separate set of vectors may be recorded for each directional component, such that a magnitude and/or direction of the field at each point may be calculated later.

Each matrix (or vector) entry may be stored as an ASCII (text) string of digits (delimited and/or of fixed length), possibly including a decimal point and/or leading and/or trailing zeroes. For example, an ASCII file may include two or more matrices, with one or more blank lines separating the matrices (each blank line being indicated by, e.g., one or more carriage return/line feed characters). Alternatively, each matrix entry may be stored in a binary integer or floating-point format. In other implementations, a matrix of data values may be stored in an image (e.g. bitmap) format.

As described above, measurements may be taken while a signal inputted to the DUT is varied (e.g. in amplitude, frequency, modulation, etc.). In such case, a file for storing the resulting measurement data may contain a matrix for each level of variation of the input signal. The file header may include information identifying the various levels of the input signal (e.g. in dB) and correlating each input signal level to a corresponding matrix of data values.

CAD Tool

Figure 71:
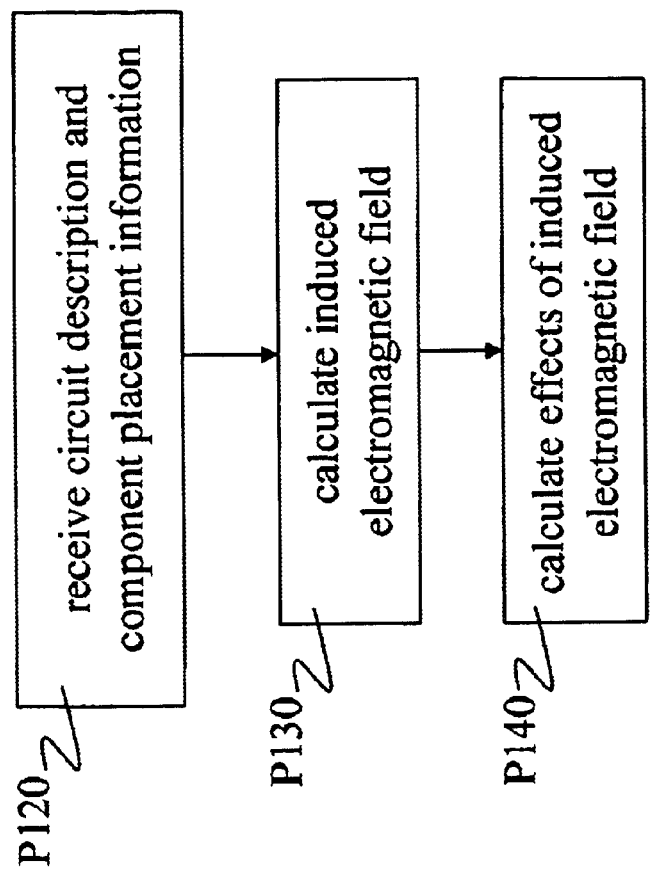
FIG. 71 shows a flowchart for a method according to an embodiment of the invention.

As shown in FIG. 71, a method for automated layout of electronic devices and/or systems according to an embodiment of the invention includes receiving a circuit description and component placement information (task P120). The circuit description received in task P120 provides information such as component type, dimensions, and connectivity. For example, this description may include a functional description of logical flow or signal flow as embodied in a SPICE netlist, a HDL file, or a schematic diagram. This data may describe a digital circuit, an analog circuit, or a circuit that has both digital and analog sections. As for the component placement information received in task P120, this data may be obtained, for example, from a tool for automated component placement. Other data received in task P120 may include size constraints and/or environmental information regarding such aspects as the nature and location of electromagnetic shielding elements.

In task P130, an electromagnetic field as induced by a circuit defined by the data received in task P120 is calculated. In addition to the data received in task P120, this field calculation is performed with reference to one or more emissions profiles that correspond to the circuit components. These emissions profiles, which may be measured and/or mathematically modeled to an arbitrary precision, may be provided as a library or database and may be based on measurement data (e.g. as collected using a positioning device and one or more sensors as described herein). It may be possible to collect data for an emissions profile for an individual block within a die or module by selectively activating only the desired block. In an exemplary application, an emissions profile defines the near-field emissions of a particular component type and is presented as a grid of relative locations and corresponding factors in two or three dimensions.

Data outputted by task P130 may be formatted in numerous different fashions. For example, task P130 may produce one field image for each component, or a single composite field image for the entire assembly, or one field image for each predetermined subsection of an assembly, or one composite field image for each one of a set of predetermined frequencies. Additionally, the field calculations performed in this task may be limited to a particular frequency range or a set of critical (or in-band) frequencies. Also note that such analysis is not limited to two dimensions: field images may be generated in three dimensions as well, so long as the emissions profiles contain sufficient data from which to calculate such a field. In one exemplary implementation, images of field strength for the E and H fields in a plane at a specified distance from the DUT are outputted for storage as separate matrices. In other implementations, the images may indicate field direction as well. (Note that the term 'image' is used here only to indicate a matrix or array of values, and the use of this term does not imply that the image must be displayed or must be presented in a form suitable for display, although various implementations may include such capabilities.)

In task P140, the effects of the induced field or fields from task P130 are calculated. Susceptibility profiles corresponding to the circuit components are used to determine these effects. A method according to an embodiment of the invention for determining a susceptibility profile for a particular component may be described as follows. An antenna is positioned at a fixed location with respect to the device or system under test (e.g. above the center of the DUT). Characteristics of the antenna such as radiation pattern and spot size are selected based on characteristics of the DUT such as package and die size. As the antenna radiates in response to an inputted signal (e.g. at a predetermined frequency and amplitude), voltages induced by the applied field at selected terminals of the DUT are monitored and recorded. The induced voltages may be stored in a file as described herein (e.g. as a vector, with one entry for each terminal being monitored), with information characterizing the measurement environment and/or protocol being recorded in the file header.

In further implementations, the signal inputted to the antenna may be varied (e.g. in amplitude and/or frequency) as the induced voltages are monitored and recorded. For example, the inputted signal may be varied among several preselected critical frequencies. In another example, the amplitude of the inputted signal may be increased until a breakdown condition occurs in the DUT. Alternatively or in addition to varying the inputted signal, the antenna and/or DUT may be moved relative to one another such that the radiating antenna covers a preselected path, area, or volume in the vicinity of the DUT, while position information and corresponding induced voltages are recorded. Alternatively or in addition to the above, a relative orientation between the antenna and the DUT may be varied (e.g. by rotating the antenna), while orientation information and corresponding induced voltages are recorded. In such cases, information regarding the signal, position, and/or orientation settings may be stored in a file header (e.g. as an initial value and a increment (or decrement) value) or as one or more vectors or matrices, with the induced voltage measurements being stored in corresponding vectors or matrices (e.g. one for each terminal being monitored).

The DUT may be programmed or otherwise controlled to execute a specific sequence of instructions (e.g. a standard verification test), or otherwise to perform some repeated function, during such monitoring. By prompting the DUT to exhibit the behavior for each measurement, for example, a failure condition of the DUT may more easily be detected and/or established.

Alternatively, a susceptibility profile may be obtained at least in part through simulation. In one such method according to an embodiment of the invention, a simulation package such as Specctra (Cadence Design Systems, San Jose, Calif.) is used to inject simulated signals at selected nodes or terminals of a representation of the device or system under test (DUT). The simulated signals may vary, for example, over a specified range of (or over certain critical values of) amplitude and/or frequency. The levels of the simulated signals are recorded, along with their effects on critical cores or circuitry of the DUT (e.g. until a breakdown occurs or until the simulated DUT fails to meet some performance criterion).

In order to correlate a susceptibility profile with emissions profiles of potentially interfering devices, the strengths of the emitted fields at the locations of the selected nodes or terminals are determined (e.g. from the field image(s) calculated in task P130). These field strengths (e.g. in volts or amperes per meter) are then translated to voltages at the nodes or terminals, based on such factors as the distance of the node or terminal from the radiator and the geometry of the package, board, and/or interconnects.

A library or database of susceptibility profiles may include several profiles for a component, with each profile corresponding to a different frequency, operating voltage, process size, etc. Task P140 may also determine the effects of the induced fields by, for example, detecting locations where a profile threshold is exceeded. In a further implementation, task P140 accounts for the relative orientations of the various components and their emitted fields and/or susceptibilities.

Figure 72:
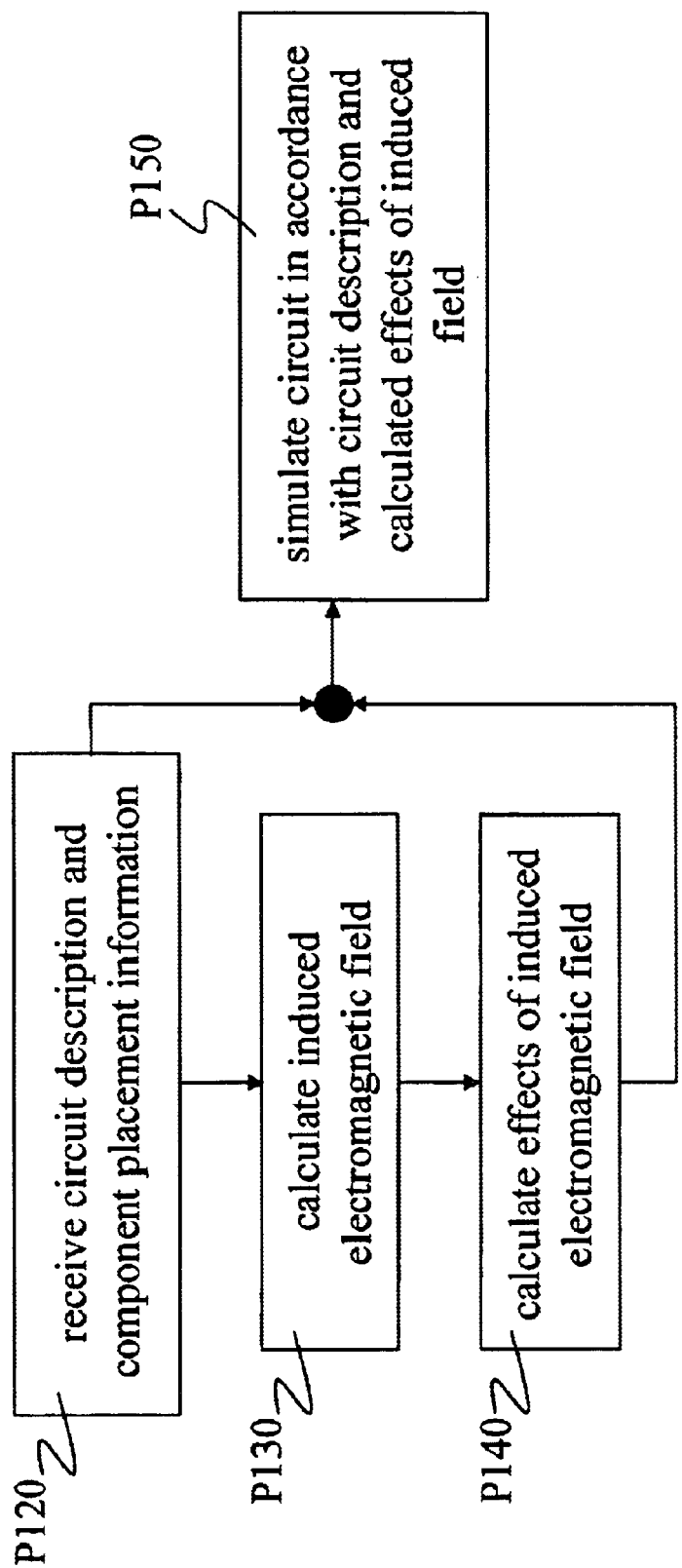
FIG. 72 shows a flowchart for an extension of the method of FIG. 71.

FIG. 72 shows one extension to the method of FIG. 71. In this method, induced noise values as calculated in task P140 are included with the original circuit data in a SPICE simulation in order to predict the operation of a finished prototype. Such an operation may be regarded as 'virtual prototyping.' In addition to allowing the designer to evaluate the performance of a prototype without the time and expense of fabricating one, such a method also guides the designer by providing information regarding problem areas.

Figure 73:
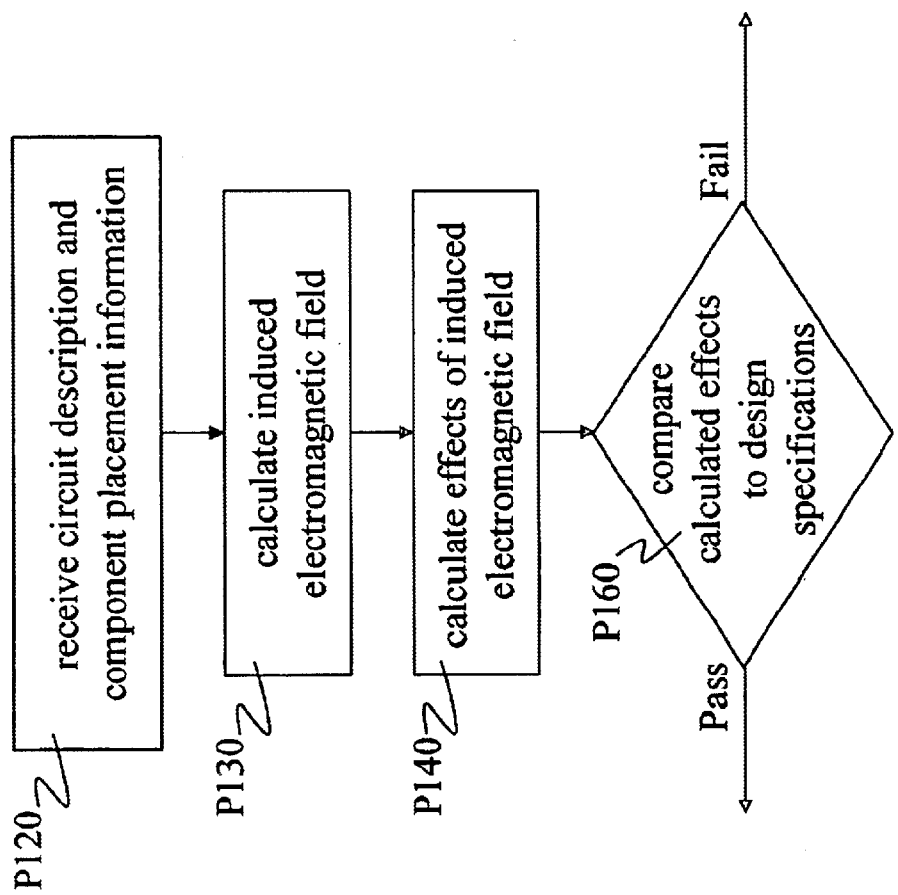
FIG. 73 shows a flowchart for another extension of the method of FIG. 71.

In another extension to the method of FIG. 71 as shown in FIG. 73, induced noise values as calculated in task P140 are used to determine whether a prototype constructed according to the placement template will comply with the design specifications. If it is determined in task P160 that the prototype will not perform within the specifications, then the template is rejected.

Figure 74:
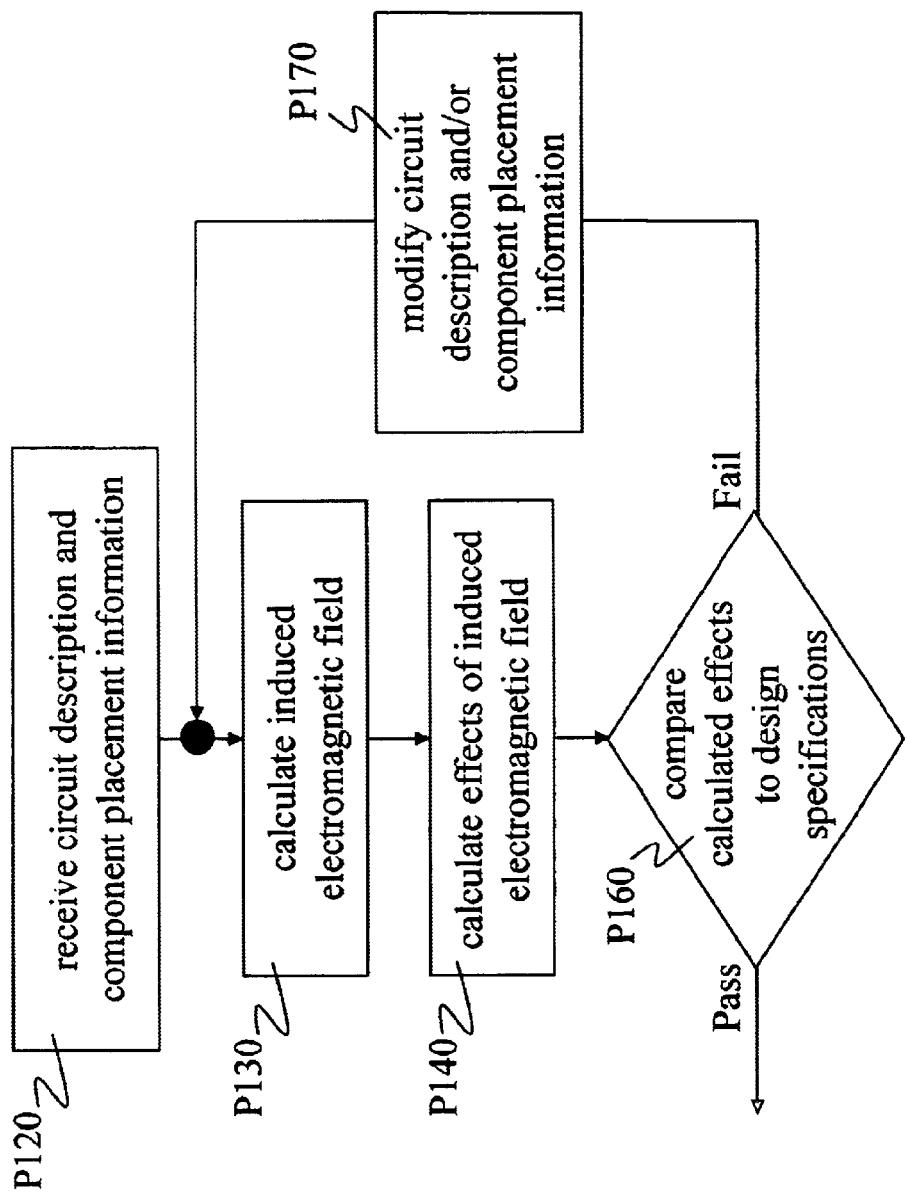
FIG. 74 shows a flowchart for an extension of the method of FIG. 73.

In an extension to the method of FIG. 73 as shown in FIG. 74, induced noise values as calculated in task P140 are used in directing a modification of the circuit description and/or the component placement information. If these values indicate that the performance of a particular component is especially affected by a field generated by another component, for example, the component placement may be modified in task P170 to separate the two components if other constraints (e.g. board size and dimensional limitations, connectivity requirements, etc.) allow. Alternatively, if the calculations indicate that a field generated by one component contains a frequency similar to the operating frequency of a nearby component, the circuit description may be modified in task P170 to change the operating frequency of the second component.

Figure 75:
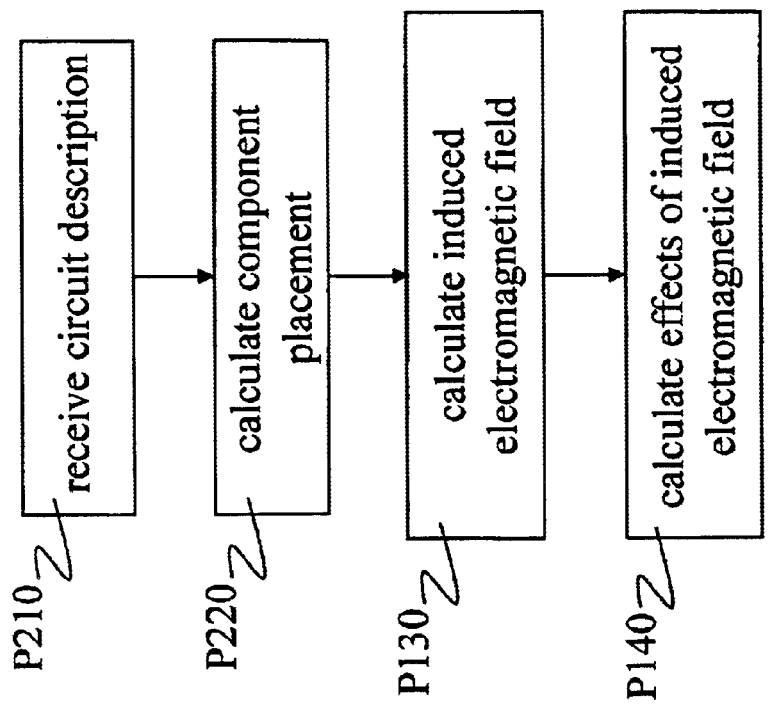
FIG. 75 shows a flowchart for a method according to a further embodiment of the invention.
Figure 76:
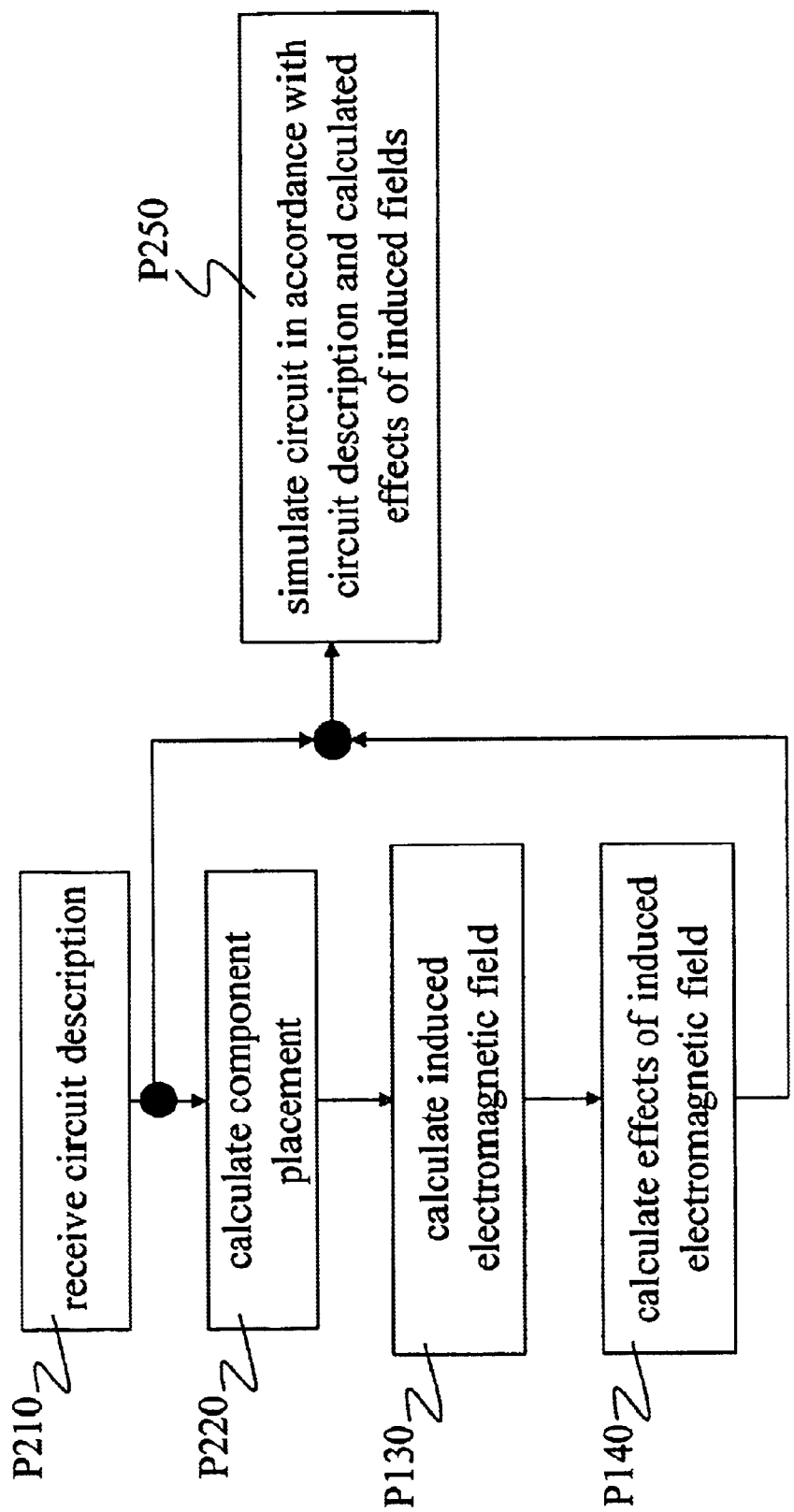
FIG. 76 shows an extension to the method of FIG. 75.

FIG. 75 shows a flowchart for a method according to a further embodiment of the invention that includes a task P220 of calculating component placement. In one implementation, task P220 is performed by combining physical information such as component dimensions and thermal sensitivities, enclosure and other constraints, and connectivity and placement requirements (e.g. as required for interfacing with other devices or boards) with general layout rules as described above (e.g. avoiding long parallel traces). FIG. 76 shows an extension to the method of FIG. 75 that includes circuit simulation task P250.

Figure 77:
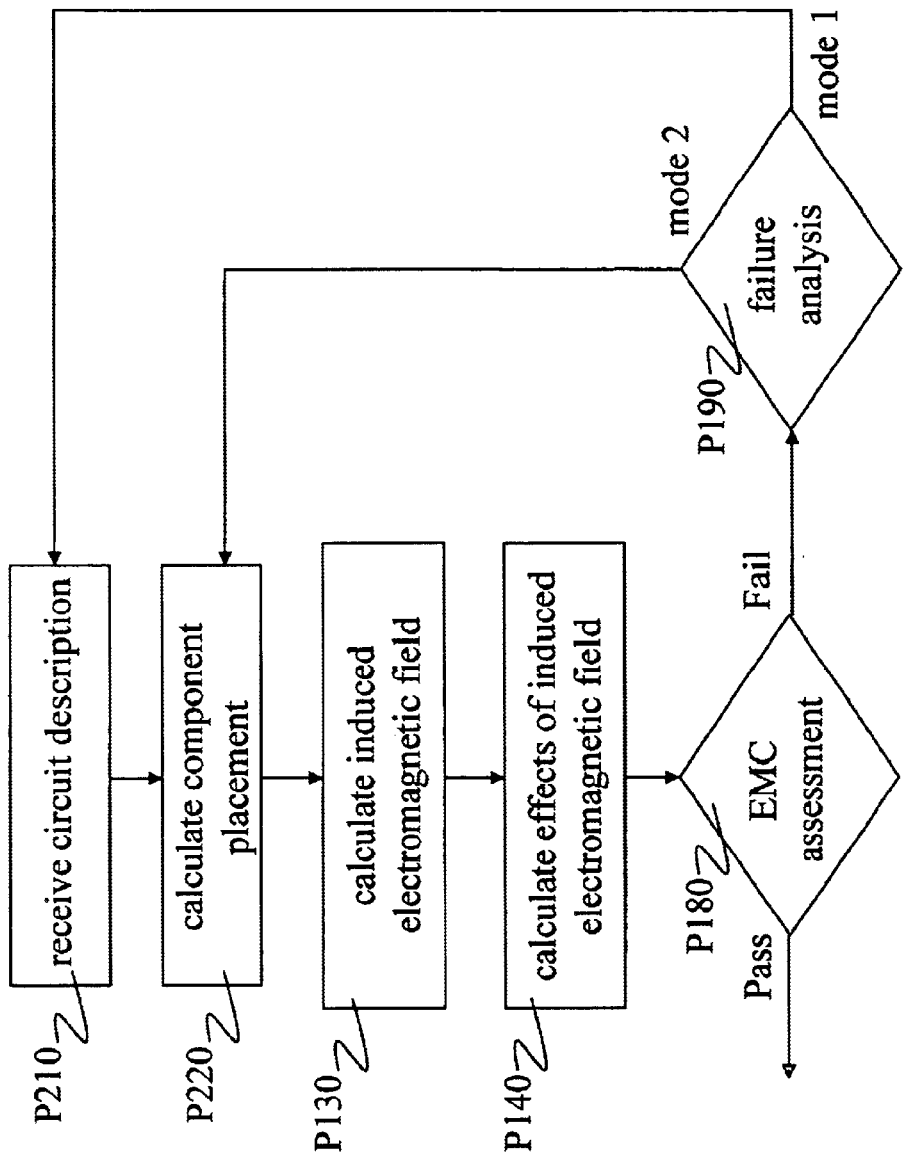
FIG. 77 shows an alternate extension to the method of FIG. 75.

FIG. 77 shows an alternate extension to the method of FIG. 75 that includes electromagnetic compliance (EMC) assessment task P180 and failure analysis task P190. In task P180, the effects calculated in task P140 are compared to predetermined criteria (e.g. one or more noise thresholds). If the criteria are exceeded, then a modification decision is made in task P190. In one example, upon a first failure, the criteria for component placement are modified and the procedure returns to task P220, where upon a second failure, the circuit description is modified to include shielding and the procedure returns to task P210.

Figure 78:
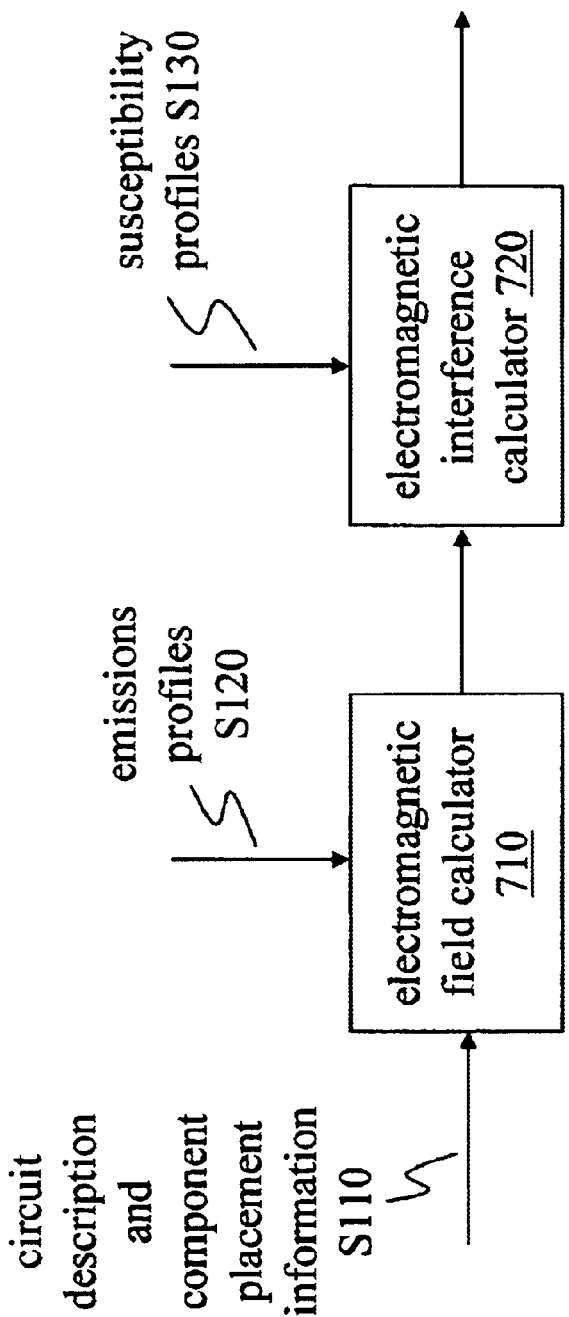
FIG. 78 shows a block diagram for an apparatus according to an embodiment of the invention.

FIG. 78 shows a block diagram for an apparatus according to an embodiment of the invention. Electromagnetic field calculator 710 receives circuit description and component placement information signal S110 and emissions profiles signal S120 and outputs a signal relating to calculated electromagnetic fields to electromagnetic interference calculator 720. Calculator 720 compares the calculated fields to susceptibility profiles received on signal S130 and outputs a result based upon predetermined criteria as discussed above.

Figure 79:
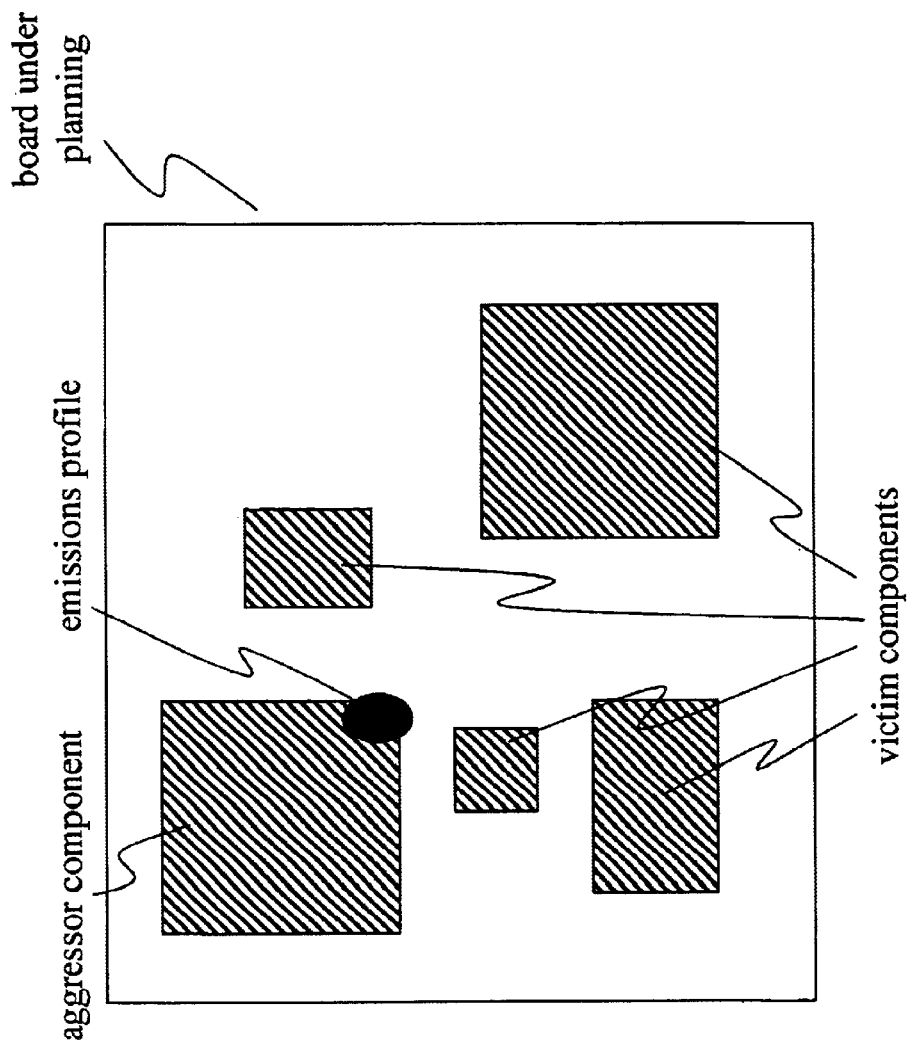
FIG. 79 is a representation of a circuit board having several components that indicates an emissions profile over a predetermined area.
Figure 80:
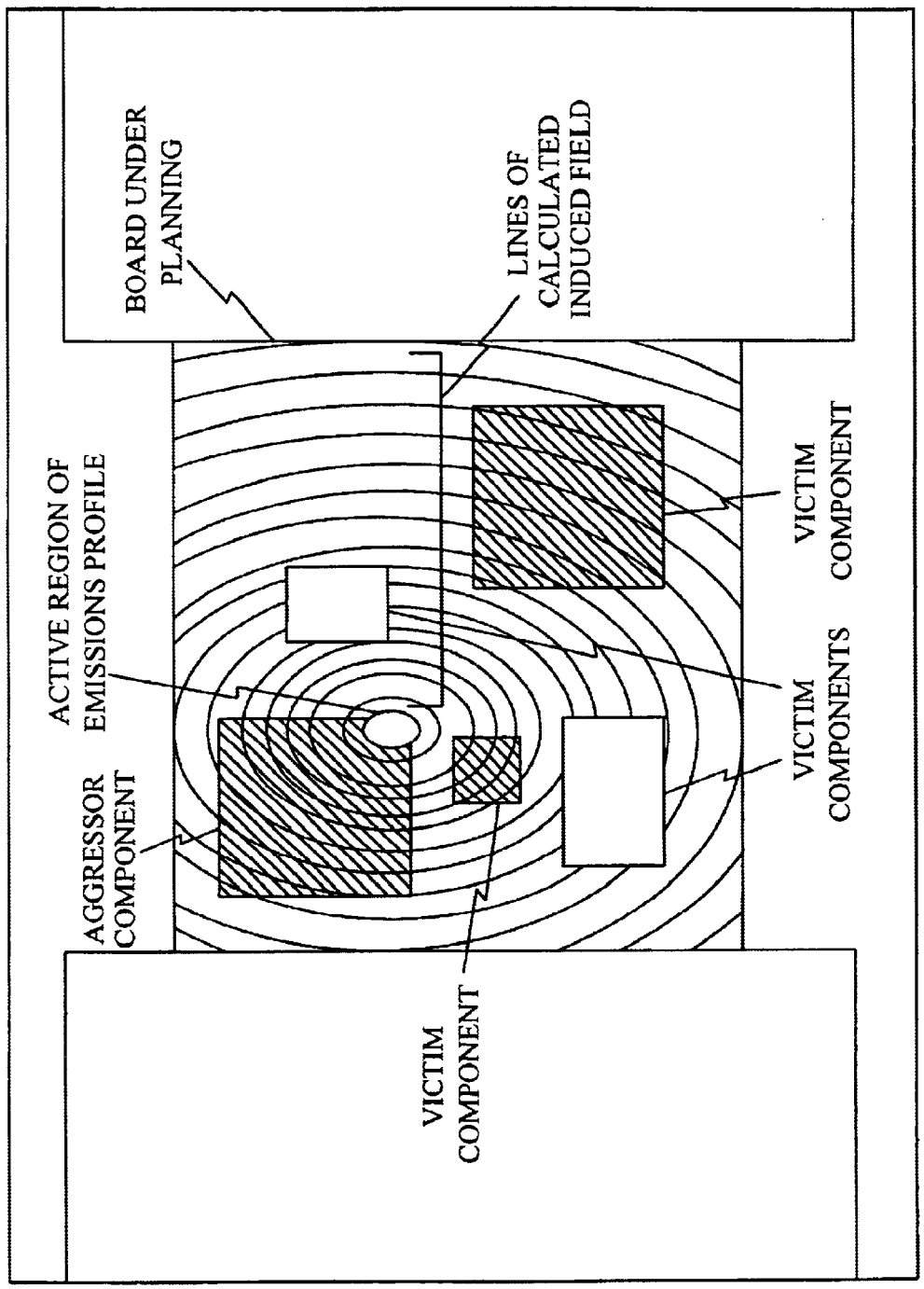
FIG. 80 shows the representation of FIG. 79 and indicates a calculated induced field corresponding to the emissions profile.

FIGS. 79 and 80 demonstrate the operation of the CAD tool in a system-level application. In this example, five components (e.g. integrated circuits) are placed on a printed circuit board in a preliminary layout based on connectivity and signal integrity considerations. One of these components is considered to be the aggressor, and an active region of its measured electromagnetic near-field emissions profile at a predetermined critical frequency is indicated by the spot in the lower right corner of its package. The other components are considered to be victims in this case. Application of a method or apparatus according to an exemplary embodiment of the invention includes a mathematical expansion of the measured emissions profile, with calculation of the induced field everywhere on the circuit board and subsequent determination of noise induced at the surrounding functional blocks. The induced noise values are then compared with exposure limits of each component (e.g. as indicated by the susceptibility profiles), and EMC violations are identified. In this example, components at which EMC violations are determined are indicated in FIG. 80 by solid blocks. In a further implementation, a new layout may be suggested to correct the EMC violations.

Figure 100:
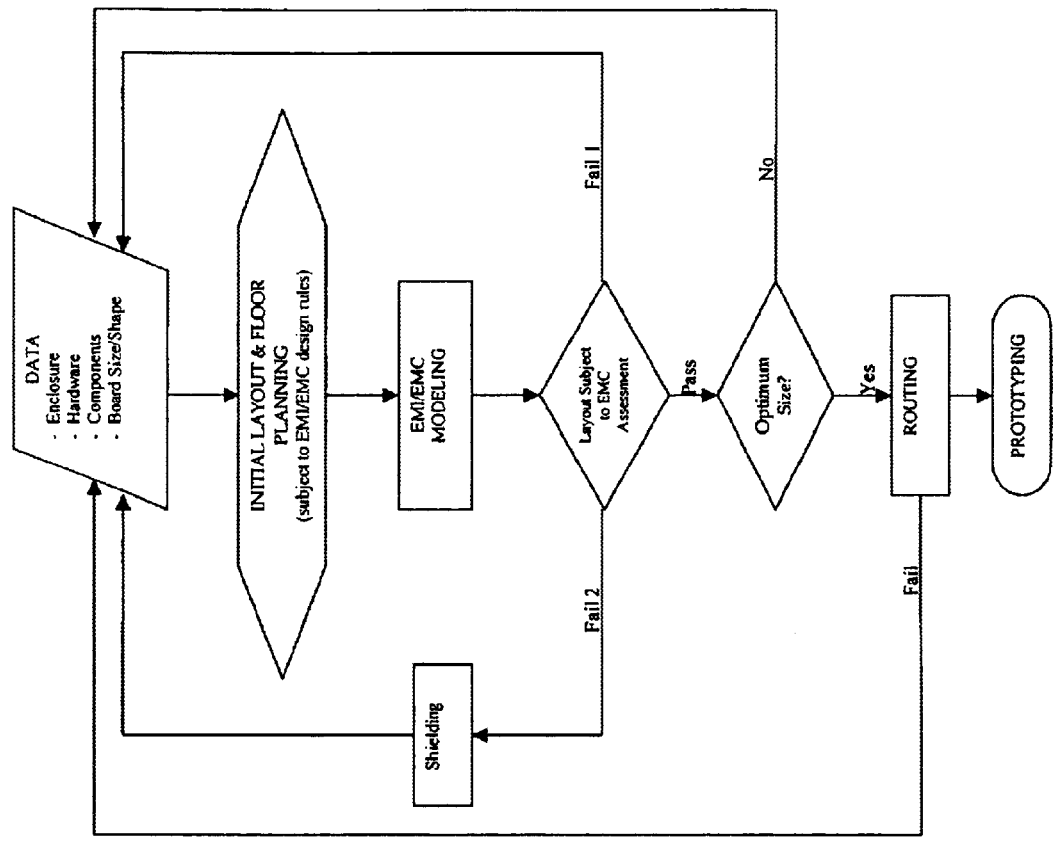
FIG. 100 shows a flowchart for a method for EMI/EMC-driven computer-aided design according to an embodiment of the invention.

In a method according to a further embodiment of the invention, task P130 includes consideration of another coupling mechanism during integrated circuit design: semiconductor substrate-induced interference or 'substrate coupling,' which may occur through parasitic displacement and/or conduction current flow in a semiconductor substrate caused by passive and/or active devices. Consideration of such phenomena allows optimization of a circuit layout to suppress such interference, helps to guide the design of appropriate guard rings for improved isolation, and enables the design of on-chip passive devices by taking into account the impact of ohmic loss and/or substrate capacitance on their performance. FIG. 100 shows a flowchart for a method of EMC-driven design according to another embodiment of the invention.

A method, system, or apparatus for automated layout of electronic devices and/or systems according to an embodiment of the invention may be applied to the design of devices and systems at any level of granularity. For example, the term 'component' as used herein may refer in one context to a component formed on a semiconductor substrate, in another context to a functional block (e.g. an analog circuit such as a resonant loop or a phase-locked loop, or a digital circuit such as a XOR gate or microprocessor) within an integrated circuit, in another context to a silicon chip or die, in another context to a discrete package, and in yet another context to a circuit module. As noted above, certain modifications may be appropriate to different levels of granularity (e.g. accounting for substrate coupling in the design of integrated circuits).

Testing for Diagnostics and Product Evaluation

Design of a portable wireless electronic device is typically performed in two stages. In the first stage, a 'stretch board' is built to validate the design concept. Once the concept has been validated, the circuit is reduced in size to fit a designated form factor. At this point, two problems may arise. First, the reduced device may not perform at the same level (or, in extreme cases, may not function at all) due to one or more self-interfering mechanisms that appear only upon miniaturization. Unfortunately, the nature of the particular mechanisms, and the correspondingly appropriate remedy, is often unknown to the designer, and corrective action is often taken in an expensive and blind trial-and-error approach.

Second, the reduced device may produce undesirable emissions. For example, a portable wireless device may include an unbalanced or embedded antenna that causes the circuit board's ground plane to radiate as the other leg of a dipole. In a broader context, the energy emitted by an electronic device may present a potential safety hazard to a user and/or may affect the operation of nearby devices. Before such a device is offered for sale or used in a work environment, its supplier may be required to demonstrate that the device is safe to the user (and possibly other persons) as defined by regulation, at least in its intended use. A supplier may also be required to demonstrate that the device will not interfere with the operation of other devices. For example, industry and/or governmental regulations may require a supplier to establish that the device is in compliance with certain emissions limits.

In addition to issues of electromagnetic interference and regulatory compliance, unwanted emissions by an electronic device also represent wasted power. For a battery-powered device such as a cellular telephone or portable computer, reducing such emissions may also result in the benefit of extended battery life.

In some instances, computational modeling may be used during the design phase to establish that the emissions generated by a intentional radiator do not affect the operation of the final product and/or do not exceed a particular level (i.e. as measured at a specified distance and/or direction from the device). However, many electronic devices are too complicated for such modeling to be feasible. In addition to one or more intentional radiators of electromagnetic energy (such as an antenna), for example, an electronic device may also include unintentional radiators of electromagnetic energy (e.g. a printed circuit board coupled to an unbalanced antenna). In such cases, laboratory measurement must be conducted to establish compliance.

Electromagnetic compliance and pre-compliance testing procedures may be expensive to perform. For example, such procedures typically require specialized equipment and an anechoic chamber. Unfortunately, when an electronic device fails to meet the required emissions limits, it is often difficult to identify the cause. Remedial actions that may be taken to bring the device into compliance without exceeding other requirements (e.g. regarding size, cost, and/or weight) include adding shielding, redesigning one or more printed circuit boards, and/or changing the location of an antenna. However, such actions are often taken based only on intuition or experience gained from similar situations in the past, without a demonstrable understanding of the mechanism of failure in the present instance. When taken without such understanding, remedial actions may even exacerbate the emissions problem. This lack of understanding may lead to a costly trial-and-error series of compliance test cycles.

It is desirable to reduce the costs of compliance and pre-compliance testing. It is also desirable to provide information regarding a mechanism of failure in a compliance test. It is further desirable to provide information regarding mechanisms of self-interference in an electronic device.

Figure 81:
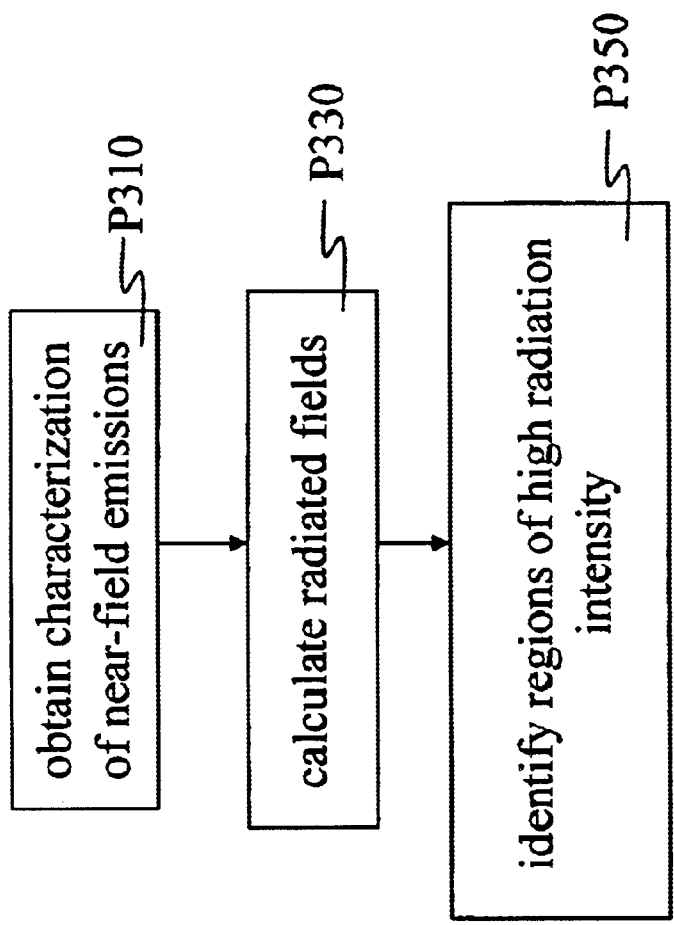
FIG. 81 shows a diagnostic method according to an embodiment of the invention.

FIG. 81 shows a flowchart for a diagnostic method according to an embodiment of the invention. Task P310 obtains a characterization of the near-field emissions of a device under test. In an exemplary application, the device under test includes at least one active device, i.e. a discrete component whose operation involves the activity of a semiconductor junction. Examples of active devices include integrated circuits and transistors.

In one implementation, the near-field emissions characterization includes a representation of a magnetic field vector (e.g. an intensity value and a direction) at each of a number of sampling points within the reactive near-field region of the device under test (e.g. less than approximately $\lambda/2\pi$ from the surface of the device, where $\lambda$ is the wavelength of the frequency of interest). As described above, a quasi static approximation may be applied to near-field emissions in this region, and one or more sensors and a positioning device as described herein may be used to collect such a characterization. In one example, the sampling points reside in a plane at a specified distance from a surface of the device under test. In other implementations, task P310 may obtain a different characterization of an emitted magnetic field and/or a characterization of a different emitted field.

Task P310 may obtain the emissions characterization from a data file (e.g. on one or more magnetic, optical, phase-change, or other non-volatile media) or from an array in storage (e.g. on a semiconductor random-access memory). Alternatively, task P310 may include collection of the emissions characterization by measurement as described herein (e.g. over one or more planes or volumes defined with respect to the DUT). In an exemplary implementation, the emissions characterization relates to emissions at one or more specified frequencies or ranges of frequencies (e.g. a carrier frequency range of a transmitting device, or an internal operating frequency such as an intermediate, mixing, or local oscillator frequency). Depending on the nature of the device under test and/or the particular test criteria, task P310 may include applying and/or controlling a test signal inputted to the device under test. For example, task P310 may include varying an amplitude, frequency, and/or modulation of an applied signal and/or changing the terminals of the device under test to which the signal is applied.

Task P330 calculates a radiation intensity of the device under test at one or more predetermined distances and/or directions. For example, task P330 may calculate a radiation intensity of the DUT everywhere within a specified volume (e.g. to a specified resolution). The radiation intensity may be expressed in such terms as power density (e.g. watts per kilogram or watts per square centimeter), electric field strength (e.g. volts per meter), or magnetic field strength (i.e. current densities, expressed e.g. in amperes per meter) and may be represented as one or more matrices, arrays, images, or files. Task P330 may assume transmission across free space and/or may perform the calculation with respect to a transmission path that includes one or more transmission media as characterized in terms of specific parameters such as permittivity and permeability. For example, task P330 may receive the characteristics of the transmission path from storage, via user input, or from another process. The description of the transmission path or medium may also include shielding materials, as indicated by such characteristics as position, shape, and composition.

The calculation of task P330 may be limited to a particular frequency or set or range of frequencies. For example, task P330 may include calculation of a current density at each of a number of points in a plane above the surface of the device under test and within the reactive near-field region (e.g. as the curl of a tangential magnetic field vector measured as described herein). Various transformations may be applied in calculating the radiation intensity, such as Huygens-Fresnel, modal expansion, Green's Theorem, and/or Fourier transform. Task P310 and/or task P330 may also account for measurement artifacts such as the transfer function of a measurement sensor and/or loading of the transmission lines over which the measurement signal is received.

Task P350 receives the intensities calculated by task P330 and identifies points or regions of high radiation intensity. For example, task P150 may include comparing the calculated intensities with one or more predetermined threshold values (e.g. as in task P355 of FIG. 82). Task P350 (P355) may output results indicating locations of sources and mechanisms responsible for EMI/EMC violations (e.g. using one or more false-color or other images or plots as described herein).

Figure 82:
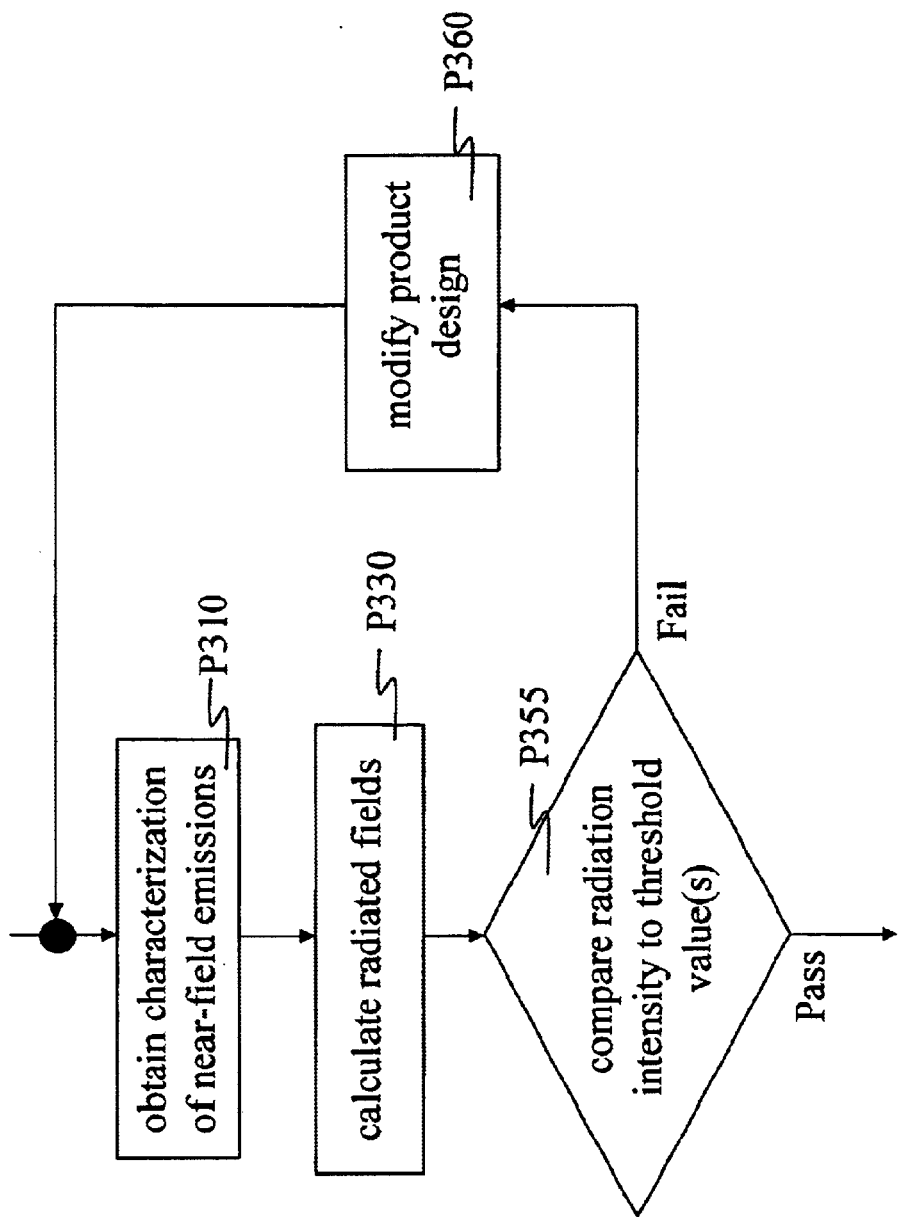
FIG. 82 shows a diagnostic method according to an embodiment of the invention.

FIG. 82 shows a flowchart for a diagnostic method according to another embodiment of the invention. In task P360, the design of a product under test is modified according to the results indicated in task P155. For example, shielding may be added or modified (e.g. between coupling elements, around a hot spot, and/or around the device itself), layout of the printed circuit board may be redesigned (e.g. to separate radiating elements from susceptible elements), and/or the location of an antenna may be altered (e.g. to reduce coupling to, and subsequent radiation by, a ground plane).

Figure 83:
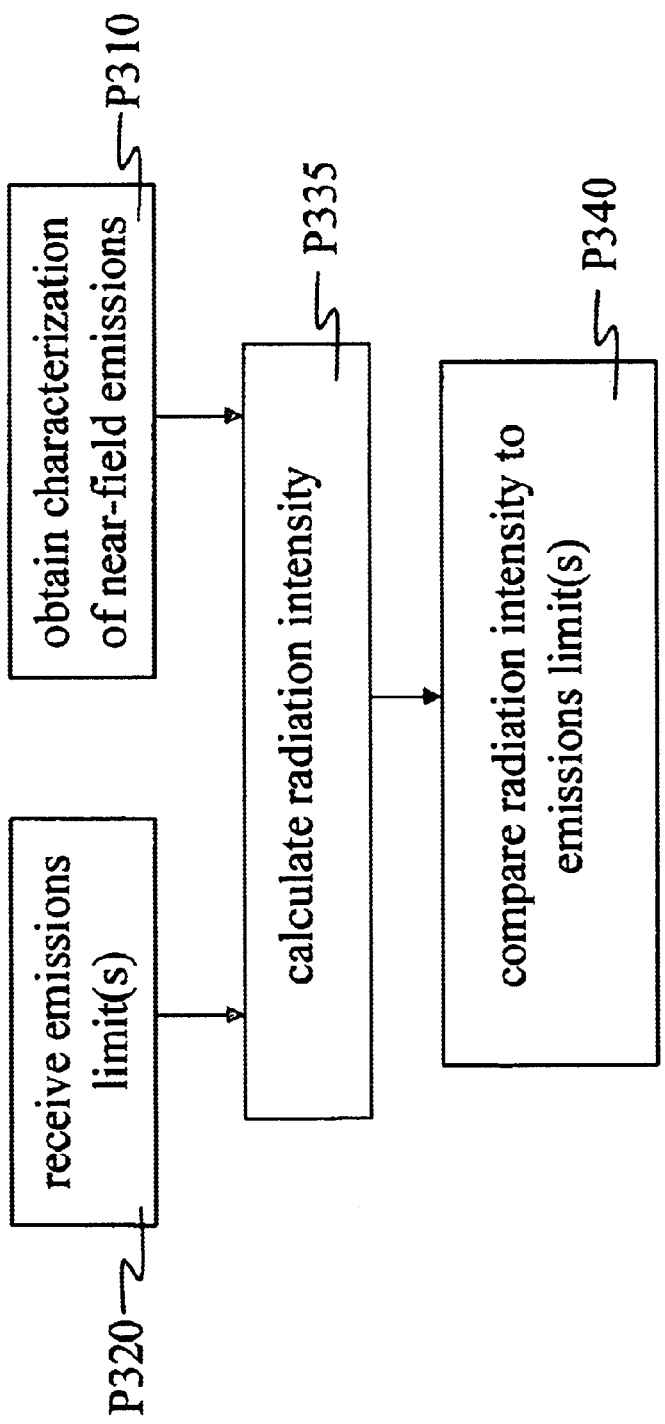
FIG. 83 shows an evaluation method according to an embodiment of the invention.

FIG. 83 shows a flow chart for an evaluation method according to another embodiment of the invention. Task P320 receives an emissions limit that specifies one or more maximum radiation intensities at particular distances and/or in particular directions from the device under test. The emissions limit may also specify a particular frequency or range of frequencies to which each maximum radiation intensity applies. Each maximum radiation intensity may be expressed in terms such as power density (e.g. watts per kilogram or watts per square centimeter), electric field strength (e.g. volts per meter), or magnetic field strength (e.g. amperes per meter). For example, a regulatory or industry standards limit for far-field emissions may be specified at about three meters from the device and at (or within some range of) the carrier frequency of the device. Task P335 receives the emissions characterization and the emissions limit and calculates the radiation intensity (e.g. as described with respect to task P330, and possibly at a distance and/or frequency as specified by the emissions limit).

One area of safety compliance testing involves measurement of SAR (specific absorption rate) of RF radiation by human tissue. For example, a transmitting device such as a cellular telephone may be tested to evaluate its effect on the user. Regulatory limits on SAR are typically specified at a distance of up to 5 cm from the device and at (or within some range of) the carrier frequency of the device. In such an application, task P135 may calculate the radiation intensity of the device under test in a medium defined by specific parameters such as permittivity and permeability (i.e. in addition to, or in the alternative to, calculating the radiation intensity in free space). For example, the definition of such a medium may be selected to approximate the electromagnetic characteristics of the human skull and brain or of other body parts.

Task P340 compares the calculated radiation intensity with the emission limit(s) as received in task P320. As in task P350 described above, the results of task P340 (P345) may indicate locations of sources and mechanisms responsible for EMI/EMC violations.

Figure 84:
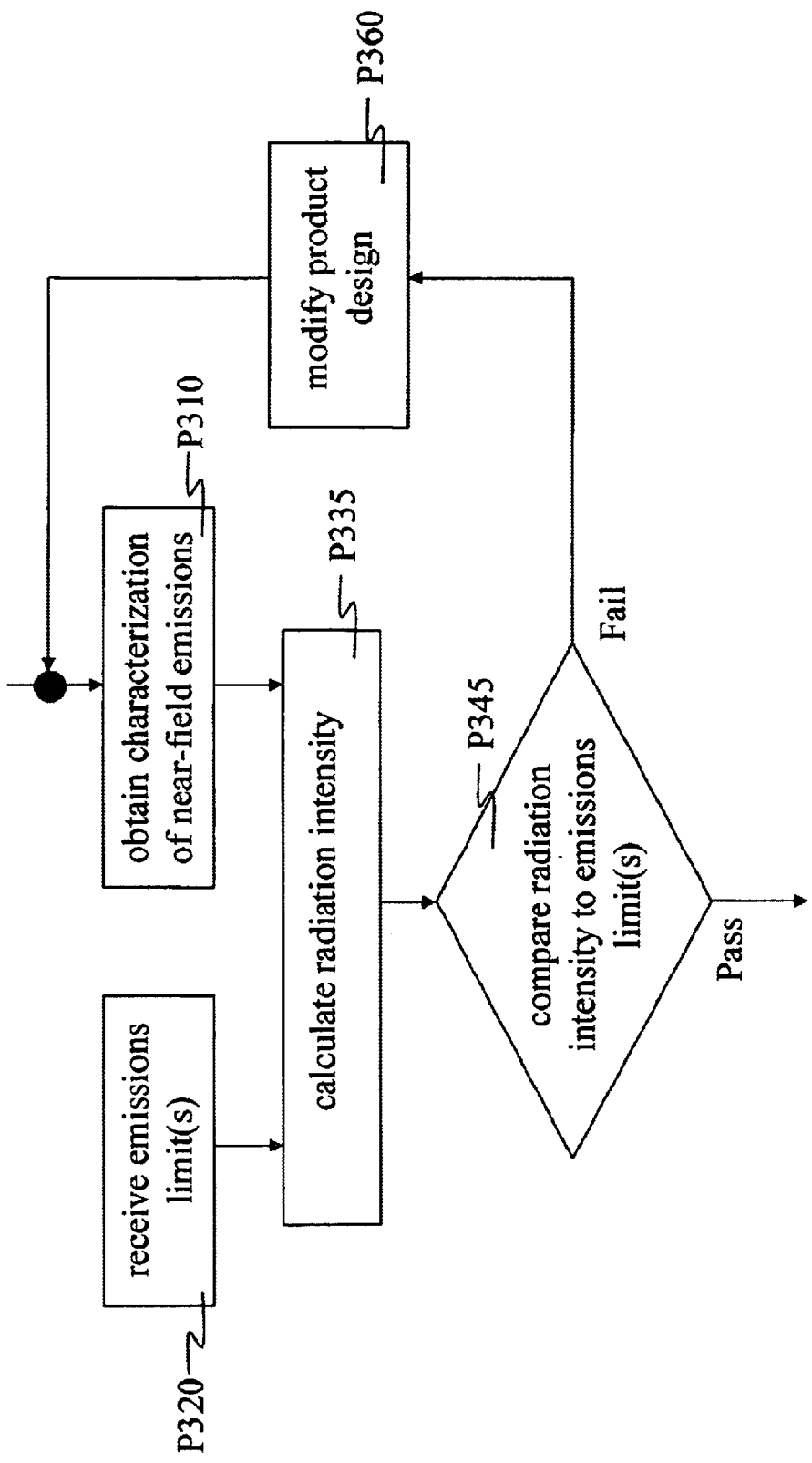
FIG. 84 shows an evaluation method according to an embodiment of the invention.

An evaluation method as shown in FIG. 83 may be used to perform pre-compliance testing. For example, a pre-compliance test may use one emissions measurement to check compliance with both SAR and far-field limits, identifying problem regions for evaluation and possible redesign before the actual compliance test is performed. FIG. 84 shows a flowchart for a method including modification task P360 as described above, wherein redesign of the device (e.g. according to the results indicated by task P345) may be performed before re-testing. In a method according to a further implementation of the invention, emissions limits (such as SAR and far-field) may be incorporated as design criteria in a virtual prototyping application as described herein.

In additional applications, an emissions limit as received in task P120 may relate to a susceptibility of a part of the device itself to the energy radiated by another part of the device (e.g. as indicated by a susceptibility profile collected and/or stored as described herein).

Although applications to testing of cellular telephones and portable computers are described herein, a method according to an embodiment of the invention may be applied to the testing of any electronic device having an active device. An active device is a discrete component whose operation involves the activity of a semiconductor junction. Examples of active devices include integrated circuits and transistors.

Figure 85:
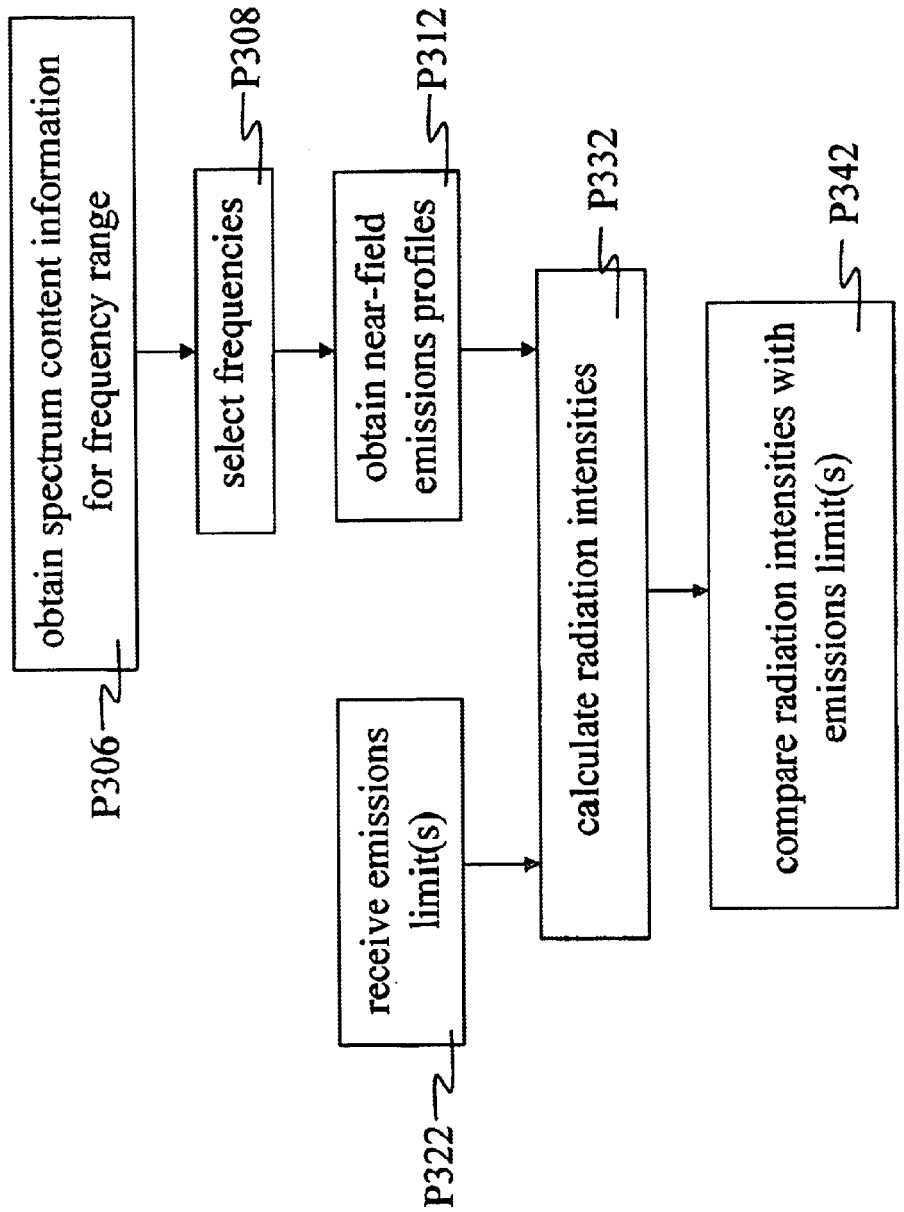
FIG. 85 shows a method of emissions measurement according to an embodiment of the invention.

FIG. 85 shows a flowchart of a method of emissions measurement according to a further embodiment of the invention. Task P306 obtains spectrum content information for a device under test (e.g. an integrated circuit) over a selected frequency range as described herein. For example, task P306 may obtain a spectral content figure of merit (SCFM) over a broadband range. Task P308 selects a number of frequencies within the selected frequency range for further evaluation. For example, task P308 may select frequencies at which the spectrum content information exceeds a predetermined threshold. Task P322 receives one or more emissions limits that may each include a distance and a radiation threshold. Alternatively, task P322 may receive a number of emissions limits corresponding to the selected frequencies. Task P312 obtains near-field emissions profiles for the selected frequencies, task P332 calculates corresponding radiation intensities, and task P342 compares the radiation intensities with the emissions limit(s), all as described herein. The spectrum content information of the device as obtained in task P306 may be stored and/or forwarded for use in other applications as well: for example, system-level applications such as frequency planning and/or floor planning.

The foregoing presentation of the described embodiments is provided to enable any person skilled in the art to make or use the present invention. Various modifications to these embodiments are possible, and the generic principles presented herein may be applied to other embodiments as well. For example, the invention may be implemented in part or in whole as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a microprocessor or other digital signal processing unit. Thus, the present invention is not intended to be limited to the embodiments shown above but rather is to be accorded the widest scope consistent with the principles and novel features disclosed in any fashion herein.

Application Areas

In this section of the description, results obtained in several different applications of systems, methods, and apparatus according to particular embodiments of the invention are discussed. This discussion relates to particular embodiments of the invention and does not limit the more general description of other embodiments as presented herein.

Figure 86:
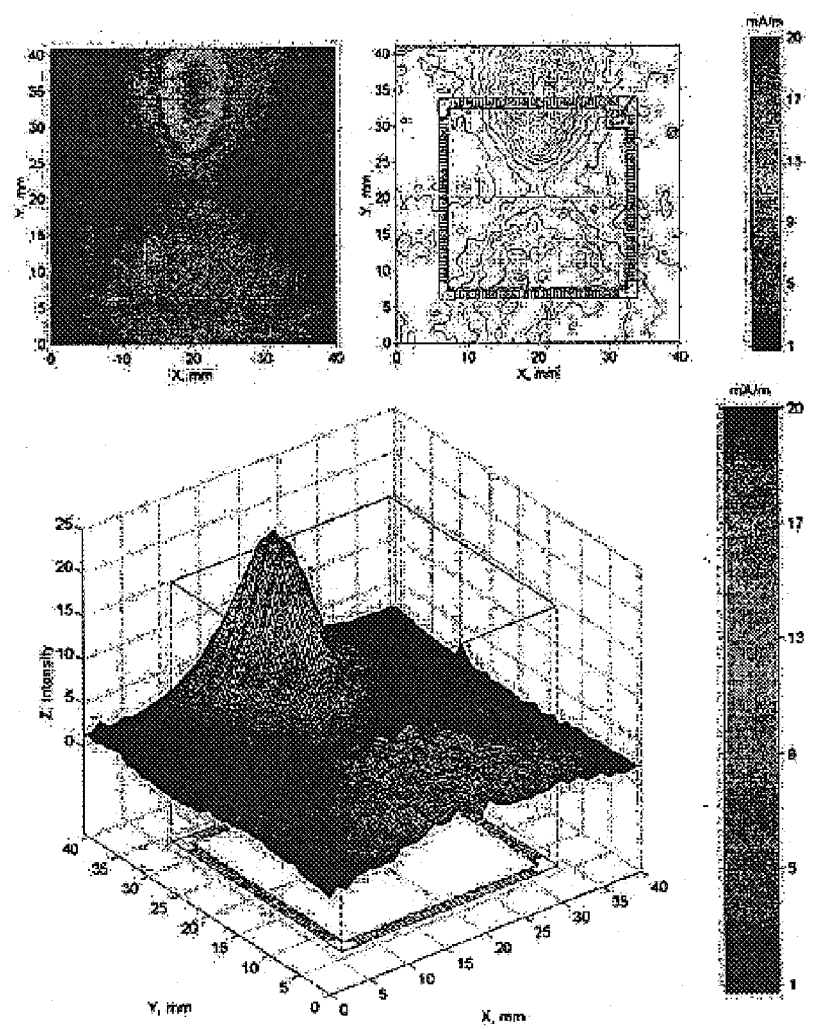
FIG. 86 shows an emissions profile for a VLSI chip at about 12 MHz.
Figure 87:
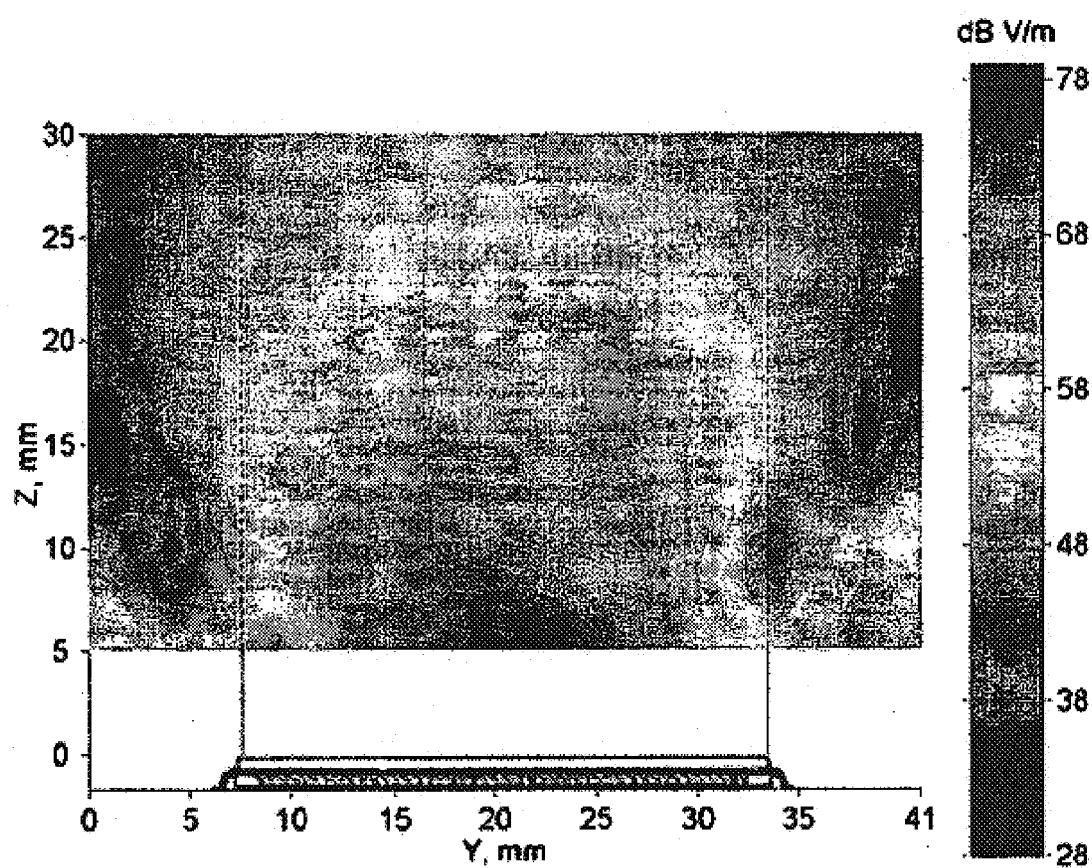
FIG. 87 shows an emissions profile for a VLSI chip at about 60 MHz.

ASIC Characterization: FIGS. 86 and 87 show emissions signatures of a VLSI chip at about 12 and about 60 MHz. Measurements were carried out at 1-mm increments using a magnetic field sensor positioned five mm above the chip. The profiles indicate levels and extent of the field on and around the package. The three-dimensional cross section was obtained from magnetic field measurements on six separate planes, five mm apart.

Figure 88:
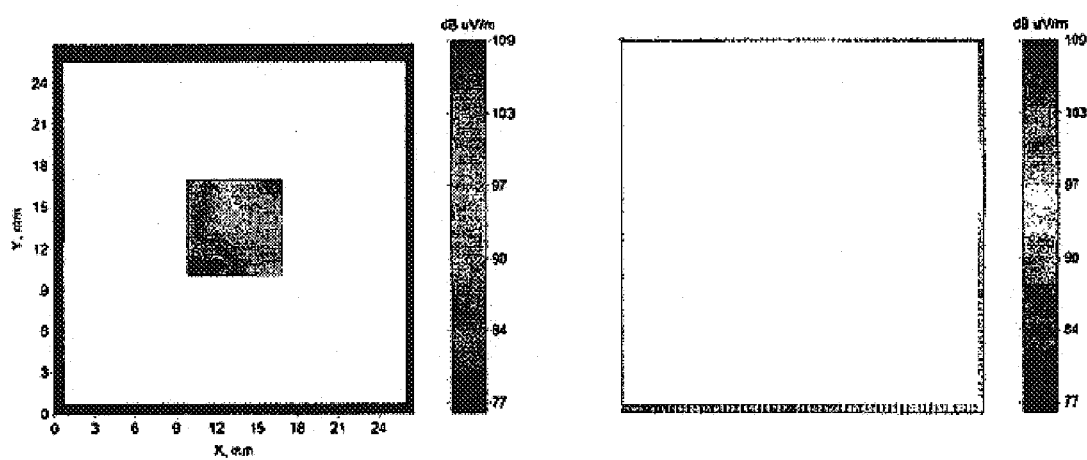
FIG. 88 shows an electric field signature of a VLSI die at about 20 MHz.
Figure 89:
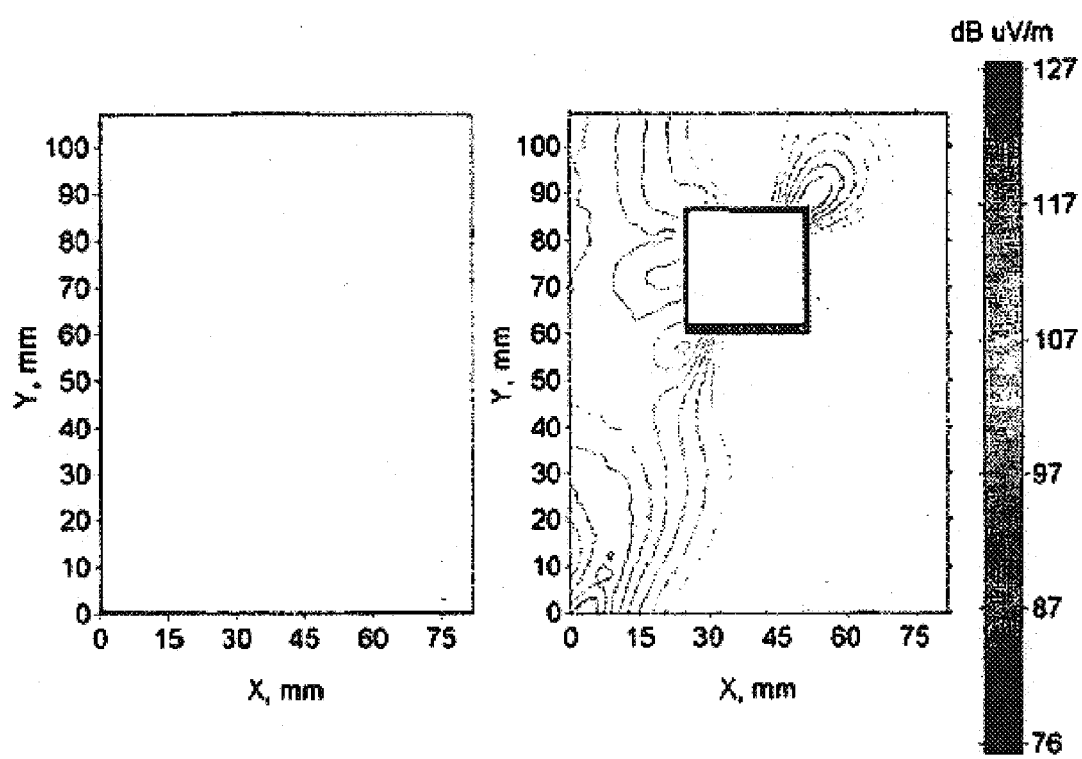
FIG. 89 shows results of an E field scan of areas of a board (left) and a VLSI chip (right) affected by radiation at about 20 MHz.
Figure 90:
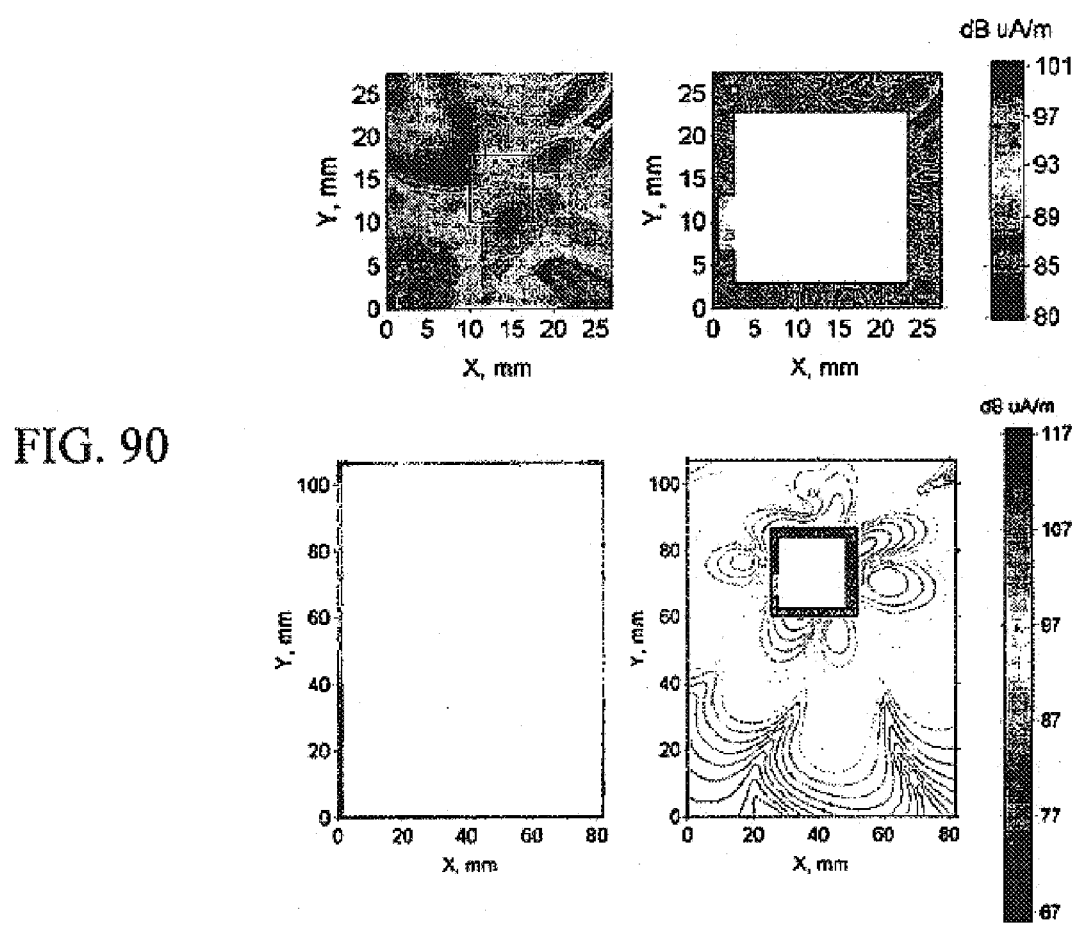
FIG. 90 shows false-color and contour plots of magnetic field emission profiles of a VLSI die (top) and a board (bottom) at about 20 MHz.

ASIC Hardware Verification: Near-field measurements of a VLSI chip and board indicate RF coupling due to radiation. FIGS. 88–90 show areas of the VLSI die and package. In FIG. 88, the profile was obtained by using a 130-micron E-field sensor scanning in a plane 2 mm above the die.

Figure 91:
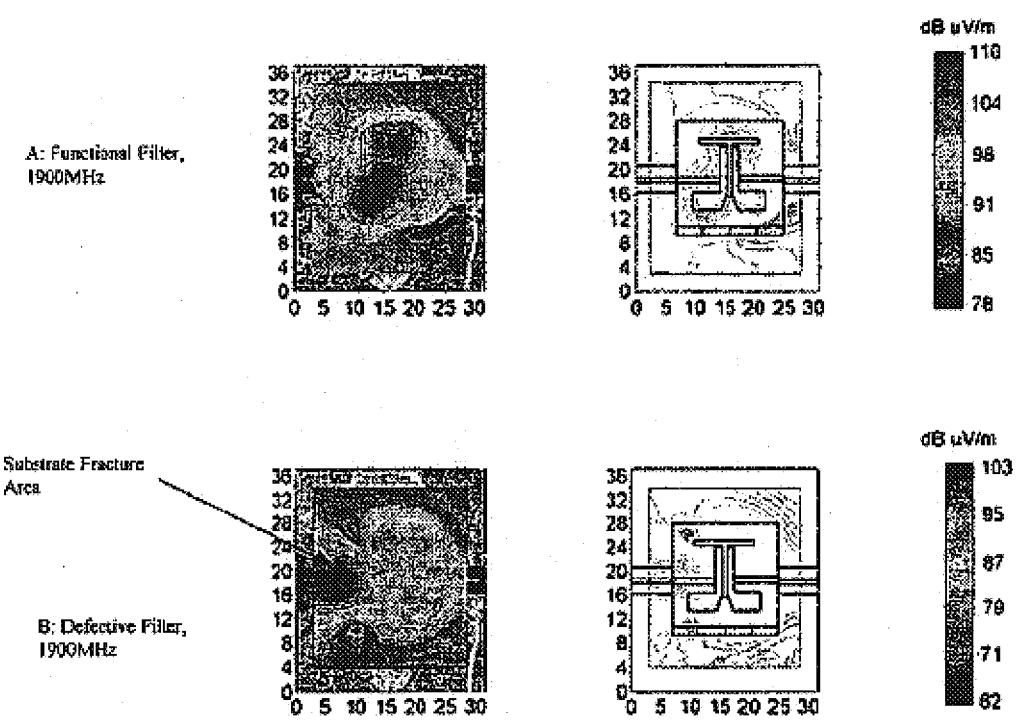
FIG. 91 shows E-field emissions profiles of a functional filter (A) and a defective filter (B).

Component Characterization and Diagnostics: The passband filter used in these tests was fabricated on a 25 mil thick alumina substrate. Of the two units submitted for emissions tests, one had a fracture on the substrate at the input area. FIG. 91B shows that the defective filter radiates in the input area due to mismatch caused by the fracture. Dimensions on the X and Y axes in FIGS. 91A, B are in mm.

Product and System Level Measurements: Typical fundamental switching frequencies of AC adapters are between 30 to 200 KHz. Emissions at these frequencies may arise from both common mode and differential mode sources. Imbalances in stray capacitance, which are widely distributed and unpredictable, may convert these currents and voltages into interference signals. In practical applications, several coupling mechanisms could be operating at the same time. Dependence of the stray capacitance on proximity to other objects when the adapter is unshielded or partially shielded could exacerbate the problem.

Figure 92:
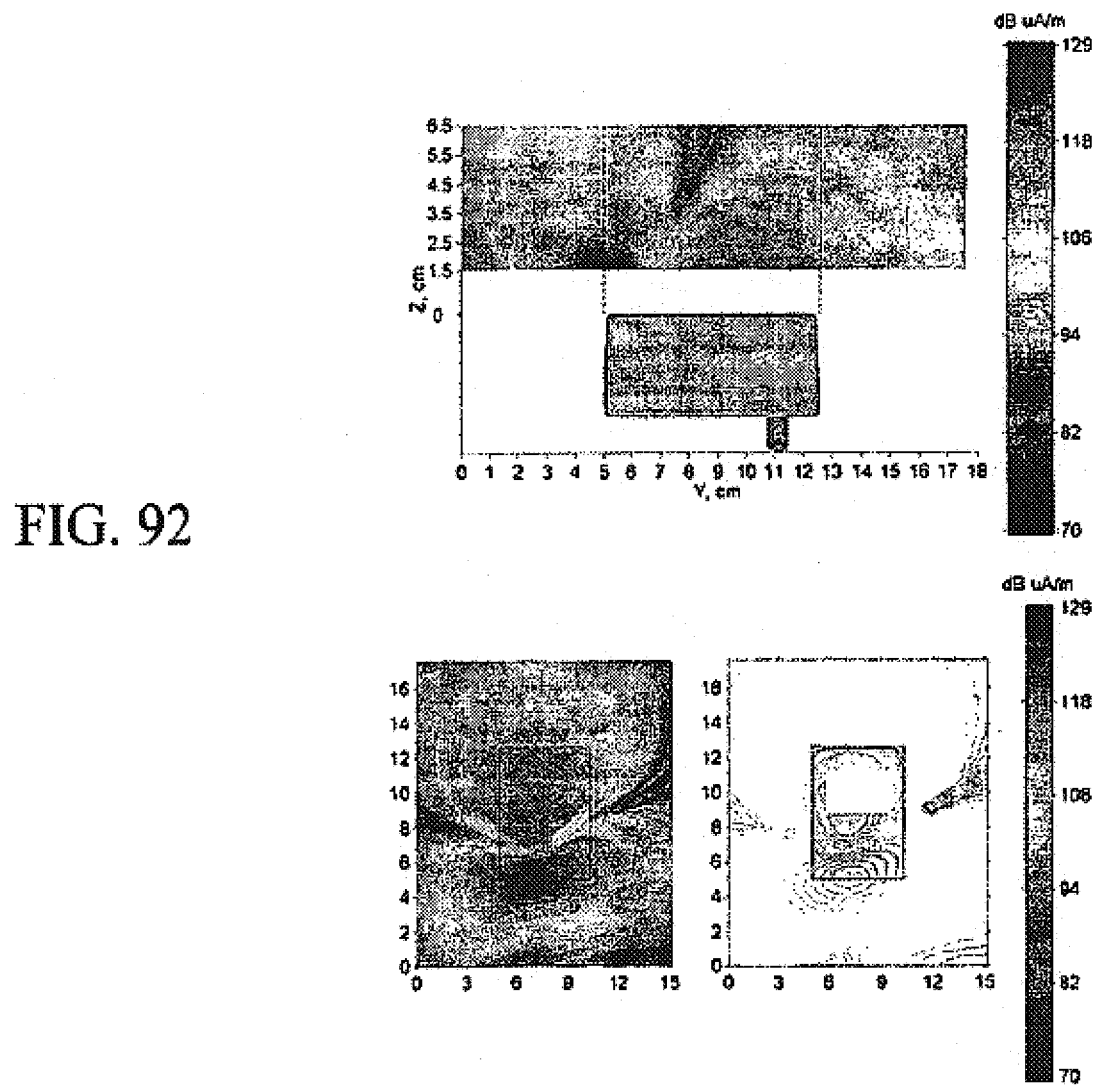
FIG. 92 shows emissions profiles of an AC adapter at its fundamental switching frequency (about 65 kHz).

In FIG. 92, results are presented from a test of an AC adapter rated at 12V, 2.5 A, switching at about 65 KHz. Magnetic field profile is obtained by scanning over six separate planes, one cm apart.

Figure 93:
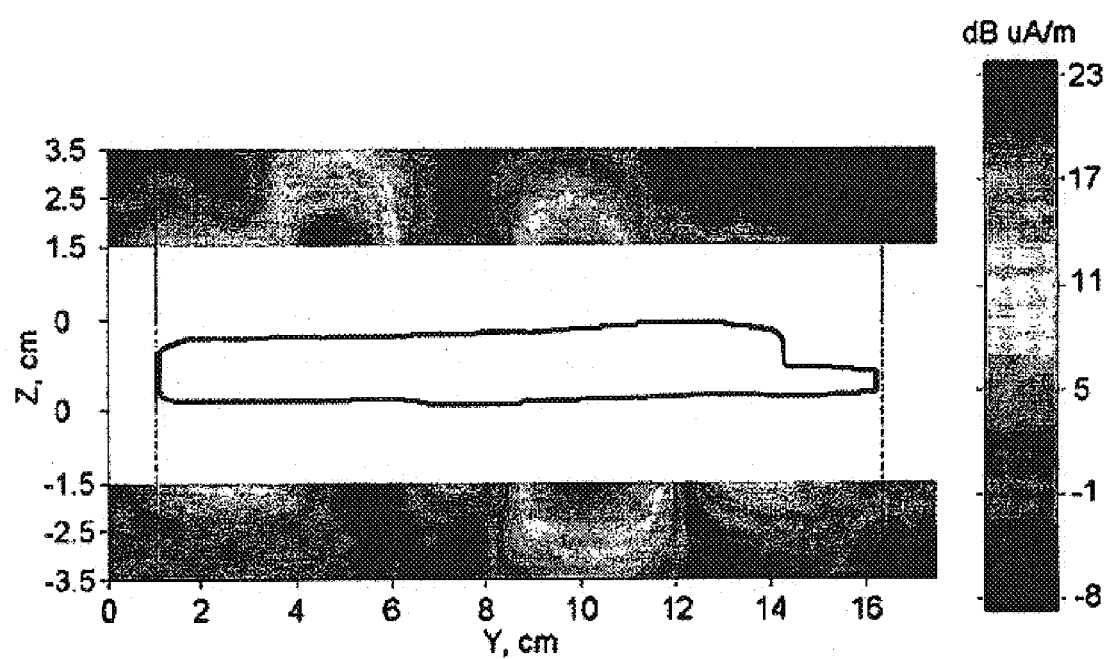
FIG. 93 shows an emissions profile of a cellular phone at about 340 MHz.
Figure 94:
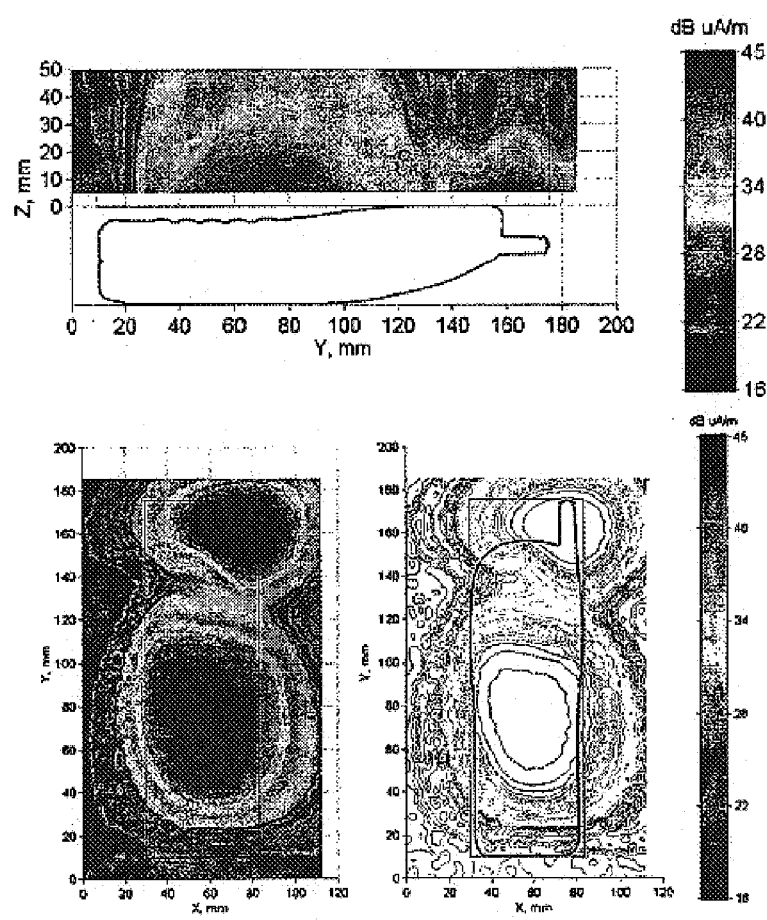
FIG. 94 shows an emissions profile of a cellular phone at about 60 MHz as obtained by a magnetic field sensor constructed according to an embodiment of the invention.
Figure 95:
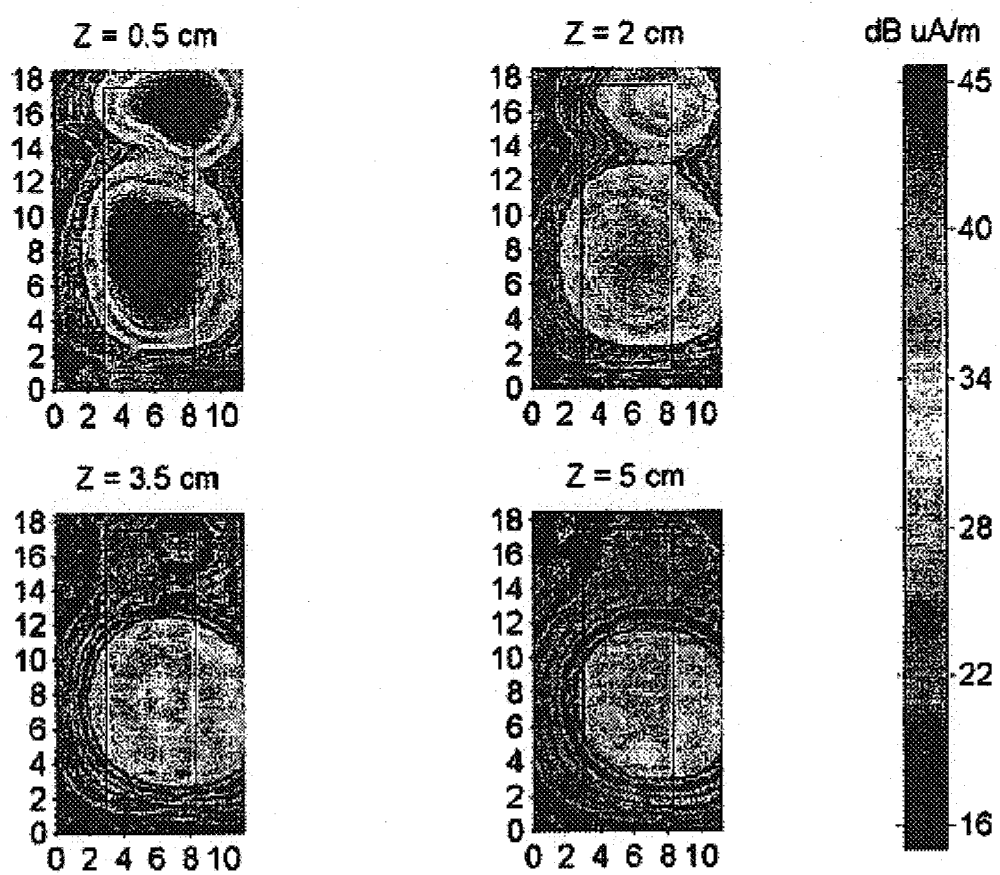
FIG. 95 shows a near-field signature of the cellular phone shown in FIG. 94 measured at four separate planes above the product at about 60 MHz using a magnetic field sensor constructed according to an embodiment of the invention.

Product and System Level Measurements: FIG. D8 shows an emission signature of a cellular phone at about 340 MHz. This signature was constructed from magnetic field measurements in three planes above and below the phone. The phone was powered by a battery during the test. Such measurements may provide insight into effectiveness of shielding materials and techniques used in the construction of wireless products. The phone shielding design in this specific case incorporated conductive polymers at device and board levels. Magnetic field scans of a different cellular phone at about 60 MHz are presented in FIGS. 92 and 93.

Figure 96:
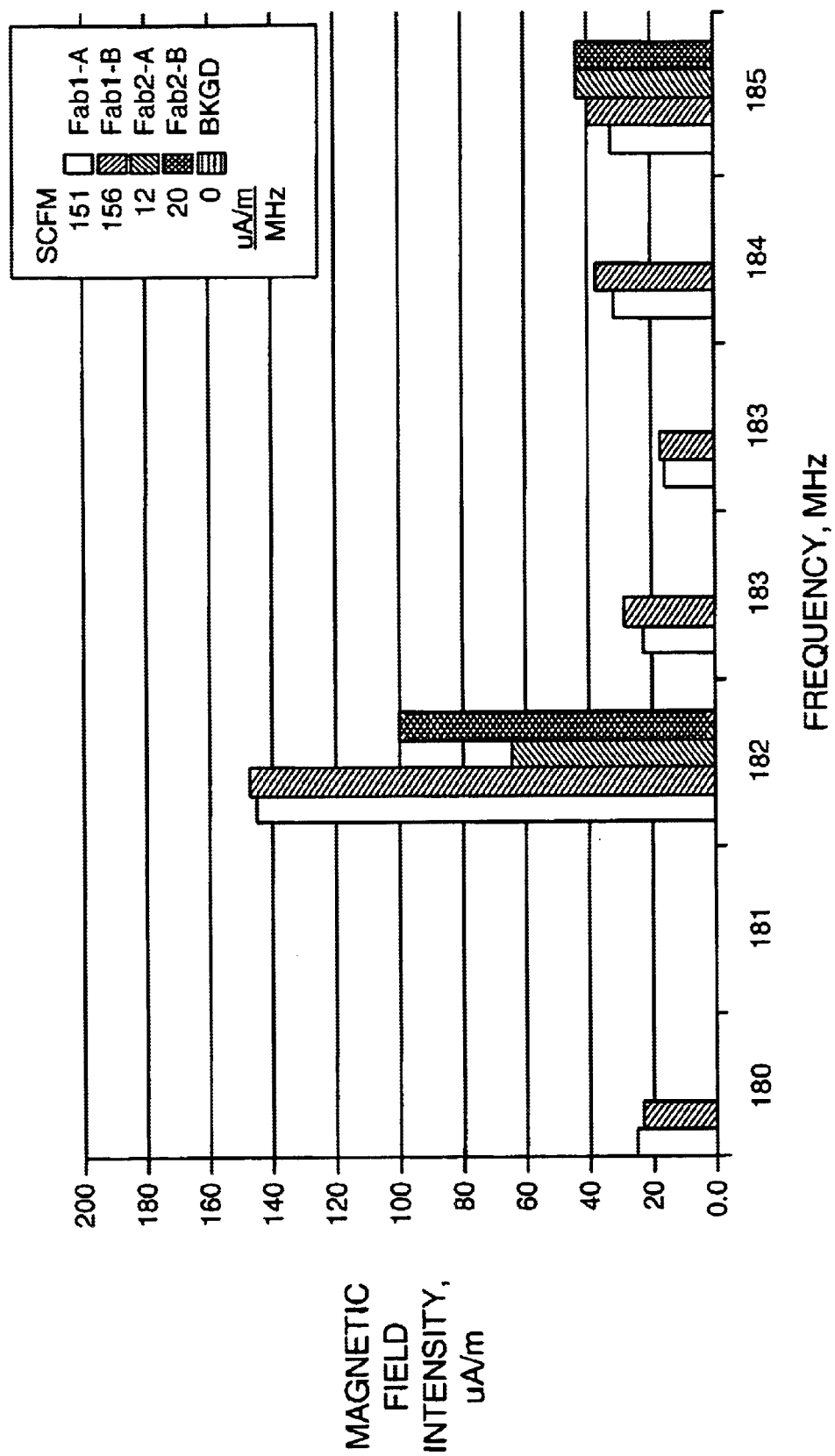
FIG. 96 shows a comparison of spectrum content of VLSI chip samples made by two different foundries, measured between 180–185 MHz.

Device Emission Measurements: FIG. 96 shows that undesired signals radiated by a sample produced by one foundry (Fab 1), due to its higher bandwidth of emissions, accounted for system level interference problems in a wireless product designed around the same VLSI chip as produced by another foundry (Fab 2).

Figure 97:
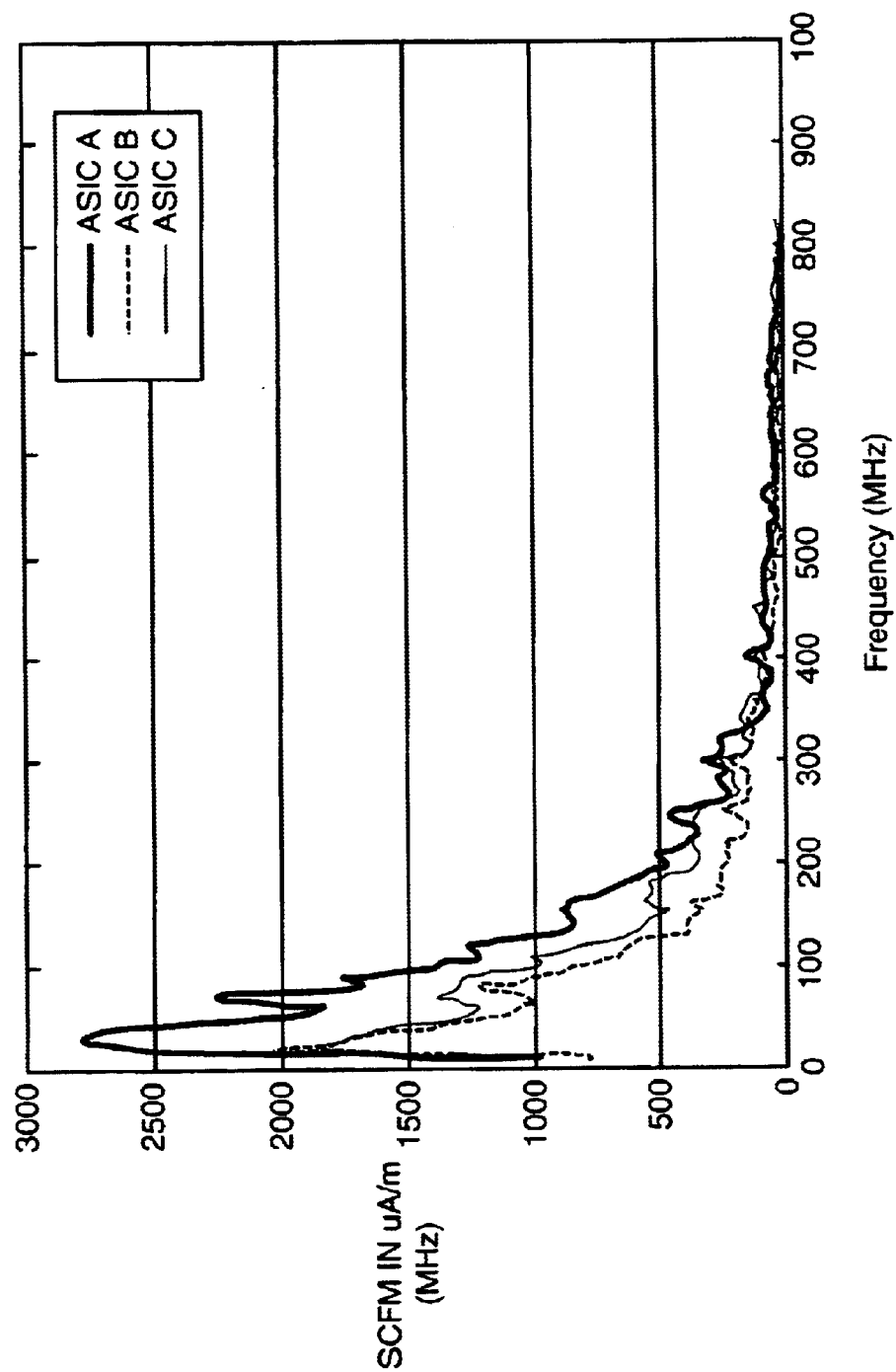
FIG. 97 shows a comparison of emission spectra of three ASICs A, B, and C as fabricated using process sizes of 0.42, 0.35, and 0.25 microns, respectively.

Device Spectrum Content Figure of Merit: FIG. 97 shows a comparison of emission spectra of three ASICs A, B, and C (fabricated using process sizes of 0.42, 0.35, and 0.25 microns, respectively) over a range of 0–1000 MHz.

RF ASIC circuit board layout design: Transistors are current switches. Therefore, in addition to their normal signal processing or amplification operation, they may exhibit an unintentional, parasitic, broadband radiation behavior. While the radiation efficiency of a typical transistor is very low due to the device's small size, the potential exists for radiated emissions from one or more transistors (unless properly shielded) to couple to adjacent conducting structures, thus causing secondary radiation and/or interference to adjacent components.

FIGS. 98 and 99 show results of tests conducted on the near field of a switching transistor. A circuit board was designed to test the performance of a power amplifier incorporating two transistors, in a case where a form factor product definition (specifically, for a 10-mm square multichip module) limited the amount of board area available for the transistors. As shown in FIGS. D13 and D14, severe coupling is present at the center of the board where the transistors are mounted, notably on the collector wire bonds. In addition, there is indication of poor isolation between the two input channels due to an improperly designed board layout. The false-color image accurately visualizes amplifier gain and cross-channel gain as verified through network analyzer measurements.

FIG. 98 shows magnetic field emissions profiles with a signal applied to the top transistor only. The profiles show electromagnetic coupling between the transistors and via the ground patches separating the input and output lines. The higher resolution image (bottom) identifies a mechanism of coupling between the two power transistors (frequency 1900 MHz).

FIG. 99 shows magnetic field emissions profiles measured at three separate planes above the test circuit. The bottom image shows a cross-section of the three-dimensional magnetic-field emissions profile above the board at the midpoint of the X-axis (frequency 1900 MHz).

We claim:

1. An apparatus for electromagnetic compatibility-driven design, said apparatus comprising:

an electromagnetic field calculator configured and arranged to receive (A) placement information relating to a relative placement of a plurality of circuit components and (B) at least one emissions profile, each emissions profile corresponding to one among the plurality of circuit components; and an electromagnetic interference calculator coupled to the electromagnetic field calculator and configured and arranged to receive at least one susceptibility profile, each susceptibility profile corresponding to one among the plurality of circuit components, wherein the electromagnetic field calculator is further configured and arranged to output information regarding an induced electromagnetic field, and wherein the electromagnetic interference calculator is further configured and arranged to receive the information regarding an induced electromagnetic field and to output information regarding effects caused by the induced electromagnetic field;

wherein each among said at least one emissions profile includes results of a plurality of electromagnetic near-field measurements, and wherein for at least one emissions profile, each among said plurality of electromagnetic near-field measurements is associated with a location in a grid, said grid having boundaries and at least two spatial dimensions, and wherein the information regarding an induced electromagnetic field includes a plurality of amplitudes of the induced electromagnetic field, and wherein each among the plurality of amplitudes corresponds to one among a plurality of spatial locations, and wherein at least one among the plurality of spatial locations lies outside the boundaries of said grid.

2. The apparatus for electromagnetic compatibility-driven design according to claim 1, wherein the electromagnetic field calculator is further configured and arranged to receive a circuit description, the circuit description including (E) at least one circuit component characterization, each circuit component characterization corresponding to one among the plurality of circuit components, and (F) connectivity information, said connectivity information relating to at least one electrical pathway, each electrical pathway connecting at least two among the plurality of circuit components.

3. The apparatus for electromagnetic compatibility-driven design according to claim 2, wherein the circuit description includes a schematic representation.

4. The apparatus for electromagnetic compatibility-driven design according to claim 2, wherein the circuit description includes a plurality of expressions in a hardware description language.

5. The apparatus for electromagnetic compatibility-driven design according to claim 2, wherein the circuit description includes a netlist.

6. The apparatus for electromagnetic compatibility-driven design according to claim 1, wherein the electromagnetic field calculator is further configured and arranged to receive information relating to at least one among a characteristic and a location of an electromagnetic shielding element.

7. The apparatus for electromagnetic compatibility-driven design according to claim 1, wherein each among said at least one emissions profile includes results of a plurality of electromagnetic near-field measurements.

8. The apparatus for electromagnetic compatibility-driven design according to claim 7, wherein for at least one emissions profile, each among said plurality of electromagnetic near-field measurements is associated with a location in a grid, said grid having at least two spatial dimensions.

9. The apparatus for electromagnetic compatibility-driven design according to claim 7, wherein for at least one emissions profile, each among said plurality of electromagnetic near-field measurements includes an amplitude and a direction.

10. The apparatus for electromagnetic compatibility-driven design according to claim 1, wherein the placement information includes information relating to relative spatial locations and orientations among said plurality of circuit components.

11. The apparatus for electromagnetic compatibility-driven design according to claim 10, wherein the placement information includes information relating to relative spatial dimensions of said plurality of circuit components.

12. The apparatus for electromagnetic compatibility-driven design according to claim 1, wherein each susceptibility profile represents a response of the corresponding circuit component to an electromagnetic field produced by a source of predetermined character and location.

13. A method for electromagnetic compatibility-driven design, said method comprising:

calculating an induced electromagnetic field based on (A) placement information relating to a relative placement of a plurality of circuit components and (B) at least one emissions profile, each emissions profile corresponding to one among the plurality of circuit components, and calculating effects of the induced electromagnetic field based on at least one susceptibility profile, each susceptibility profile corresponding to one among the plurality of circuit components, wherein each among said at least one emissions profile includes results of a plurality of electromagnetic near-field measurements, and wherein for at least one emissions profile, each among said plurality of electromaenetic near-field measurements is associated with a location in a grid said grid having boundaries and at least two spatial dimensions, and wherein the information regarding an induced electromagnetic field includes a plurality of amplitudes of the induced electromaenetic field, and wherein each among said plurality of amplitudes corresponds to one among a plurality of spatial locations, and wherein at least one among said plurality of spatial locations lies outside the boundaries of said grid.

14. The method for electromagnetic compatibility-driven design according to claim 13, wherein calculating an induced electromagnetic field is based on a circuit description including (E) at least one circuit component characterization, each circuit component characterization corresponding to one among the plurality of circuit components, and (F) connectivity information, said connectivity information relating to at least one electrical pathway, each electrical pathway connecting at least two among the plurality of circuit components.

15. A The method for electromagnetic compatibility-driven design according to claim 14, further comprising calculating a simulated circuit operation based on the placement information, the circuit description, and the calculated effects of the induced electromagnetic field.

16. The method for electromagnetic compatibility-driven design according to claim 15, further comprising comparing a result of said calculating a simulated circuit operation to at least one predetermined criterion.

17. The method for electromagnetic compatibility-driven design according to claim 16, further comprising modifying at least one among the circuit description and the placement information based on a result of said comparing.

18. The method for electromagnetic compatibility-driven design according to claim 14, wherein the circuit description includes a schematic representation.

19. The method for electromagnetic compatibility-driven design according to claim 14, wherein the circuit description includes a plurality of expressions in a hardware description language.

20. The method for electromagnetic compatibility-driven design according to claim 14, wherein the circuit description includes a netlist.

21. The method for electromagnetic compatibility-driven design according to claim 13, wherein calculating an induced electromagnetic field calculator is based on information relating to at least one among a characteristic and a location of an electromagnetic shielding element.

22. The method for electromagnetic compatibility-driven design according to claim 13, wherein each among said at least one emissions profile includes results of a plurality of electromagnetic near-field measurements.

23. The method for electromagnetic compatibility-driven design according to claim 22, wherein for at least one emissions profile, each among said plurality of electromagnetic near-field measurements is associated with a location in a grid, said grid having at least two spatial dimensions.

24. The method for electromagnetic compatibility-driven design according to claim 22, wherein for at least one emissions profile, each among said plurality of electromagnetic near-field measurements includes an amplitude and a direction.

25. The method for electromagnetic compatibility-driven design according to claim 13, wherein the placement information includes information relating to relative spatial locations and orientations among said plurality of circuit components.

26. The method for electromagnetic compatibility-driven design according to claim 25, wherein the placement information includes information relating to relative spatial dimensions of the plurality of circuit components.

27. The method for electromagnetic compatibility-driven design according to claim 13, wherein each susceptibility profile represents a response of the corresponding circuit component to an electromagnetic field produced by a source of predetermined character and location.

28. A method for electromagnetic compatibility-driven design, said method comprising:
receiving a circuit description including (A) at least one circuit component characterization, each circuit component characterization corresponding to at least one among a plurality of circuit components, and (B) connectivity information relating to at least one electrical pathway, each electrical pathway connecting at least two among the plurality of circuit components;
based on the circuit description, calculating placement information relating to a relative placement of the plurality of circuit components;
based on the placement information and at least one emissions profile, calculating an induced electromagnetic field; and
based on at least one susceptibility profile, calculating effects of the induced electromagnetic field,
wherein each emissions profile corresponds to one among the plurality of circuit components, and
wherein each susceptibility profile corresponds to one among the plurality of circuit components,
wherein each among said at least one emissions profile includes results of a plurality of electromagnetic near-field measurements, and
wherein for at least one emissions profile, each among said plurality of electromagnetic near-field measurements is associated with a location in a d said grid having boundaries and at least two spatial dimensions, and
wherein the information regarding an induced electromagnetic field includes a plurality of amplitudes of the induced electromagnetic field, and
wherein each among said plurality of amplitudes corresponds to one among a plurality of spatial locations, and
wherein at least one among said plurality of spatial locations lies outside the boundaries of said grid.

29. The method for electromagnetic compatibility-driven design according to claim 28, further comprising calculating a simulated circuit operation based on the placement information, the circuit description, and the calculated effects of the induced electromagnetic field.

30. The method for electromagnetic compatibility-driven design according to claim 29, further comprising comparing a result of said calculating a simulated circuit operation to at least one predetermined criterion.

31. The method for electromagnetic compatibility-driven design according to claim 30, further comprising modifying at least one among the circuit description and the placement information based on a result of said comparing.

32. A data storage medium having machine-readable code, the machine-readable code including instructions executable by an array of logic elements, said instructions defining a method for electromagnetic compatibility-driven design comprising:
calculating an induced electromagnetic field based on (A) placement information relating to a relative placement of a plurality of circuit components and (B) at least one emissions profile, each emissions profile corresponding to one among the plurality of circuit components, and
calculating effects of the induced electromagnetic field based on at least one susceptibility profile, each susceptibility profile corresponding to one among the plurality of circuit components,
wherein each among said at least one emissions profile includes results of a plurality of electromagnetic near-field measurements, and
wherein for at least one emissions profile, each among said plurality of electromagnetic near-field measurements is associated with a location in a grid said grid having boundaries and at least two spatial dimensions, and
wherein the information regarding an induced electromagnetic field includes a plurality of amplitudes of the induced electromagnetic field, and
wherein each among said plurality of amplitudes corresponds to one among a plurality of spatial locations, and
wherein at least one among said plurality of spatial locations lics outside the boundaries of said grid.

33. The data storage medium according to claim 32, wherein calculating an induced electromagnetic field is based on a circuit description including (E) at least one circuit component characterization, each circuit component characterization corresponding to one among the plurality of circuit components, and (F) connectivity information, said connectivity information relating to at least one electrical pathway, each electrical pathway connecting at least two among the plurality of circuit components.

34. The data storage medium according to claim 33, further comprising calculating a simulated circuit operation based on the placement information, the circuit description, and the calculated effects of the induced electromagnetic field.

35. The data storage medium according to claim 34, further comprising comparing a result of said calculating a simulated circuit operation to at least one predetermined criterion.

36. The data storage medium according to claim 35, further comprising modifying at least one among the circuit description and the placement information based on a result of said comparing.

37. The data storage medium according to claim 33, wherein the circuit description includes a schematic representation.

38. The data storage medium according to claim 33, wherein the circuit description includes a plurality of expressions in a hardware description language.

39. The data storage medium according to claim 33, wherein the circuit description includes a netlist.

40. The data storage medium according to claim 32, wherein calculating an induced electromagnetic field calculator is based on information relating to at least one among a characteristic and a location of an electromagnetic shielding element.

41. The data storage medium according to claim 32, wherein each among said at least one emissions profile includes results of a plurality of electromagnetic near-field measurements.

42. The data storage medium according to claim 41, wherein for at least one emissions profile, each among said plurality of electromagnetic near-field measurements is associated with a location in a grid, said grid having at least two spatial dimensions.

43. The data storage medium according to claim 41, wherein for at least one emissions profile, each among said plurality of electromagnetic near-field measurements includes an amplitude and a direction.

44. The data storage medium according to claim 32, wherein the placement information includes information relating to relative spatial locations and orientations among said plurality of circuit components.

45. The data storage medium according to claim 44, wherein the placement information includes information relating to relative spatial dimensions of the plurality of circuit components.

46. The data storage medium according to claim 32, wherein each susceptibility profile represents a response of the corresponding circuit component to an electromagnetic field produced by a source of predetermined character and location.

47. A data storage medium having machine-readable code, the machine-readable code including instructions executable by an array of logic elements, said instructions defining a method for electromagnetic compatibility-driven design, said method comprising:

receiving a circuit description including (A) at least one circuit component characterization, each circuit component characterization corresponding to at least one among a plurality of circuit components, and (B) connectivity information relating to at least one electrical pathway, each electrical pathway connecting at least two among the plurality of circuit components;

based on the circuit description, calculating placement information relating to a relative placement of the plurality of circuit components;

based on the placement information and at least one emissions profile, calculating an induced electromagnetic field; and based on at least one susceptibility profile, calculating effects of the induced electromagnetic field, wherein each emissions profile corresponds to one among the plurality of circuit components, and wherein each susceptibility profile corresponds to one among the plurality of circuit components, wherein each among said at least one emissions profile includes results of a plurality of electromagnetic near-field measurements, and wherein for at least one emissions profile, each among said plurality of electromagnetic near-field measurements is associated with a location in a grid, said grid having boundaries and at least two spatial dimensions, and wherein the information regarding an induced electromagnetic field includes a plurality of amplitudes of the induced electromagnetic field, and wherein each among said plurality of amplitudes corresponds to one among a plurality of spatial locations, and wherein at least one among said plurality of spatial locations lies outside the boundaries of said grid.

48. The data storage medium according to claim 47, further comprising calculating a simulated circuit operation based on the placement information, the circuit description, and the calculated effects of the induced electromagnetic field.

49. The data storage medium according to claim 48, further comprising comparing a result of said calculating a simulated circuit operation to at least one predetermined criterion.

50. The data storage medium according to claim 49, further comprising modifying at least one among the circuit description and the placement information based on a result of said comparing.

* * * * *

UNITED STATES PATENT AND TRADEMARK OFFICE
CERTIFICATE OF CORRECTION

PATENT NO. : 6,834,380 B2
DATED : December 21, 2004
INVENTOR(S) : Mehyar Khazei

It is certified that error appears in the above-identified patent and that said Letters Patent is hereby corrected as shown below:

<u>Title page,</u>
Item [74], *Attorney, Agent, or Firm*, shoud read -- - Philip R. Wadsworth; Charles D. Brown; George C. Pappas --.

Signed and Sealed this

Sixteenth Day of August, 2005

JON W. DUDAS
*Director of the United States Patent and Trademark Office*